US012745645B2

(12) United States Patent
Chen et al.

(10) Patent No.: US 12,745,645 B2
(45) Date of Patent: Sep. 22, 2026

(54) INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Hsien-Wei Chen, Hsinchu (TW); Chieh-Lung Lai, Taichung City (TW); Meng-Liang Lin, Hsinchu (TW); Chun-Yueh Yang, Taipei City (TW); Shin-Puu Jeng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 633 days.

(21) Appl. No.: 18/151,623

(22) Filed: Jan. 9, 2023

(65) Prior Publication Data

US 2024/0079356 A1 Mar. 7, 2024

Related U.S. Application Data

(60) Provisional application No. 63/403,999, filed on Sep. 6, 2022.

(51) Int. Cl.

| | |
|---|---|
| ***H01L 23/66*** | (2006.01) |
| ***H10B 80/00*** | (2023.01) |
| ***H10W 42/20*** | (2026.01) |
| ***H10W 44/20*** | (2026.01) |
| ***H10W 70/05*** | (2026.01) |
| ***H10W 70/65*** | (2026.01) |
| ***H10W 70/685*** | (2026.01) |

(Continued)

(52) U.S. Cl.

CPC ............ *H10W 44/20* (2026.01); *H10B 80/00* (2023.02); *H10W 42/20* (2026.01); *H10W 70/05* (2026.01); *H10W 70/093* (2026.01); *H10W 70/095* (2026.01); *H10W 70/65* (2026.01); *H10W 70/685* (2026.01); *H10W 90/401* (2026.01); *H10W 90/701* (2026.01); *H10W 44/209* (2026.01); *H10W 44/241* (2026.01); *H10W 70/655* (2026.01); *H10W 72/0198* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS 8,361,842 B2 1/2013 Yu et al.
8,680,647 B2 3/2014 Yu et al.

(Continued)

*Primary Examiner* — Long Pham

(74) *Attorney, Agent, or Firm* — Slater Matsil, LLP

(57) ABSTRACT

An integrated circuit package includes an interposer, the interposer including: a first redistribution layer, a second redistribution layer over the first redistribution layer in a central region of the interposer, a dielectric layer over the first redistribution layer in a periphery of the interposer, the dielectric layer surrounding the second redistribution layer in a top-down view, a third redistribution layer over the second redistribution layer and the dielectric layer, and a first direct via extending through the dielectric layer. A conductive feature of the third redistribution layer is coupled to a conductive feature of the first redistribution layer through the first direct via.

20 Claims, 58 Drawing Sheets

(51) Int. Cl.
*H10W 90/00* (2026.01)
*H10W 70/655* (2026.01)
*H10W 72/00* (2026.01)
*H10W 74/15* (2026.01)

(56) References Cited

U.S. PATENT DOCUMENTS 8,703,542 B2 4/2014 Lin et al.
8,759,964 B2 6/2014 Pu et al.
8,778,738 B1 7/2014 Lin et al.
8,785,299 B2 7/2014 Mao et al.
8,803,306 B1 8/2014 Yu et al.
8,809,996 B2 8/2014 Chen et al.
8,829,676 B2 9/2014 Yu et al.
8,877,554 B2 11/2014 Tsai et al.
8,993,380 B2 3/2015 Hou et al.
9,281,254 B2 3/2016 Yu et al.
9,299,649 B2 3/2016 Chiu et al.
9,372,206 B2 6/2016 Wu et al.
9,425,126 B2 8/2016 Kuo et al.
9,443,783 B2 9/2016 Lin et al.
9,461,018 B1 10/2016 Tsai et al.
9,496,189 B2 11/2016 Yu et al.
9,666,502 B2 5/2017 Chen et al.
9,735,131 B2 * 8/2017 Su .......................... H01L 25/50
9,768,145 B2 * 9/2017 Yu .................... H01L 23/49811
12,394,772 B2 * 8/2025 Chen .................. H01L 21/6835
12,431,435 B2 * 9/2025 Hsieh ................... H01L 23/147
2011/0291288 A1 12/2011 Wu et al.
2013/0026468 A1 1/2013 Yoshimuta et al.
2013/0062760 A1 3/2013 Hung et al.
2013/0062761 A1 3/2013 Lin et al.
2013/0168848 A1 7/2013 Lin et al.
2013/0307140 A1 11/2013 Huang et al.
2014/0203429 A1 7/2014 Yu et al.
2014/0225222 A1 8/2014 Yu et al.
2014/0252646 A1 9/2014 Hung et al.
2014/0264930 A1 9/2014 Yu et al.
2021/0202389 A1 * 7/2021 Hsieh ..................... H01L 24/96
2021/0358854 A1 * 11/2021 Yu ...................... H01L 23/5389

* cited by examiner 304B
304A
330A
340A
300

INTEGRATED CIRCUIT PACKAGES AND METHODS OF FORMING THE SAME

PRIORITY CLAIM AND CROSS-REFERENCE

This application claims the benefit of U.S. Provisional Application No. 63/403,999, filed on Sep. 6, 2022, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a tendency for smaller and more creative packaging techniques of semiconductor dies has emerged

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
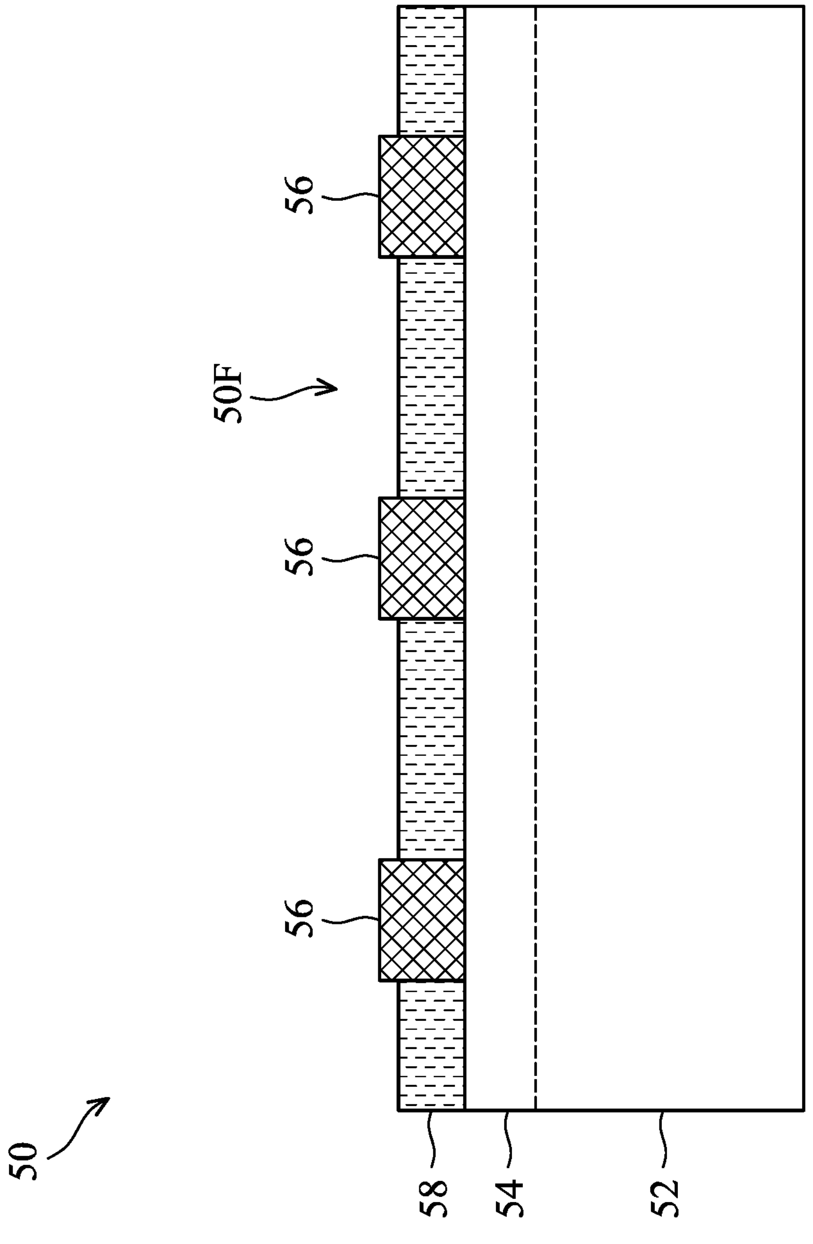
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide direct vias through multiple redistribution layers of interposers and/or provide spiral routing stacks (also referred to as spiral inductors) formed in routing structures of interconnect structures. The direct vias are formed along the peripheries of the interposers and provide more direct electrical couplings between, e.g., integrated circuit dies mounted on the interposers and interconnect structures on which the interposers are mounted. This can mitigate voltage drop and reduce resistance to decrease high frequency loss, which can increase electrical performance. The spiral routing stacks are formed in peripheral areas of the interconnect structures, such as routing structures above and below respective substrate cores of the interconnect structures. The spiral routing stacks enable inductor function to reduce or prevent radio interference, which may improve signal and power integrity.

FIG. 1 is a cross-sectional view of an integrated circuit die 50. Integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or a combination thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front-side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front-side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. The dielectric layer 58 is patterned to form openings, and the die connectors 56 are formed in the openings. Portions of the die connectors 56 may be disposed over the dielectric layer 58 or protrude above the dielectric layer 58. In some embodiments, the dielectric layer 58 may initially bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. In some embodiments (not specifically illustrated), after the planarization process, top surfaces of the die connectors 56 and the dielectric layer 58 are substantially coplanar (within process variations). The die connectors 56 and the dielectric layer 58 are exposed at the front-side 50F of the integrated circuit die 50.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, a system-on-a-chip (SoC) die, or the like. In such embodiments, the integrated circuit die 50 includes multiple semiconductor substrates 52 interconnected by through vias, such as through-substrate vias (TSVs) (e.g., through-silicon vias). Each of the semiconductor substrates 52 may (or may not) have a separate interconnect structure 54.

FIGS. 2-6, 7A, 7B, 8A, 8B, 9-11, 12A, 12B, and 13-23 are views of intermediate steps of a process for forming a first package component 250, in accordance with some embodiments. FIGS. 2-13 are views of intermediate stages in the manufacturing of interposers 100. The interposers 100 comprise a plurality of redistribution layers, of which each comprises a respective metallization pattern and a dielectric layer. One or more integrated circuit dies are mounted to the interposers 100 to form package components 250 (see below, FIGS. 14-23). A first package region 100A and a second package region 100B are illustrated, and a package component 250 is formed in each package region. FIGS. 2, 3, 4, 5, 6, 7A, 8A, 9, 10, 11, 12A, 13, 14, 15, 16, 17, 18, 19, 20, 21, and 22 are cross-sectional views of the first package region 100A and the second package region 100B. FIGS. 7B, 8B, and 12B are top-down views of the first package region 100A and the second package region 100B.

Figure 2:
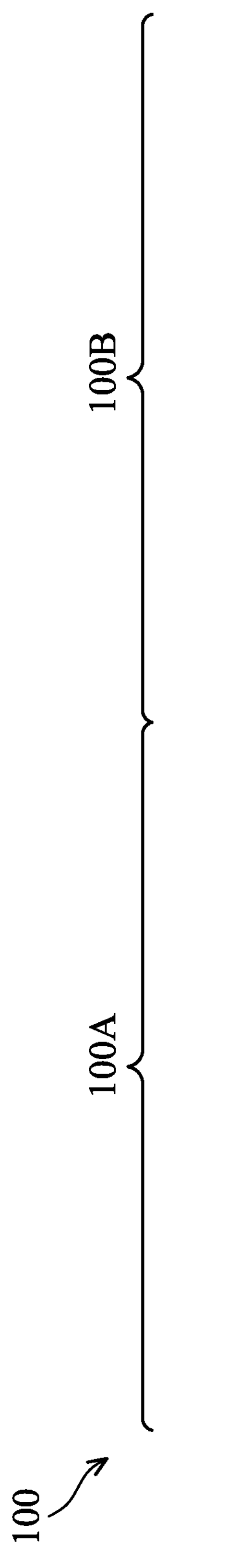
FIGS. 2-6, 7A, 7B, 8A, 8B, 9-11, 12A, 12B, and 13-23 are views of intermediate stages in the manufacturing of package components, in accordance with some embodiments.
Figure 2:
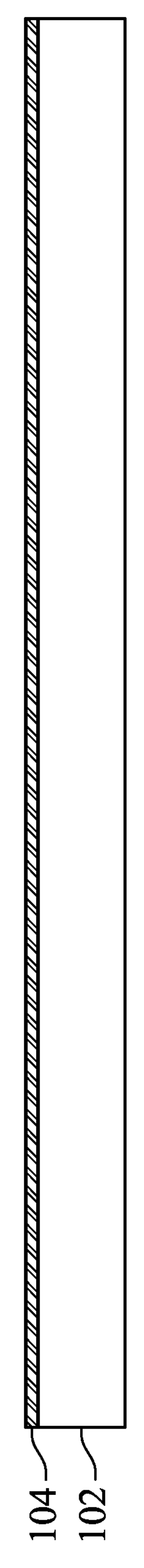

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
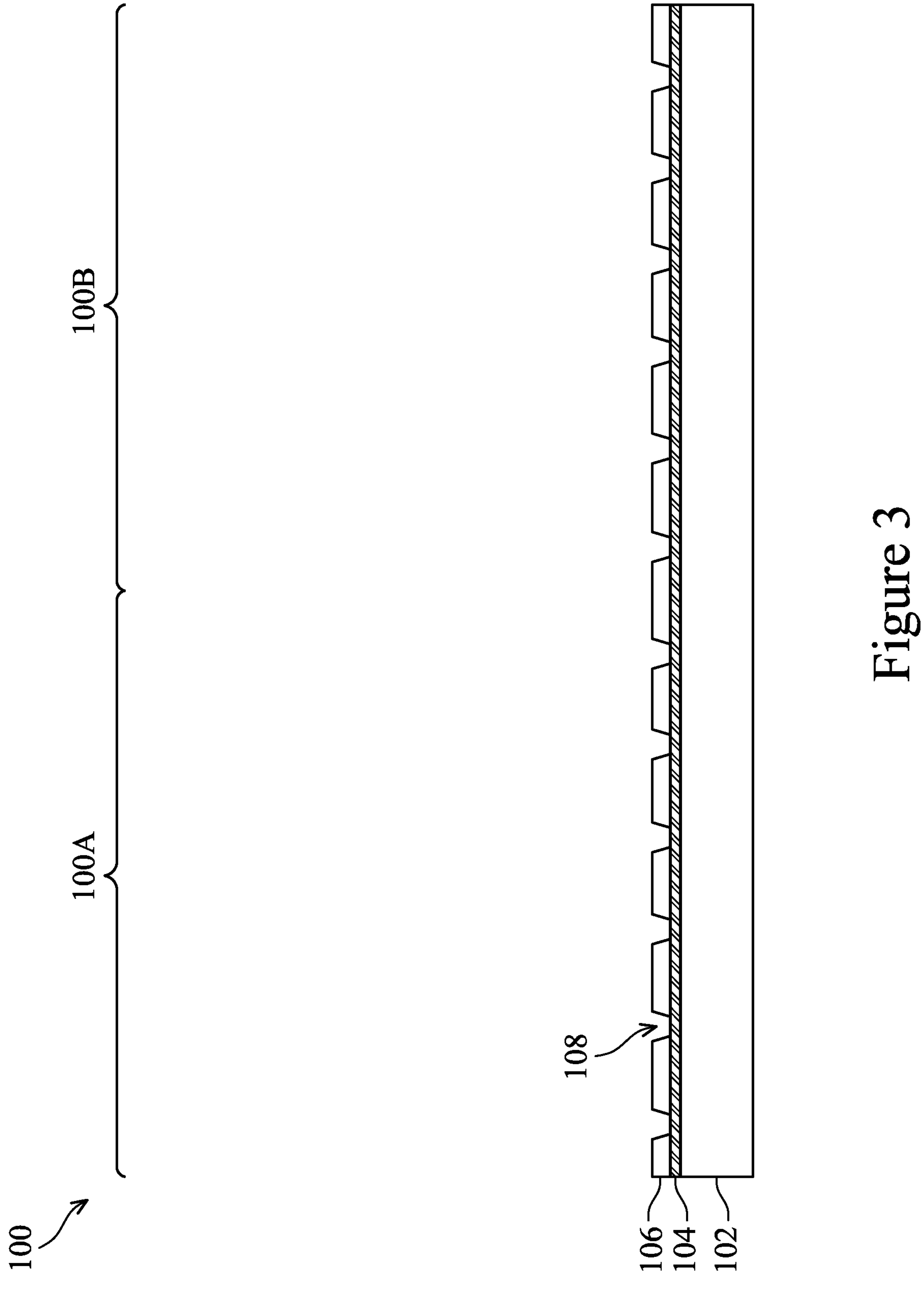

In FIG. 3, a dielectric layer 106 is formed over the release layer 104. The bottom surface of the dielectric layer 106 may be in contact with the top surface of the release layer 104. In some embodiments, the dielectric layer 106 is formed of a polymer, such as polybenzoxazole (PBO), polyimide, benzocyclobutene (BCB), or the like. In other embodiments, the dielectric layer 106 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 106 may be formed by any acceptable deposition process, such as spin coating, CVD, laminating, the like, or a combination thereof.

The dielectric layer 106 is then patterned to form openings 108 exposing the release layer 104. The patterning may be performed by an acceptable process, such as by exposing the dielectric layer 106 to light when the dielectric layer 106 is a photosensitive material or by etching using, for example, an anisotropic etch (e.g., a reactive ion etch). If the dielectric layer 106 is a photosensitive material, the dielectric layer 106 can be developed after the exposure.

Figure 4:
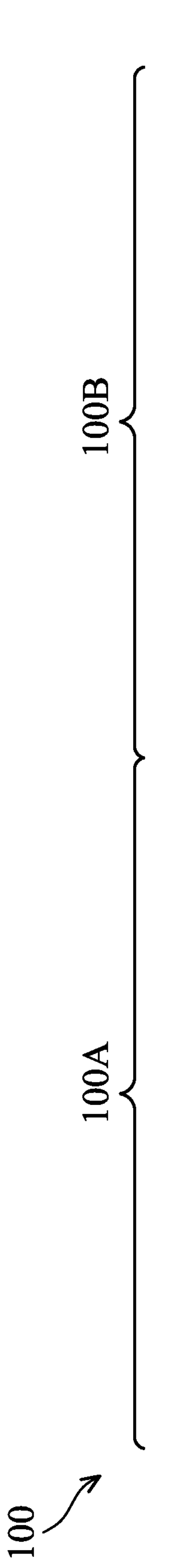
Figure 4:
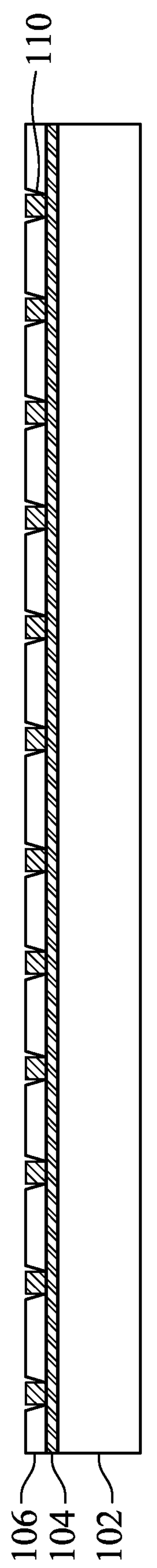
Figure 5:
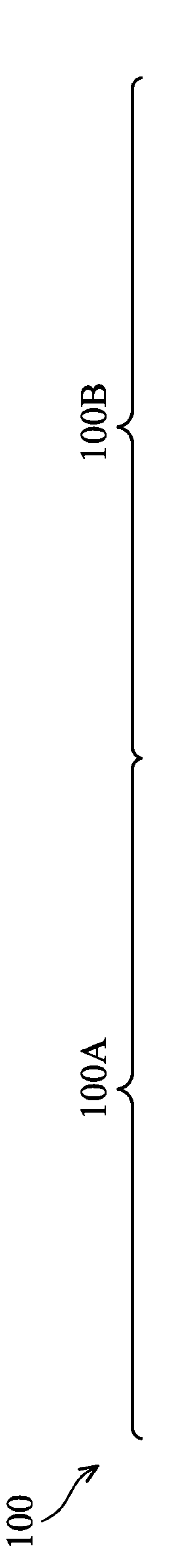
Figure 5:
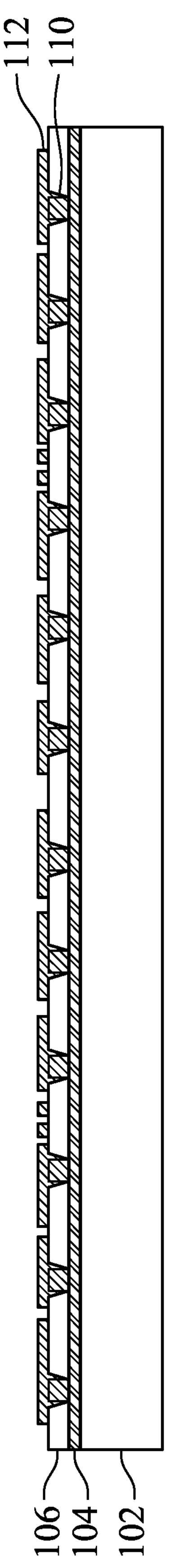
Figure 6:
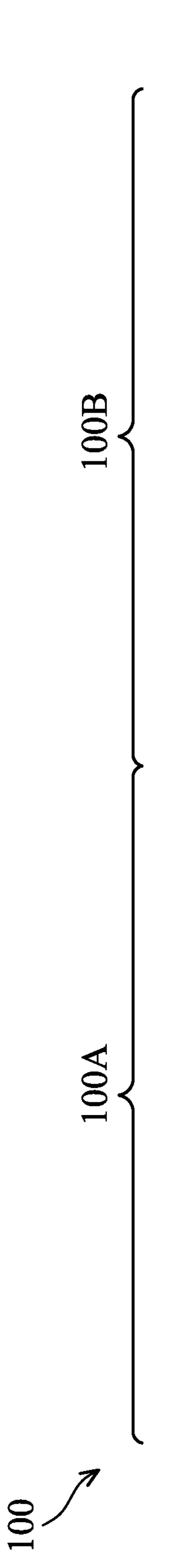
Figure 6:
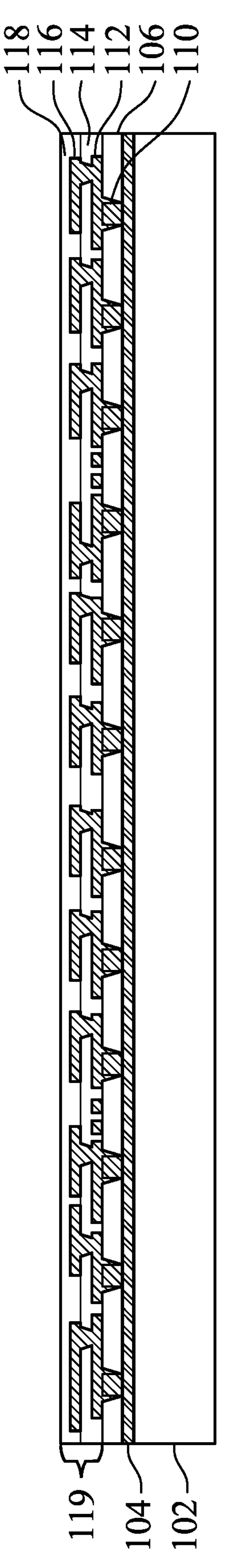

FIGS. 4-6 illustrate intermediate stages in the manufacturing of one or more lower redistribution layer(s) 119 of the interposers 100. In this example, the lower redistribution layer(s) 119 includes two redistribution layers, e.g., dielectric layers 114 and 118, and metallization patterns 112 and 116. More or fewer redistribution layers may be formed by repeating or omitting steps and process discussed below.

In FIG. 4, conductive features 110 are formed in the openings 108 (see above, FIG. 3). The conductive features 110 will be subsequently used to couple with external connectors formed on the back sides of the interposers 100 (see below, FIG. 19). In some embodiments, the conductive features 110 are formed by plating, such as electroplating or electroless plating, a conductive material in the openings 108. In some embodiments, the conductive material comprises a metal, like copper, titanium, tungsten, aluminum, or the like. However, any suitable method and materials may be used to form the conductive features 110.

In FIG. 5, a metallization pattern 112 is formed on the dielectric layer 106 and the conductive features 110. As an example to form the metallization pattern 112, a seed layer is formed over the dielectric layer 106 and the conductive features 110. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD), sputtering, or the like. A photoresist (not shown) is then formed and patterned on the seed layer. The photoresist may be formed by spin coating or the like and may be exposed to light for patterning. The pattern of the photoresist corresponds to the metallization pattern 112. The patterning forms openings through the photoresist to expose the seed layer. A conductive material is formed in the openings of the photoresist and on the exposed portions of the seed layer. The conductive material may be formed by plating, such as electroplating or electroless plating, or the like. In some embodiments, the conductive material comprises a metal, like copper, titanium, tungsten, aluminum, or the like. Then, the photoresist and portions of the seed layer on which the conductive material is not formed are removed. The photoresist is removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 112.

The process described with respect to FIGS. 3 through 5 is just one example of how the dielectric layer 106, conductive features 110, and metallization pattern 112 may be formed. Although FIGS. 3-5 illustrate embodiments in which the dielectric layer 106 is formed before forming the conductive features 110, in some embodiments the conductive features 110 are formed first and the dielectric layer 106 is then formed over the conductive features 110. Subsequently, the dielectric layer 106 is patterned to expose the conductive features 110 and the metallization pattern 112 is then formed over the dielectric layer 106 with portions in physical and electrical contact with the conductive features 110. In some embodiments, the dielectric layer 106 is formed first and the metallization pattern 112 is formed over the dielectric layer 106. The dielectric layer 106 is subsequently patterned to expose portions of the metallization pattern 112 for external connection after removing the carrier substrate 102 (see below, FIG. 17).

In FIG. 6, a dielectric layer 114 is formed on the metallization pattern 112 and the dielectric layer 106, a metallization pattern 116 is formed on the dielectric layer 114, and a dielectric layer 118 is formed on the metallization pattern 116 and the dielectric layer 114. In some embodiments, the dielectric layer 114 is formed of similar materials and by similar methods as the dielectric layer 106, as described above with respect to FIG. 4. The dielectric layer 114 is then patterned to form openings exposing portions of the metallization pattern 112. The patterning may be performed by an acceptable process, such as by exposing the dielectric layer 114 to light when the dielectric layer 114 is a photosensitive material or by etching using, for example, an anisotropic etch. If the dielectric layer 114 is a photosensitive material, the dielectric layer 114 can be developed after the exposure.

The metallization pattern 116 is then formed. The metallization pattern 116 includes conductive elements extending along the major surface of the dielectric layer 114 and extending through the dielectric layer 114 to physically and electrically couple to the metallization pattern 112. As an example to form the metallization pattern 116, a seed layer is formed over the dielectric layer 114 and in the openings extending through the dielectric layer 114. In some embodiments, the seed layer is a metal layer, which may be a single layer or a composite layer comprising a plurality of sub-layers formed of different materials. In some embodiments, the seed layer comprises a titanium layer and a copper layer over the titanium layer. In some embodiments, the seed layer formed using, for example, PVD or the like. A photoresist is then formed and patterned on the seed layer. In some embodiments, the photoresist is formed by spin coating or the like and is exposed to light for patterning. The pattern of the photoresist corresponds to the metallization pattern 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 116. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Next, the dielectric layer 118 is formed on the metallization pattern 116 and the dielectric layer 114. In some embodiments, the dielectric layer 118 is formed of similar materials and by similar methods as the dielectric layer 106, as described above with respect to FIG. 4.

FIGS. 7A-12B illustrate intermediate stages in the manufacturing of middle redistribution layers 122 and direct vias 132 (see FIGS. 12A-12B) of the interposers 100. The direct vias 132 are around the periphery of the interposers 100, and have heights equal to or greater than the combined thicknesses of two or more redistribution layers of the interposers 100. The direct vias 132 provide more direct electrical couplings between conductive features of the lower redistribution layer(s) 119 and conductive features of upper redistribution layer(s) of the interposers 100 than electrical couplings routed through staggered vias in the middle redistribution layers 122. The electrical couplings provided by the direct vias 132 can reduce resistance and mitigate voltage drop that may occur at high frequencies, which can increase electrical performance of the interposers 100.

Figure 7A:
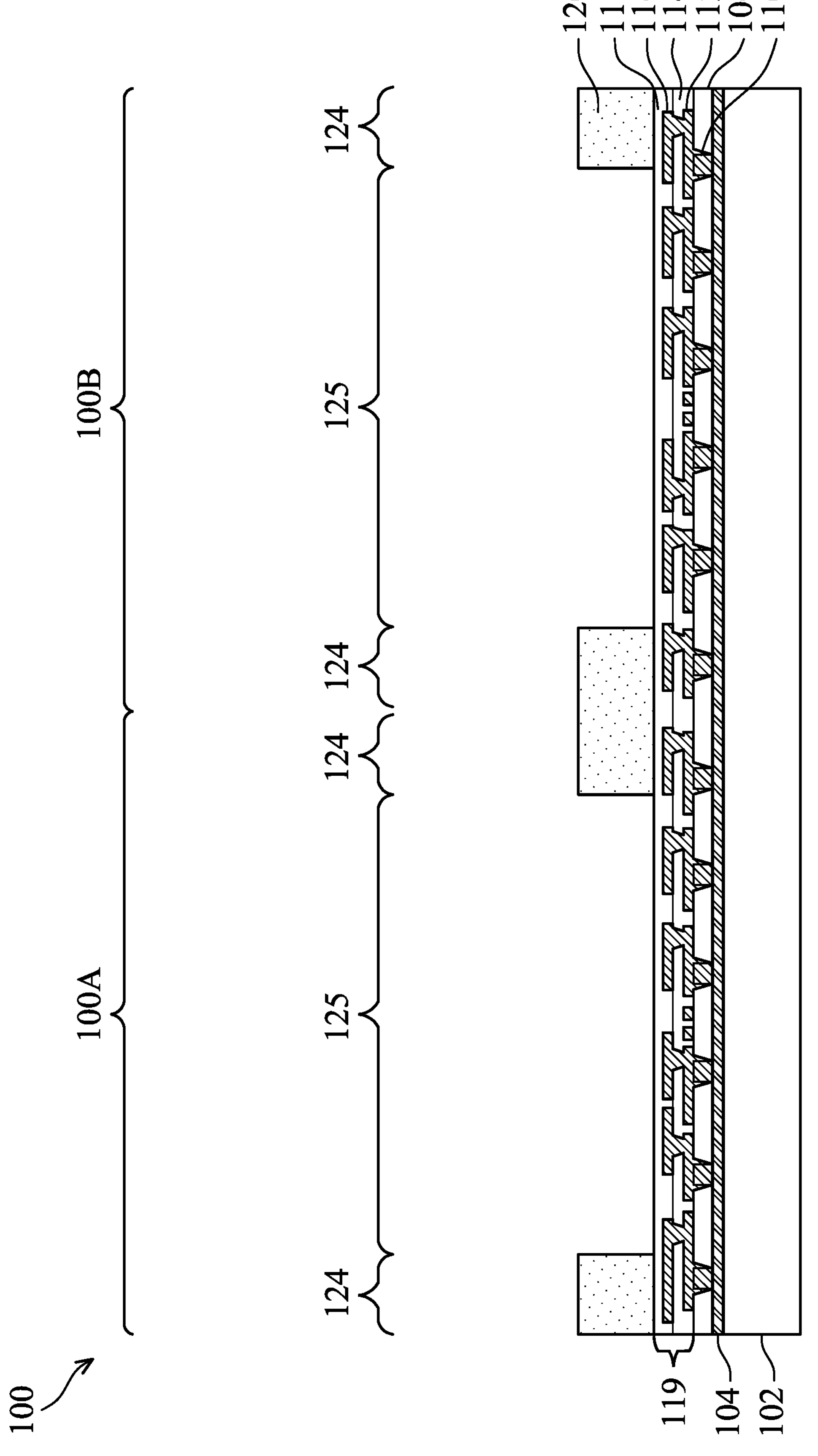
Figure 7B:
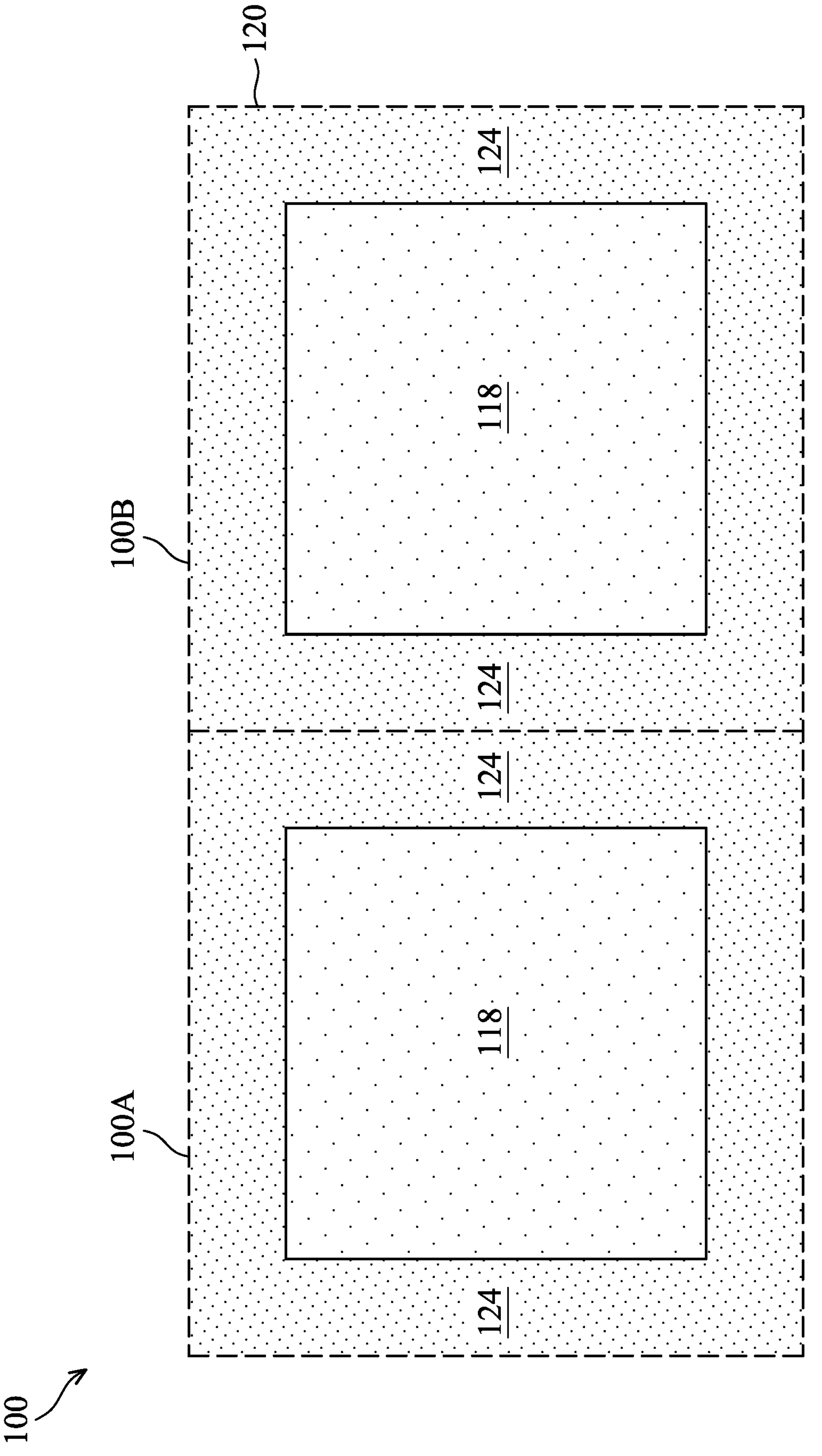

In FIGS. 7A and 7B, a mask 120 is formed over the dielectric layer 118. The mask 120 covers respective peripheries 124 of the first package region 100A and the second package region 100B. The peripheries 124 surround respective central regions 125 of the first package region 100A and the second package region 100B. In some embodiments, the first package region 100A and the second package region 100B are rectangular and the respective peripheries 124 of the first package region 100A and the second package region 100B are rectangular rings around the outer borders of the first package region 100A and the second package region 100B in a top-down view. However, the first package region 100A and the second package region 100B may have any suitable shapes (e.g., round, oval, triangular, polygonal, or the like) and their respective peripheries 124 are around first package region 100A and the second package region 100B in a top-down view.

The mask 120 is formed in the respective peripheries 124 of the first package region 100A and the second package region 100B so that subsequently formed redistribution layers of the interposers 100 will not be formed in the peripheries 124. This allows direct vias to be subsequently formed in the peripheries 124 to directly connect conductive features of a top redistribution layer of the interposers 100 with the metallization pattern 116. In some embodiments, the mask 120 is a photoresist that is formed and patterned to cover the dielectric layer 118 in respective peripheries 124 of the first package region 100A and the second package region 100B. The photoresist may be formed by spin coating or the like and may be exposed to light for patterning. The pattern of the photoresist corresponds to the peripheries 124.

Figure 8A:
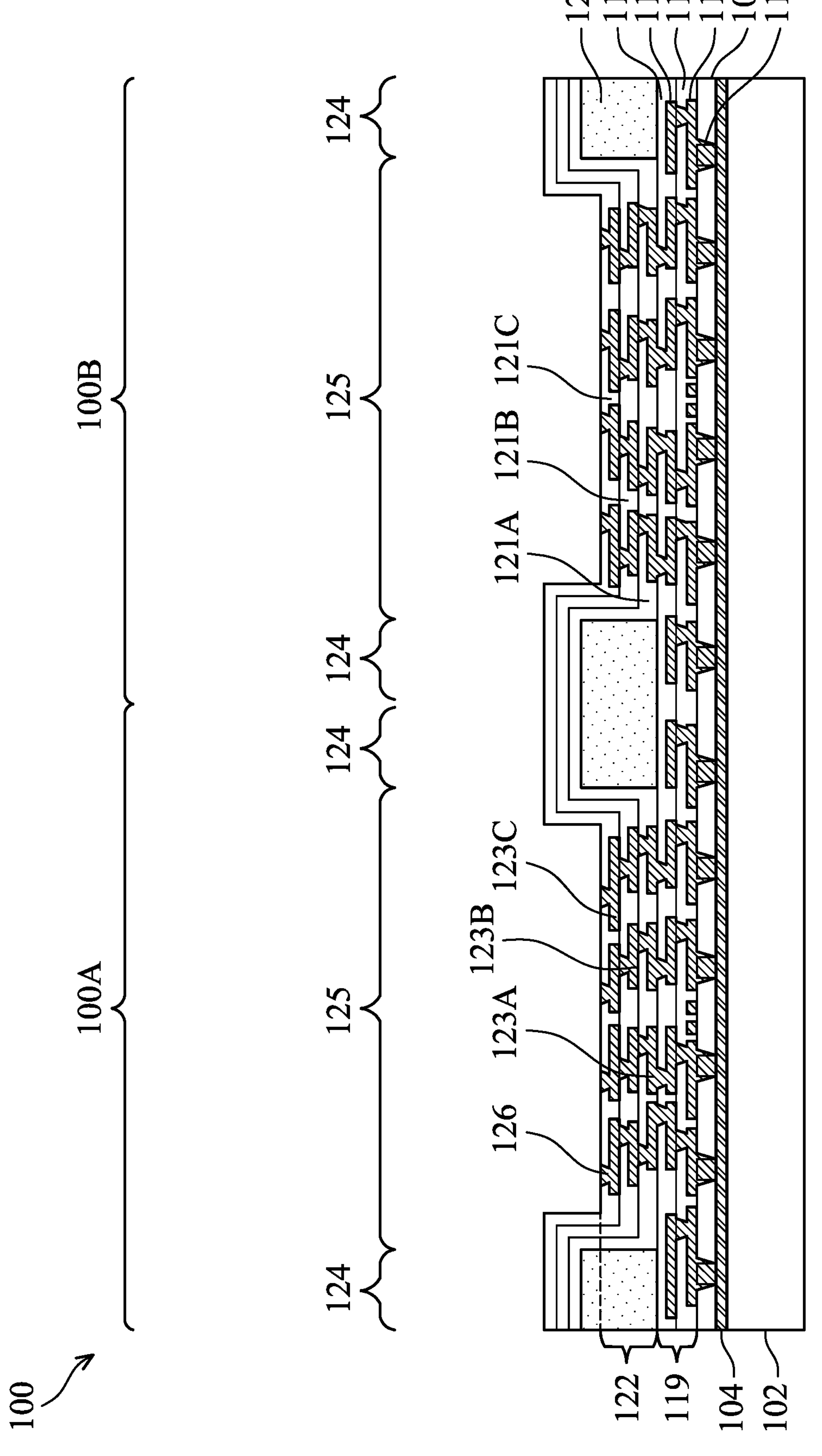
Figure 8B:
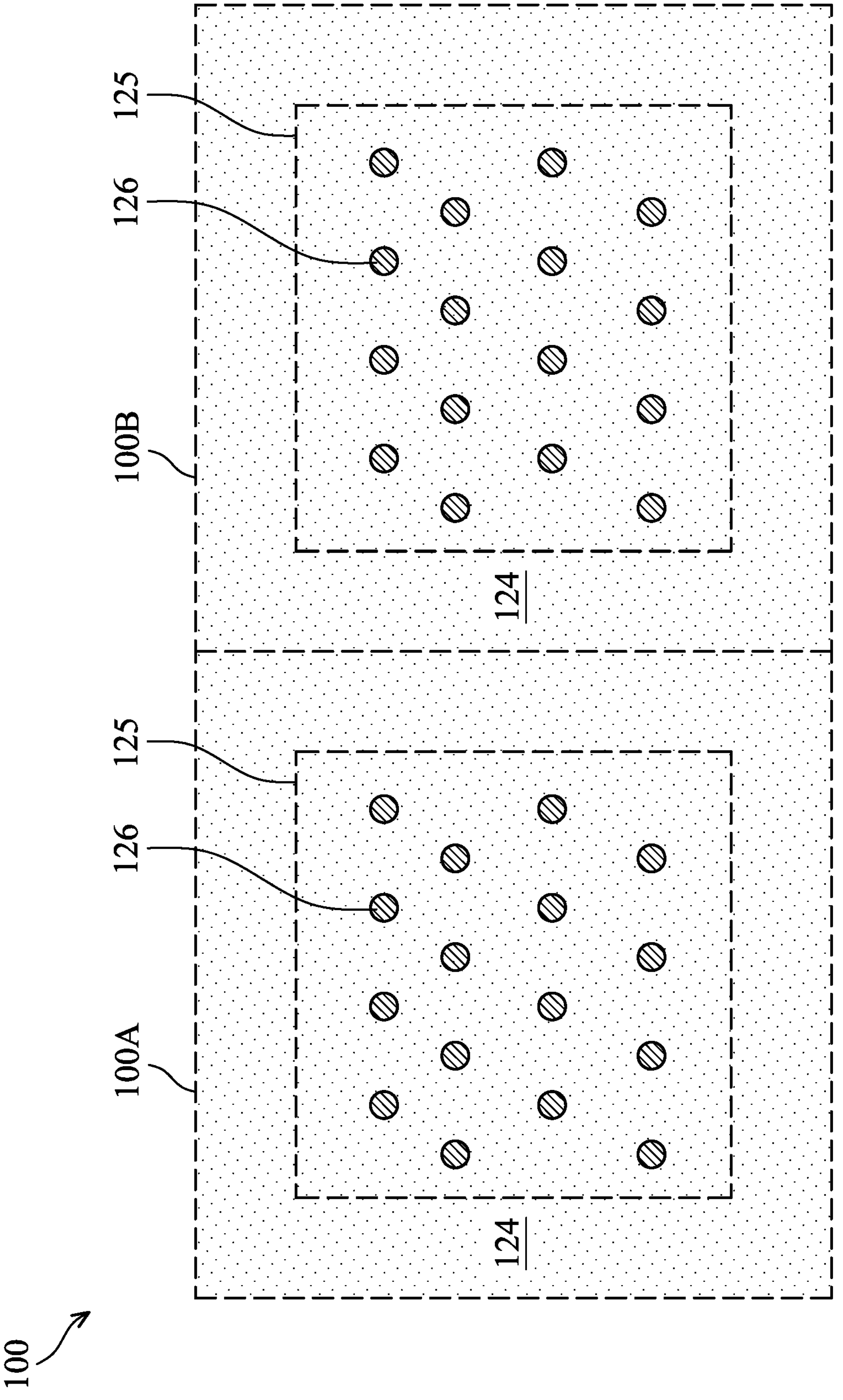

In FIGS. 8A and 8B, middle redistribution layers 122 are formed in respective central regions 125 of the first package region 100A and the second package region 100B. Each redistribution layer of the middle redistribution layers 122 includes a metallization pattern and a dielectric layer, which may each be formed of similar materials and by similar methods as the metallization pattern 112 and the dielectric layer 114, as described above with respect to FIGS. 5-6. The middle redistribution layers 122 are formed to be adjacent to the mask 120, and the dielectric layers of the middle redistribution layers 122 may be initially formed over the lower redistribution layer(s) 119 in the central region 125 and over the mask 120 in the peripheries 124. The metallization patterns of the middle redistribution layers 122 may be formed in the central regions 125. Subsequently, the portions of the dielectric layers over the mask 120 will be removed.

The middle redistribution layers 122 include a plurality of redistribution layers (e.g., at least two redistribution layers). In the illustrated example of FIG. 8A, the middle redistribution layers 122 include three redistribution layers, each comprising a respective metallization pattern and a respective dielectric layer. Specifically, the middle redistribution layers 122 include dielectric layers 121A, 121B, and 121C and metallization patterns 123A, 123B, and 123C. However, the middle redistribution layers 122 may include any suitable number of redistribution layers, such as two to ten redistribution layers.

Next, conductive vias 126 are formed through the top dielectric layer 121C of the middle redistribution layers 122 to make physical and electrical contact with top conductive features (e.g., conductive lines of the top metallization pattern 123C) of the middle redistribution layers 122. As an example of forming the conductive vias 126, the top dielectric layer 121C is patterned to form openings exposing portions of the top metallization pattern 123C. The patterning may be performed by an acceptable process, such as by exposing the top dielectric layer 121C to light when the top dielectric layer 121C is a photosensitive material or by etching using, for example, an anisotropic etch (e.g., a reactive ion etch). If the top dielectric layer 121C is a photosensitive material, the top dielectric layer 121C can be developed after the exposure. Next, the conductive vias 126 are formed in the openings. In some embodiments, the conductive vias 126 are formed by plating, such as electroplating or electroless plating, a conductive material in the openings. In some embodiments, the conductive material comprises a metal, like copper, titanium, tungsten, aluminum, or the like. However, any suitable method, materials, or process (e.g., a damascene process or the like) may be used to form the conductive vias 126. In some embodiments, a protective layer (not illustrated) is formed over the structure to protect top surfaces of the conductive vias 126 during subsequent etching processes. The protective layer may be formed using similar materials and with similar methods as the dielectric layer 106 as described above with respect to FIG. 3.

Figure 9:
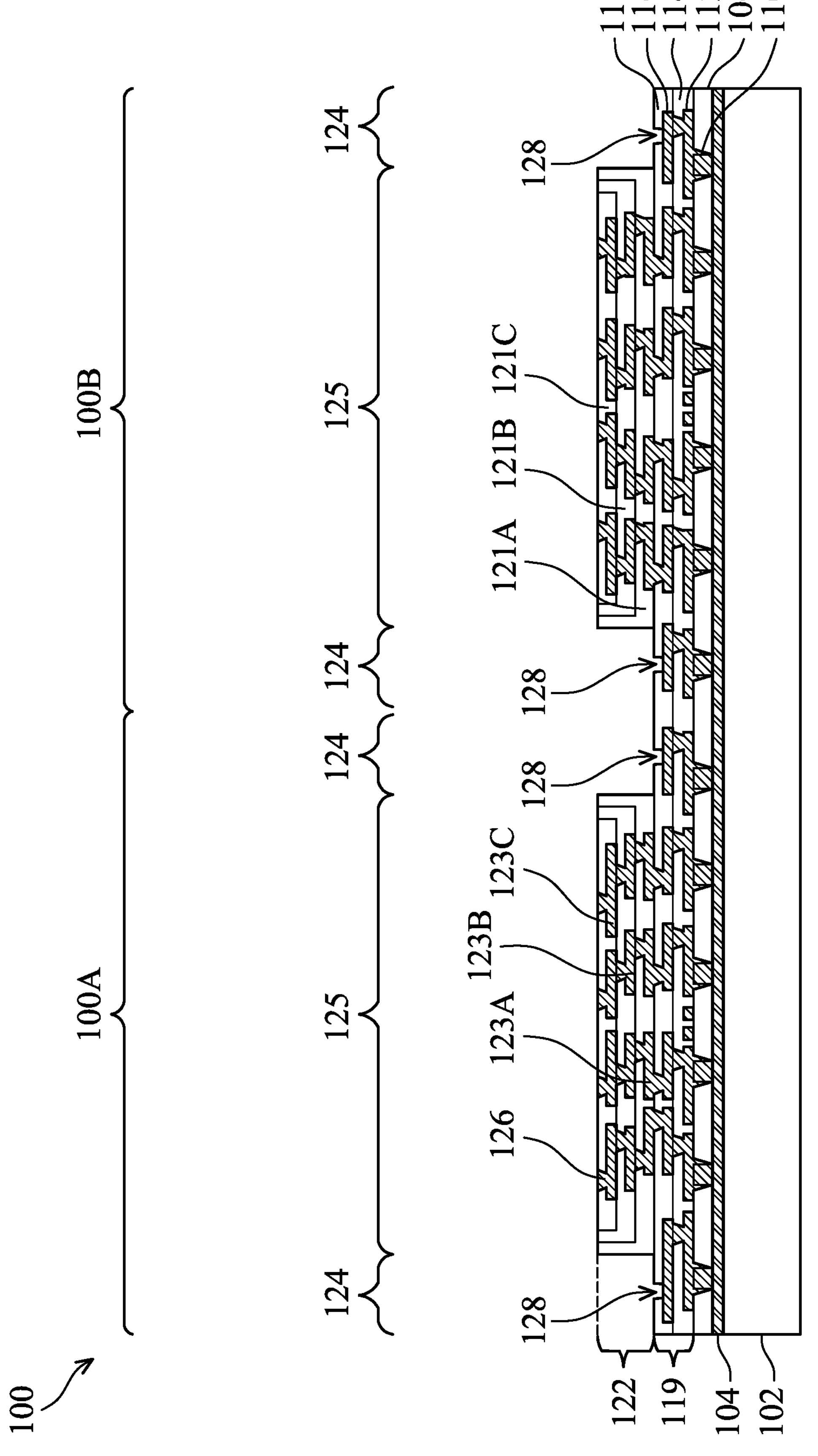

In FIG. 9, top portions of the dielectric layers of the middle redistribution layers 122 (e.g., the dielectric layers 121A, 121B, and 121C) over the conductive vias 126 may be removed with a suitable removal process (e.g., a chemical-mechanical polish (CMP), grinding process, or the like) to expose the mask 120. Top portions of the mask 120 may be removed in the planarization. The mask 120 is then removed to expose a top surface of the dielectric layer 118 in the peripheries 124. The mask 120 may be removed by a suitable process, such as an acceptable ashing or stripping process when the mask 120 is a photoresist, e.g., using an oxygen plasma or the like.

Additionally, openings 128 are patterned through the dielectric layer 118 in the peripheries 124 to expose portions of the metallization pattern 116. The patterning may be performed by an acceptable process, such as by acceptable photolithography and etching techniques. The etching may be anisotropic.

Figure 10:
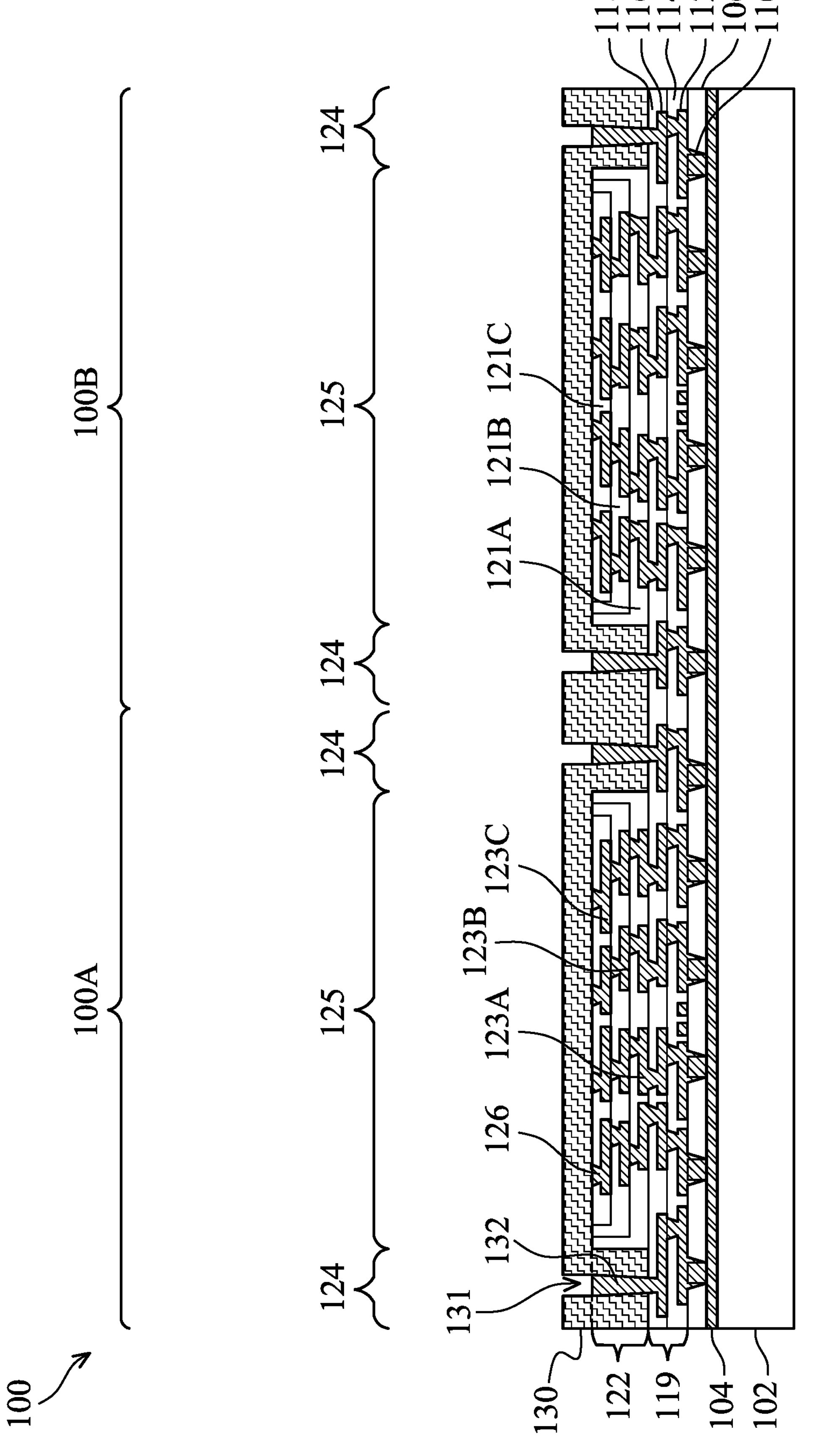

In FIG. 10, direct vias 132 are formed in the openings 128 (see above, FIG. 9). The direct vias 132 provide direct electrical couplings between the metallization pattern 112 and a subsequently formed upper metallization pattern(s) of the interposers 100 (see below, FIG. 13). As an example of forming the direct vias 132, a seed layer (not shown) is formed over the dielectric layer 118 and in the openings 128. The seed layer may also be formed over the middle redistribution layers 122. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD), sputtering, or the like. A photoresist 130 is then formed and patterned on the seed layer. The photoresist 130 may be formed by spin coating or the like and may be exposed to light for patterning. The pattern of the photoresist 130 corresponds to the direct vias 132. The patterning forms openings 131 through the photoresist 130 to expose the seed layer in the openings 128. A conductive material is formed in the openings 131 of the photoresist 130 and on the exposed portions of the seed layer in the openings 128. The conductive material may be formed by plating, such as electroplating or electroless plating, or the like. In some embodiments, the conductive material comprises a metal, like copper, titanium, tungsten, aluminum, or the like. The photoresist 130 and portions of the seed layer on which the conductive material is not formed are removed. The photoresist 130 may be removed by an acceptable ashing or stripping process, such as using an oxygen plasma or the like. Once the photoresist 130 is removed, exposed portions of the seed layer are removed, such as by using an acceptable etching process, such as by wet or dry etching. The remaining portions of the seed layer and conductive material form the direct vias 132.

Figure 11:
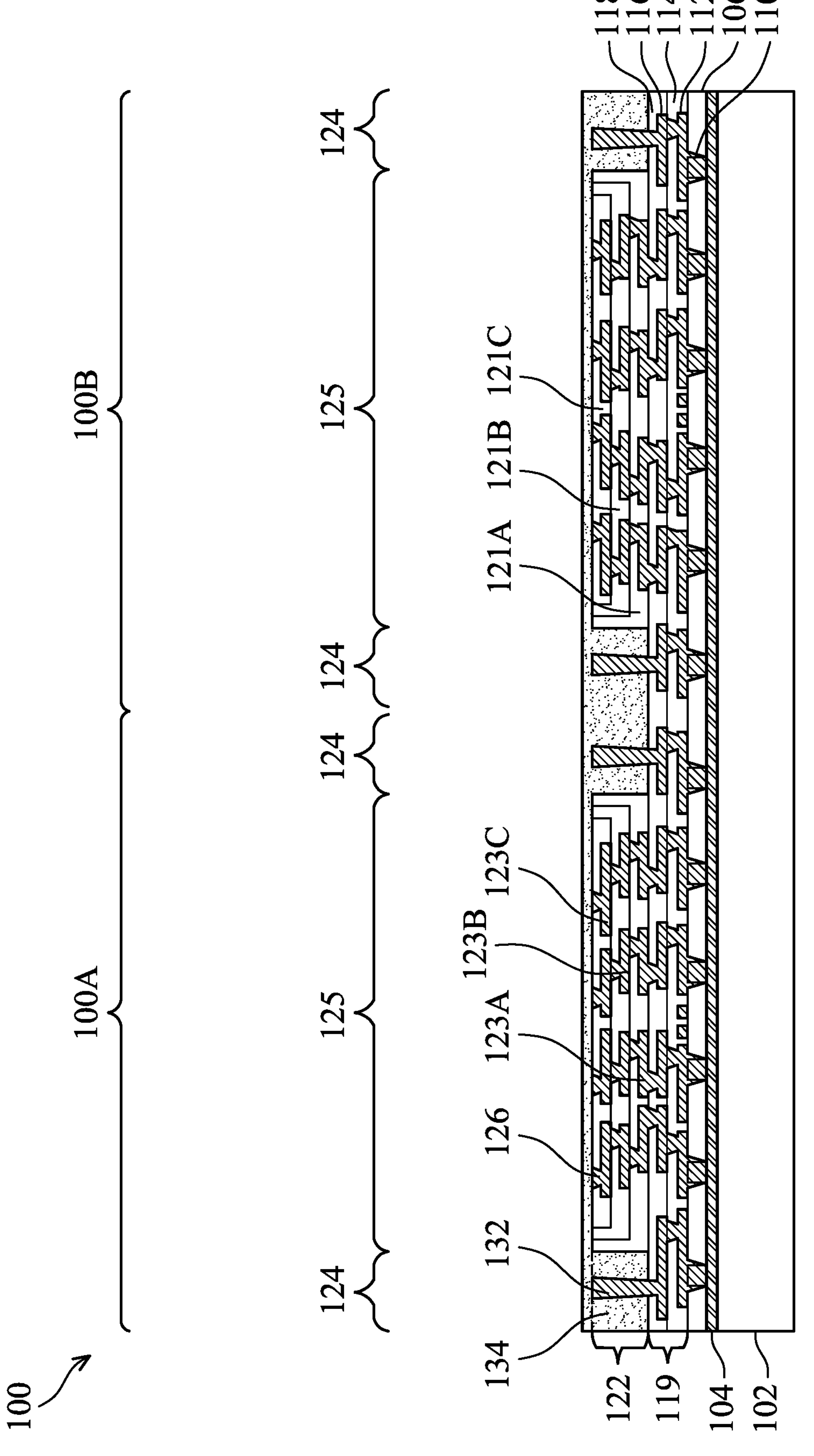

In FIG. 11, a dielectric layer 134 is formed around and over the direct vias 132 and the middle redistribution layers 122, filling the peripheries 124. In some embodiments, the dielectric layer 134 is formed of a polymer, such as polybenzoxazole (PBO), polyimide, benzocyclobutene (BCB), or the like. In other embodiments, the dielectric layer 134 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 134 may be formed by any acceptable deposition process, such as spin coating, CVD, laminating, the like, or a combination thereof.

Figure 12A:
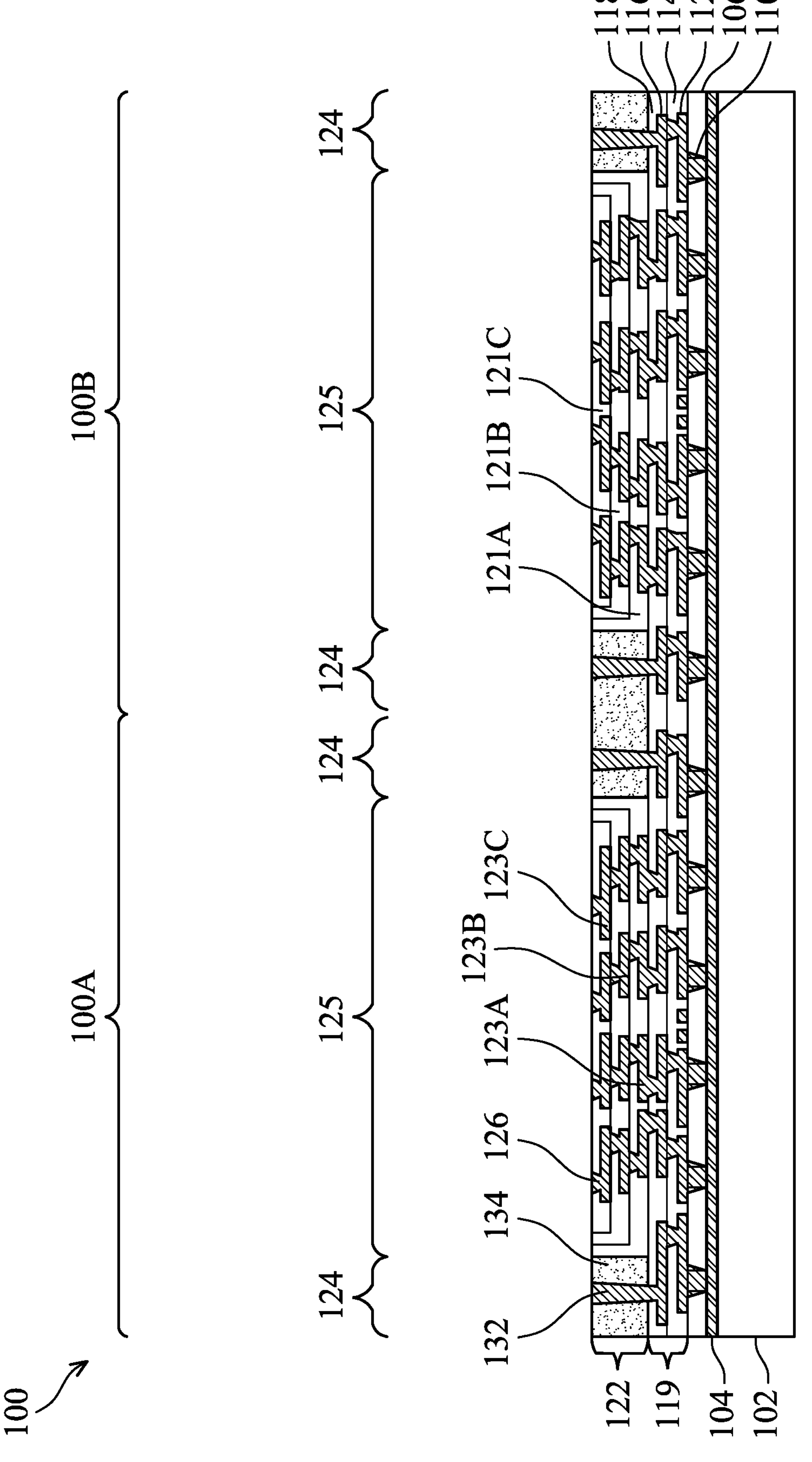
Figure 12B:
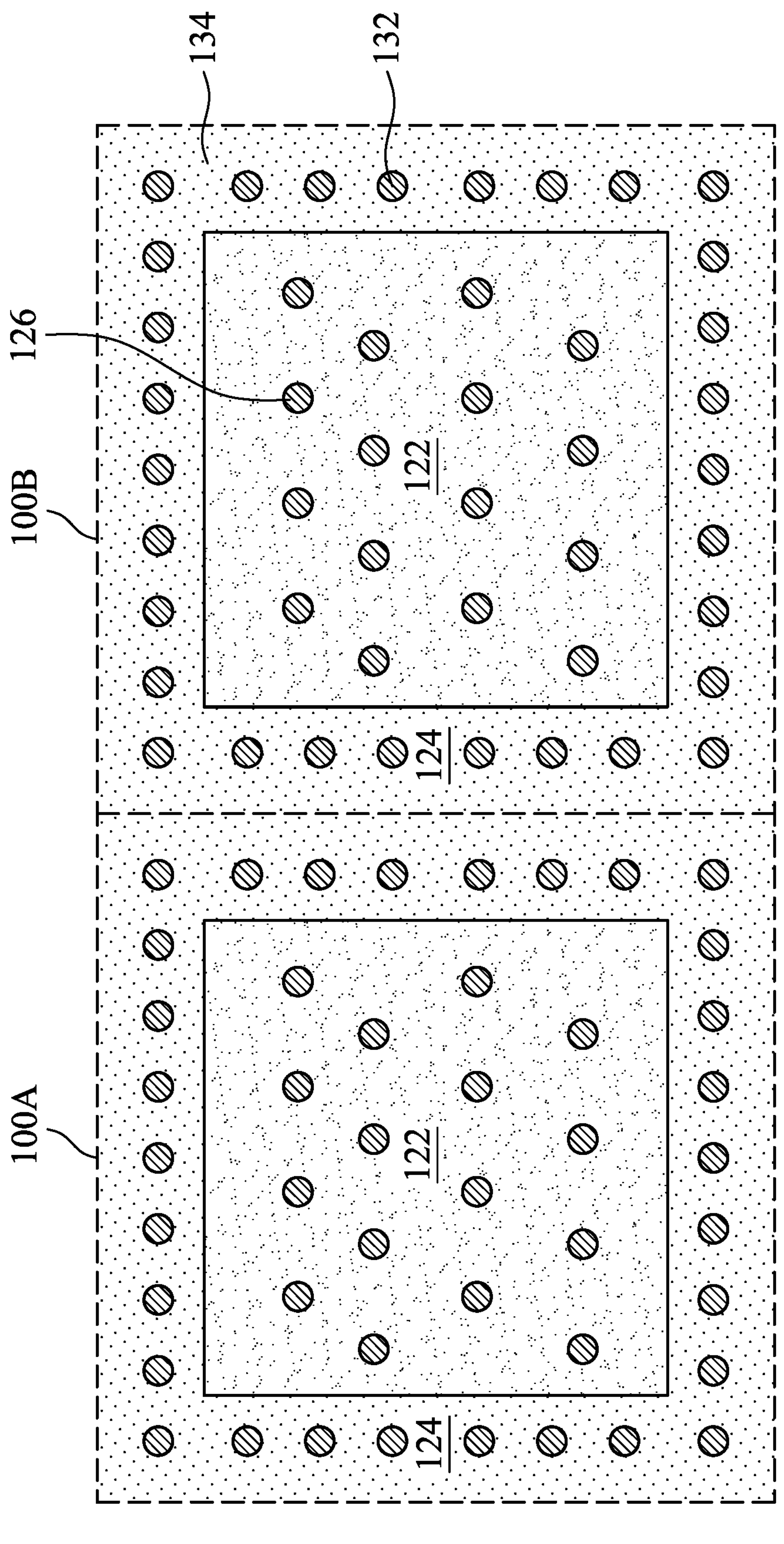

In FIGS. 12A and 12B, a removal process is performed on the dielectric layer 134 to expose the direct vias 132 and the conductive vias 126. The removal process may also remove material of the direct vias 132 and the middle redistribution layers 122 until the conductive vias 126 and the direct vias 132 are exposed. In embodiments where a protective layer (not illustrated) is formed over the conductive vias 126, the removal process also removes the protective layer. The removal process may include a planarization process such as a chemical-mechanical polish (CMP), a grinding process, an etching process, combinations thereof, or the like. Top surfaces of the direct vias 132, middle redistribution layers 122, conductive vias 126, and dielectric layer 134 are substantially coplanar (within process variations) after the planarization process. In some embodiments, the removal process is omitted, for example, if the direct vias 132 and/or the conductive vias 126 are already exposed. In some embodiments, an etching process (e.g., a dry etch) selective to the dielectric layer 134 and the top dielectric layer 121C of the middle redistribution layers 122 is performed to further expose the direct vias 132 and the conductive vias 126 above the top surfaces of the dielectric layer 134 and the top dielectric layer 121C of the middle redistribution layers 122. As illustrated by FIG. 12B, the direct vias 132 are arranged in respective peripheries 124 of the first package region 100A and the second package region 100B, and are surrounded by the dielectric layer 134 in a top-down view. The middle redistribution layers 122 are also surrounded by the dielectric layer 134 in a top-down view.

Figure 13:
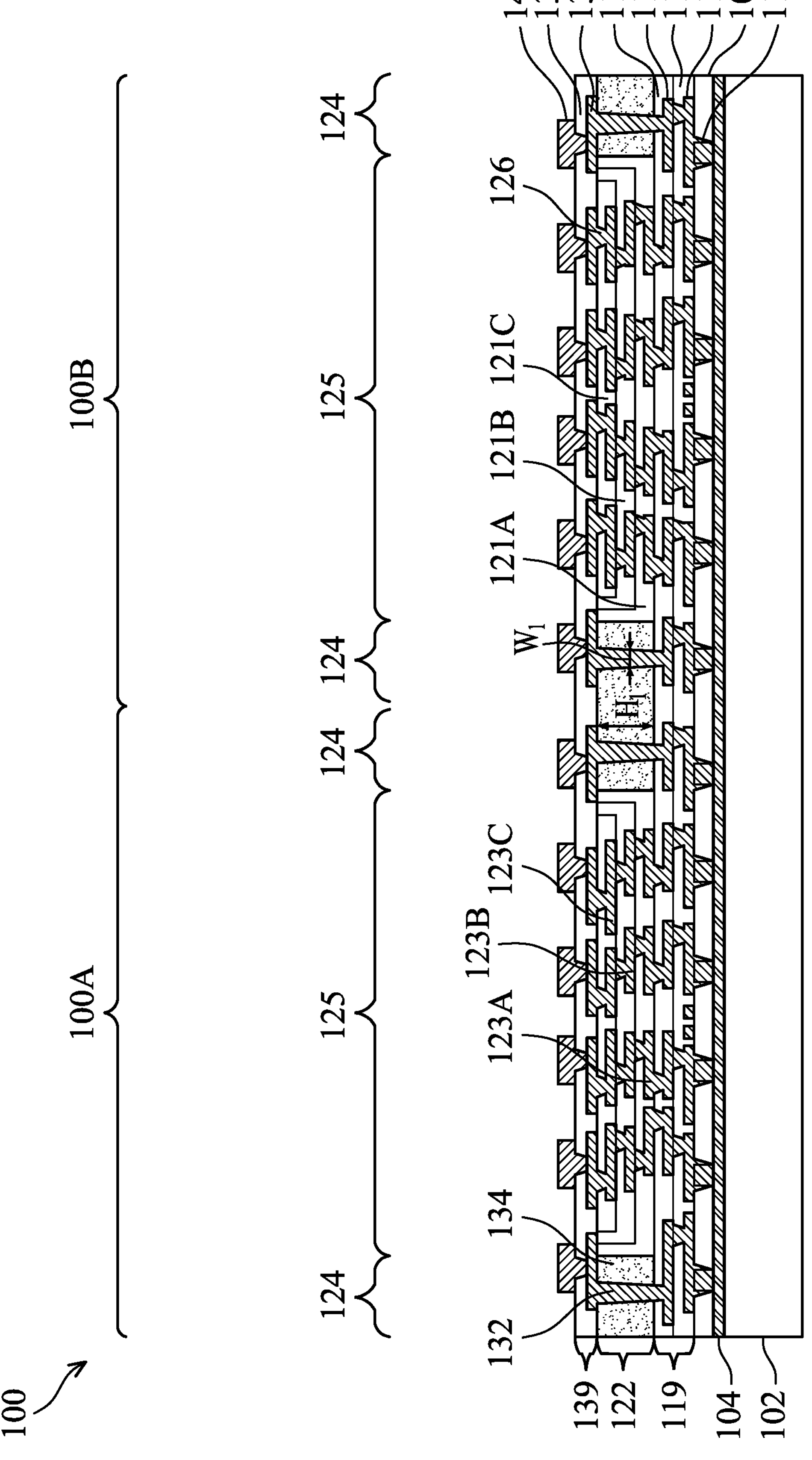

In FIG. 13, one or more upper redistribution layer(s) 139 of the interposers 100 are formed over the middle redistribution layers 122, the direct vias 132, and the dielectric layer 134. In this example, the upper redistribution layer(s) 139 includes one redistribution layer, e.g., a metallization pattern 136 and a dielectric layer 138. More or fewer redistribution layers may be formed by repeating or omitting steps and process discussed below.

The metallization pattern 136 is formed to make physical and electrical contact with exposed top surfaces of the direct vias 132 and the conductive vias 126. In some embodiments, the metallization pattern 136 is formed of similar materials and by similar methods as the metallization pattern 112, as described above with respect to FIG. 5. The dielectric layer 138 is then formed over the metallization pattern 136 and exposed surfaces of the middle redistribution layers 122 and dielectric layer 134. In some embodiments, the dielectric layer 138 is formed of similar materials and by similar methods as the dielectric layer 106, as described above with respect to FIG. 4.

Next, UBMs 140 are formed for external connection to the interposers 100. The UBMs 140 have bump portions on and extending along the major surface of the dielectric layer 138, and have via portions extending through the dielectric layer 138 to physically and electrically couple the metallization pattern 136. As a result, the UBMs 140 are electrically coupled to the direct vias 132 and the conductive features of the middle redistribution layers 122 (e.g., the metallization patterns 123C, 123B, and 123A). In some embodiments, the UBMs 140 are formed of similar materials and by similar methods as the metallization pattern 116, as described above with respect to FIG. 6. In some embodiments, the UBMs 140 have a different size than the metallization patterns 112, 116, and 136.

The direct vias 132 extend between the lower redistribution layer(s) 119 and the upper redistribution layer(s) 139. The direct vias 132 have respective heights $H_1$ greater than the combined thicknesses of two or more redistribution layers of the middle redistribution layers 122. The direct vias 132 provide more direct electrical couplings between the conductive features of the lower redistribution layer(s) 119 and the conductive features of the upper redistribution layer(s) 139 than electrical couplings routed through staggered or stacks vias in the middle redistribution layers 122 (e.g., vias of the metallization patterns 123A, 123B, and 123C). These direct electrical couplings provided by the direct vias 132 can increase electrical performance by reducing resistance and mitigating voltage drops that may occur at high frequencies.

Figure 14:
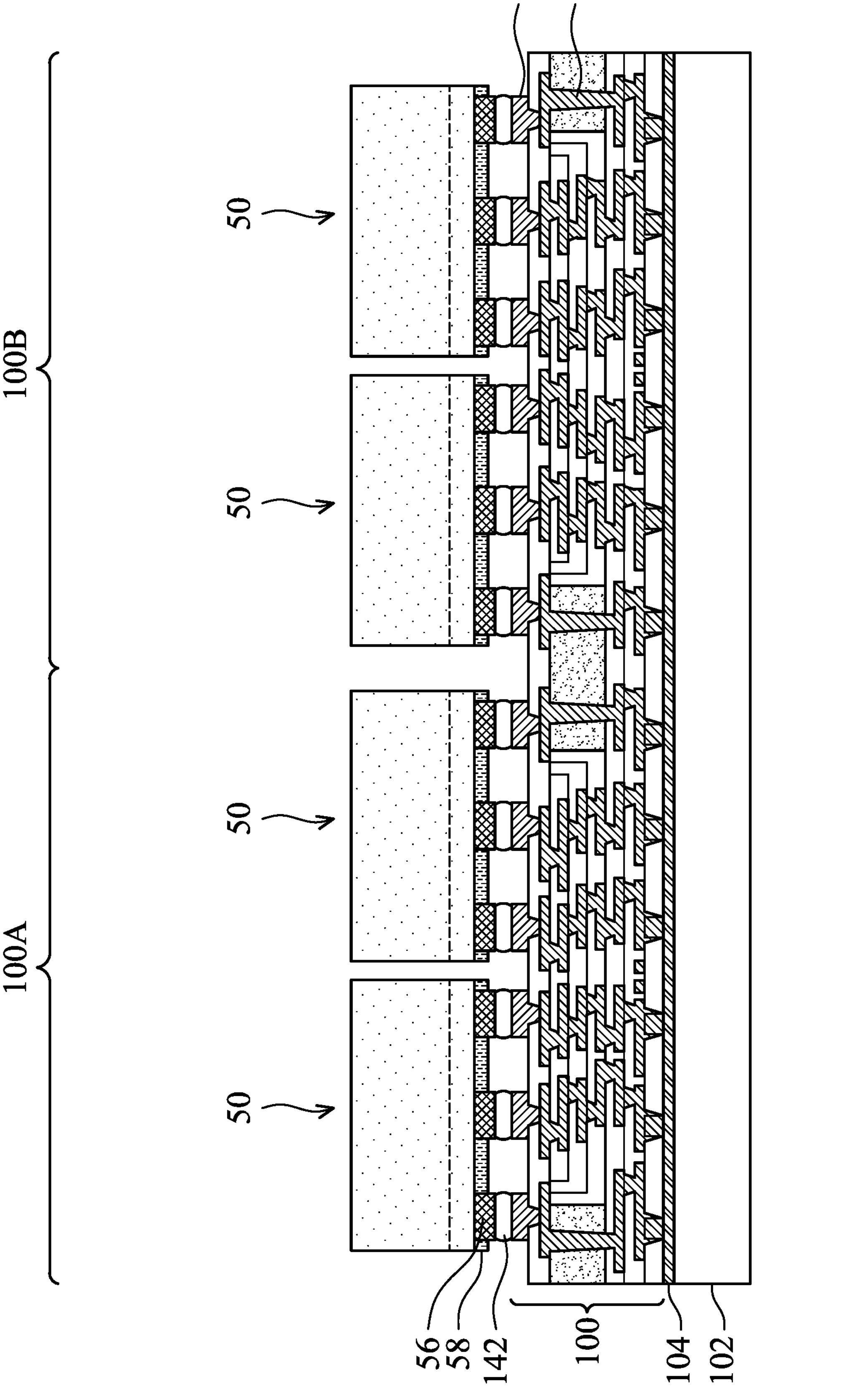

In FIG. 14, integrated circuit dies 50 are attached to the interposers 100 in the first package region 100A and the second package region 100B. Although four of the integrated circuit dies 50 are illustrated in FIG. 14, it should be appreciated that any number of the integrated circuit dies 50 may be attached to the interposers 100.

In some embodiments, the integrated circuit dies 50 are attached to the interposers 100 with conductive connectors 142, such as solder bonds. The conductive connectors 142 may be formed of a conductive material that is reflowable, such as solder, copper, aluminum, gold, nickel, silver, palladium, tin, the like, or a combination thereof. In some embodiments, the conductive connectors 142 are formed by initially forming a layer of solder through methods such as evaporation, electroplating, printing, solder transfer, ball placement, or the like. Once a layer of solder has been formed, a reflow may be performed in order to shape the conductive connectors 142 into desired bump shapes. Attaching the integrated circuit dies 50 to the interposers 100 may include placing the integrated circuit dies 50 on the interposers 100 and reflowing the conductive connectors 142. The integrated circuit dies 50 may be placed using, for example, a pick and place tool. The conductive connectors 142 form joints between corresponding UBMs 140 of the interposers 100 and die connectors 56 of the integrated circuit dies 50, physically and electrically connecting the interposers 100 to the integrated circuit dies 50.

Figure 15:
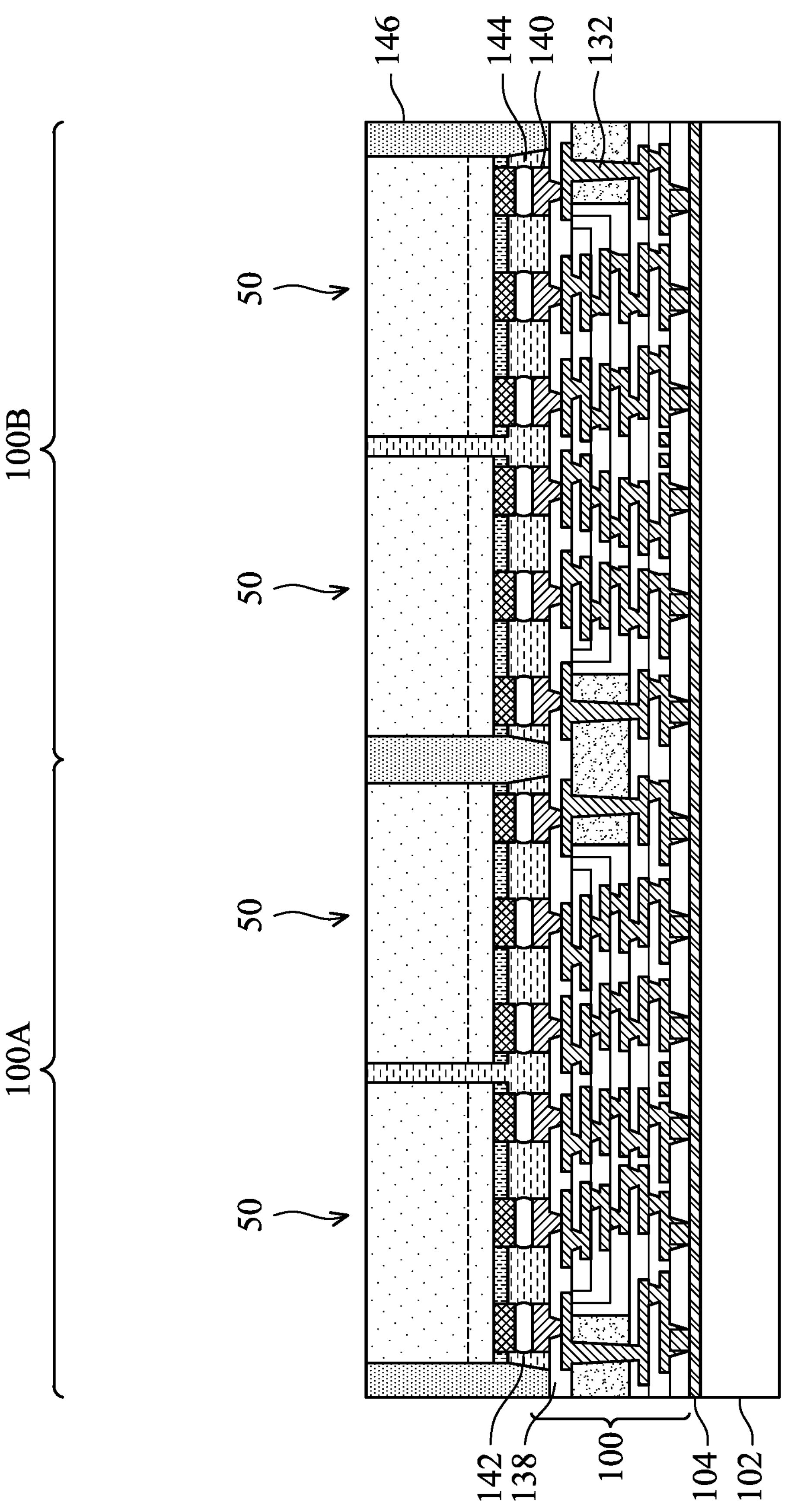

In FIG. 15, an underfill 144 is formed around the conductive connectors 142 and between the interposers 100 and the integrated circuit dies 50. The underfill 144 may reduce stress and protect the joints resulting from the reflowing of the conductive connectors 142. In some embodiments, the underfill 144 is formed of an underfill material such as a molding compound, epoxy, or the like. The underfill 144 may be formed by a capillary flow process after the integrated circuit dies 50 are attached to the interposers 100, or may be formed by a suitable deposition method before the integrated circuit dies 50 are attached to the interposers 100. The underfill 144 may be applied in liquid or semi-liquid form and then subsequently cured.

An encapsulant 146 is formed over the interposers 100 and around the integrated circuit dies 50. After formation, the encapsulant 146 encapsulates the integrated circuit dies 50 as well as the underfill 144 (if present) or the conductive connectors 142. In some embodiments, the encapsulant 146 is a molding compound, epoxy, or the like, and is applied by compression molding, transfer molding, or the like. The encapsulant 146 may be formed over the interposers 100 such that the integrated circuit dies 50 are buried or covered. In some embodiments, the encapsulant 146 is applied in liquid or semi-liquid form and then subsequently cured. The encapsulant 146 may be thinned to expose the integrated circuit dies 50. In some embodiments, the thinning process is a grinding process, a chemical-mechanical polish (CMP), an etch-back, combinations thereof, or the like. After the thinning process, the top surfaces of the integrated circuit dies 50 and the encapsulant 146 are substantially coplanar (within process variations).

Note that although the underfill 144 is illustrated as being formed between each of the integrated circuit dies 50 and having top surfaces that are level with the integrated circuit dies 50 and the encapsulant 146, the underfill 144 may only partially fill the gaps between the integrated circuit dies 50. As such, in some embodiments (not specifically illustrated), the encapsulant 146 is also formed at least partially between the integrated circuit dies 50, and the encapsulant 146 in those regions may be level with the integrated circuit dies 50 and the encapsulant 146 around the outermost sidewalls (e.g., perimeter) of the integrated circuit dies 50.

Figure 16:
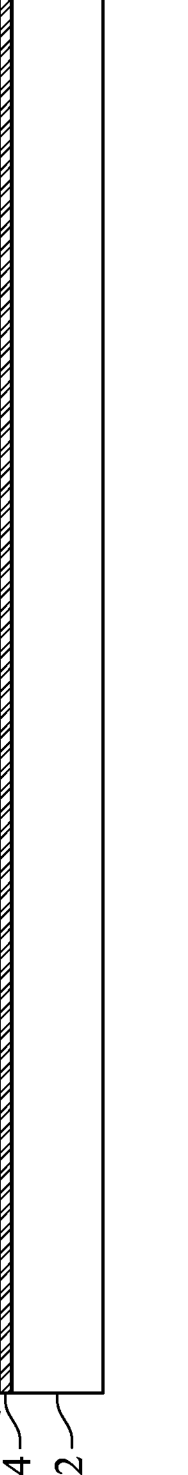

In FIG. 16, a carrier substrate 204 is attached to top surfaces of the encapsulant 146, the integrated circuit dies 50, and/or the underfill 144. In some embodiments, the carrier substrate 204 is adhered to the top surfaces of the encapsulant 146, the integrated circuit dies 50, and/or the underfill 144 with a release layer 202. The carrier substrate 204 and the release layer 202 may be similar to the carrier substrate 102 and the release layer 104, respectively, as described above with respect to FIG. 2, and the details are not repeated herein.

Figure 17:
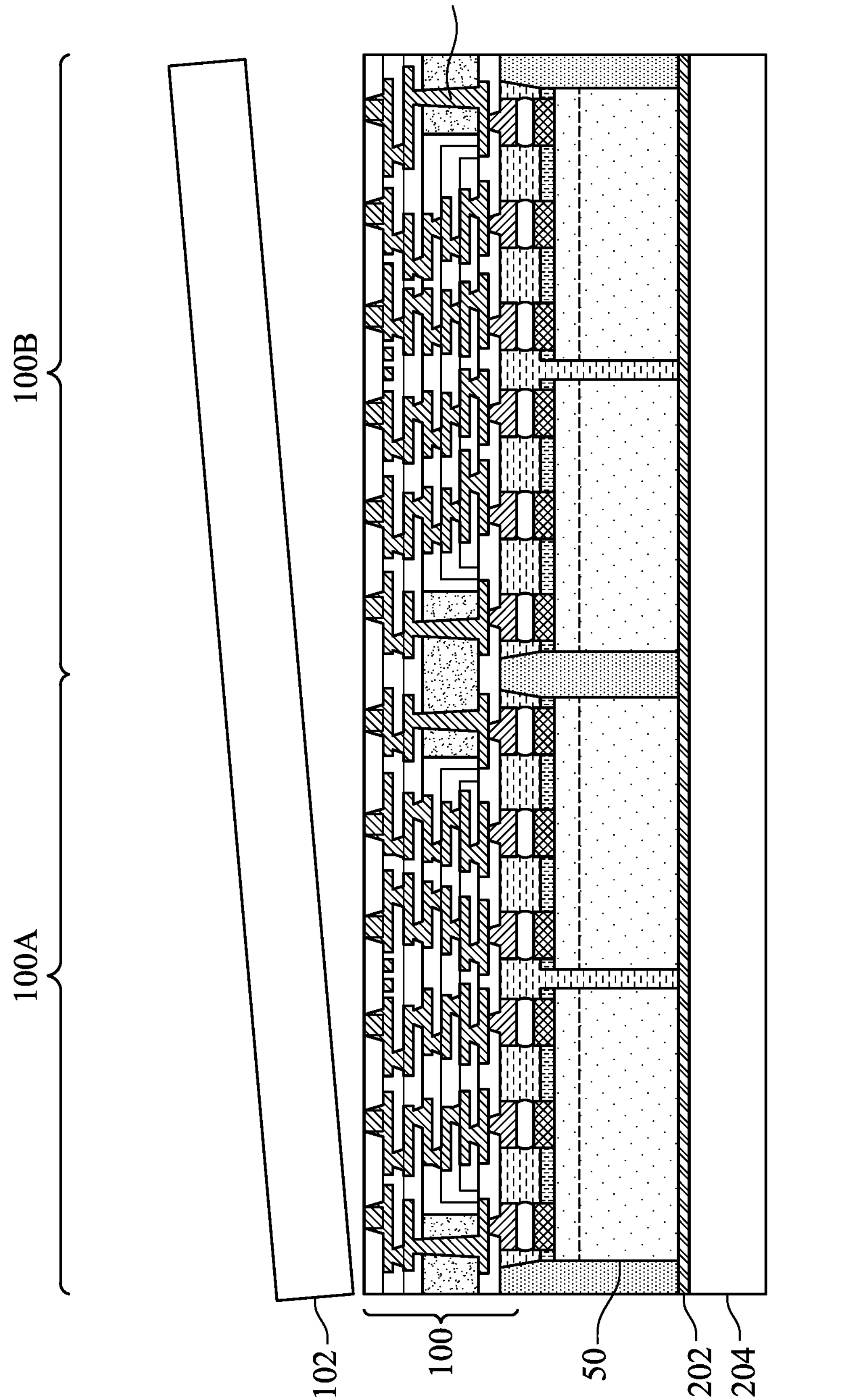

In FIG. 17, the structure is flipped over and a carrier substrate de-bonding is performed to detach (or "de-bond") the carrier substrate 102 from the interposers 100. In accordance with some embodiments, the de-bonding includes projecting a light such as a laser light or an UV light on the release layer 104 so that the release layer 104 decomposes under the heat of the light and the carrier substrate 102 can be removed.

Figure 18:
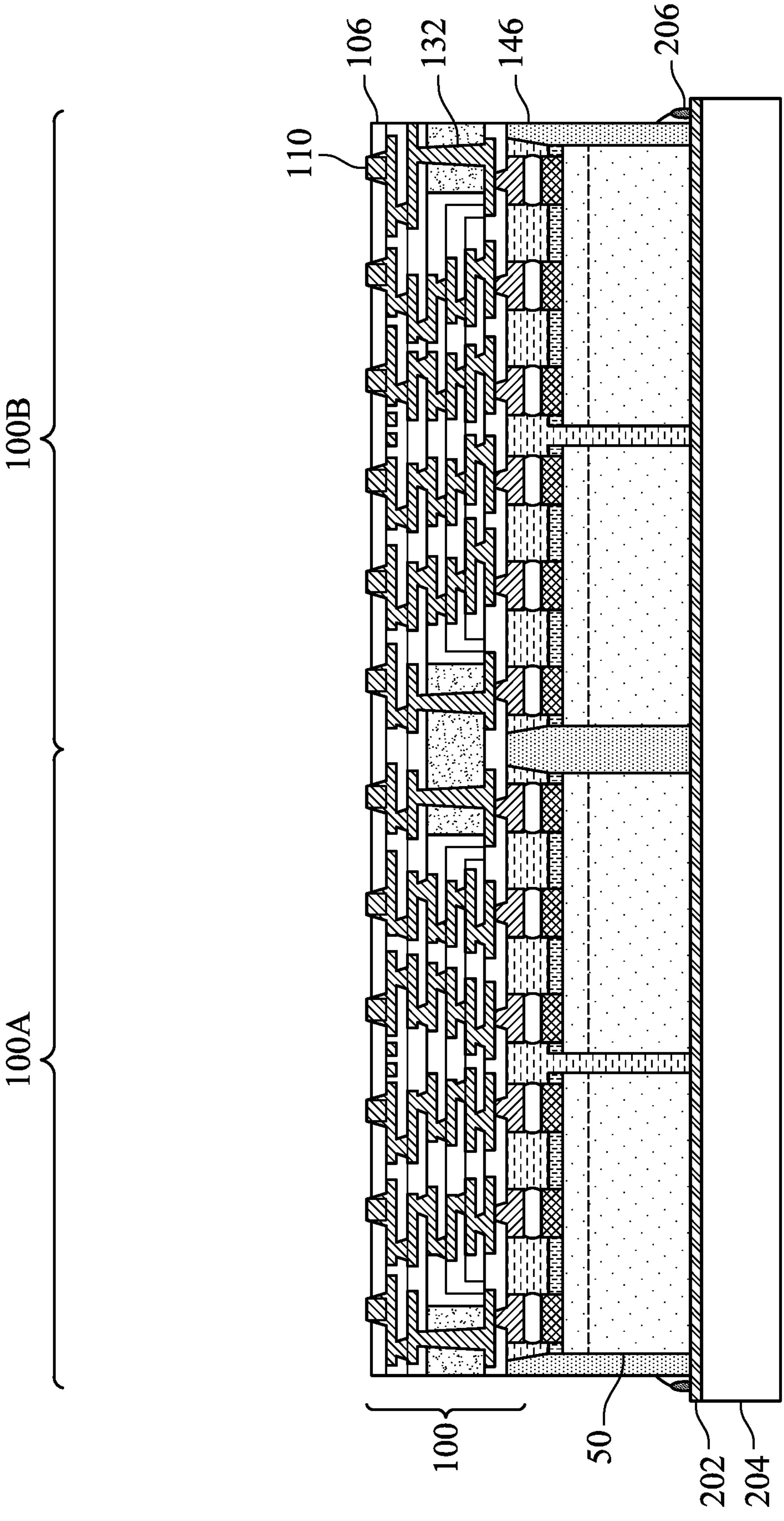

In FIG. 18, an optional wafer trim process is performed to trim outer sidewalls of the structure, which may remove outer portions of the interposers 100 and outer portions of the encapsulant 146. In some embodiments, the wafer trim process is performed by rotating the carrier substrate 204 while polishing outer edges of the structure with a polishing tool (e.g., an abrasive tape). The wafer trim process is shown in FIG. 18 as trimming the left edge of the structure in the second package region 100B and the right edge of the structure in the first package region 100A for illustrative purposes only. The wafer trim process may be performed only on edges of package regions that are located on edges of the structure. In some embodiments, the wafer trim process is omitted.

In some embodiments, one or more dams 206 are formed around bottom sidewalls of the encapsulant 146 after the wafer trim process. The dams 206 are optional and may be omitted or removed from subsequently formed structures. The dams 206 may include a polymeric filler material such as an acrylic, an epoxy, or the like. The polymeric filler material may be an ultraviolet (UV) light curable resin, such as a free radical curing acrylic compound ("acrylates"). In some embodiments, the polymeric filler material is a photosensitive monomer, such as a photoresist. In some embodiments, the material of the dams 206 is dispensed around bottom sidewalls of the encapsulant 146 by, e.g., a printing process such as inkjet printing. The material of the dams 206 may be dispensed at a high temperature with a low viscosity. After the material of the dams 206 is dispensed, a curing process is performed. The curing process may include exposing the polymeric filler material to an ultraviolet light source. In embodiments where the polymeric filler material is a photosensitive monomer, such as a photoresist, exposing the photoresist may cause cross-linking between the photosensitive monomers. Curing the polymeric filler material may harden the polymeric filler material into a solid material, thereby forming the dams 206. However, any suitable methods and materials may be used to form the dams 206.

In some embodiments, an etch back is performed on the dielectric layer 106 to expose portions of the conductive features 110 and/or the metallization pattern 112. The etch back is selective to the material of the dielectric layer 106 over the material of the conductive features 110 and the metallization pattern 112. The etch back may be performed with a suitable dry etch process, e.g. a reactive ion etch. After the etch back, the conductive features 110 and/or the metallization pattern 112 protrude from the dielectric layer 106.

Figure 19:
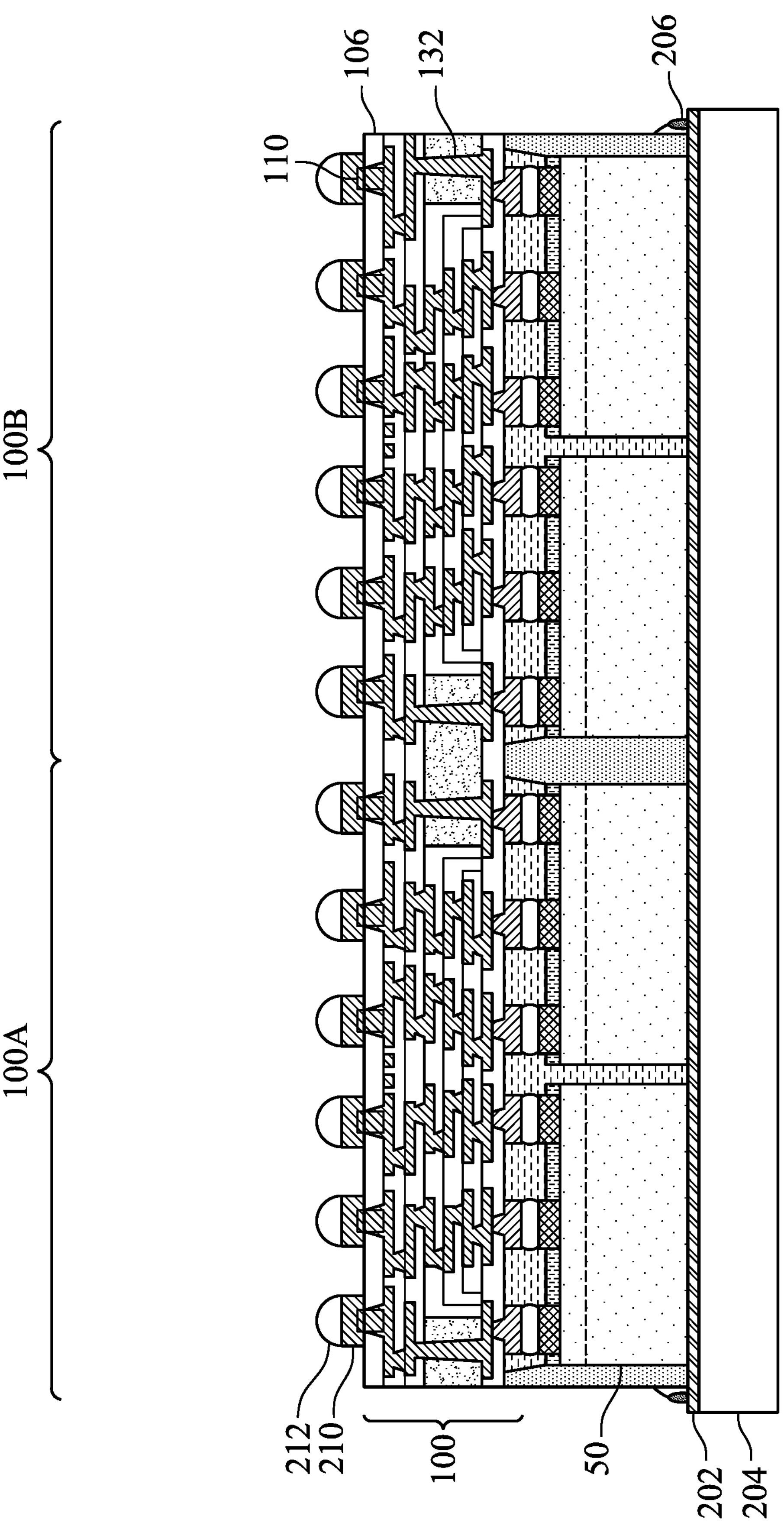

In FIG. 19, UBMs 210 are formed over the conductive features 110 and/or the metallization pattern 112. The UBMs 210 may be formed using similar methods and similar materials as described above for the UBMs 140 with respect to FIG. 13, and the details are not repeated herein.

Further, conductive connectors 212 are formed on the UBMs 210. The conductive connectors 212 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 212 may include a conductive material such as solder, copper, aluminum, gold, nickel, silver, palladium, tin, the like, or a combination thereof. In some embodiments, the conductive connectors 212 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 212 comprise metal pillars (such as copper pillars) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 20:
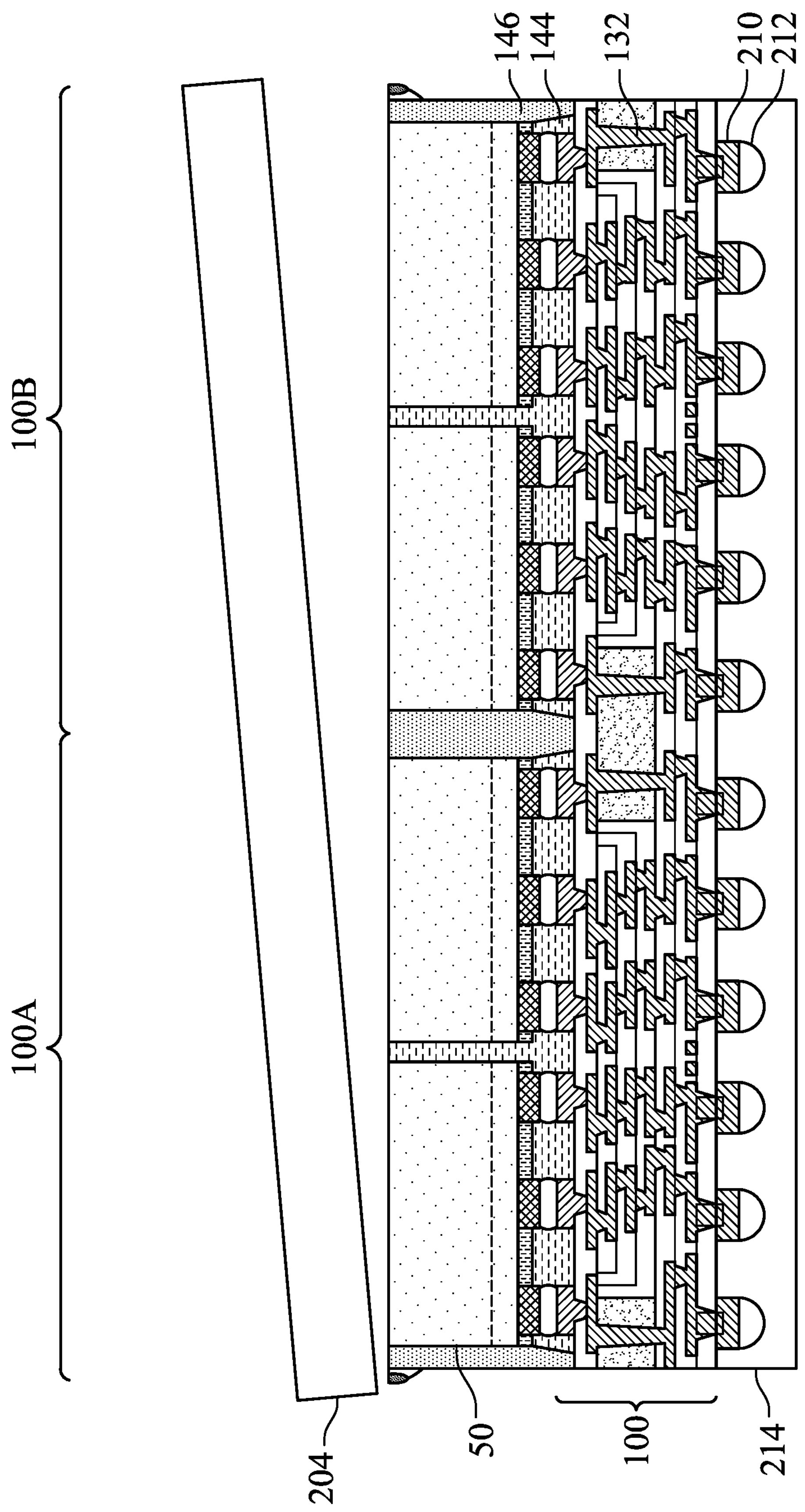

In FIG. 20, the structure is flipped over and a carrier substrate de-bonding is performed to detach (or "de-bond") the carrier substrate 204 from the integrated circuit dies 50, the encapsulant 146, and/or the underfill 144. The carrier substrate de-bonding may be performed using similar methods as described above with respect to FIG. 17, and the details are not repeated herein.

Before or after the de-bonding process, a back-grinding (BG) tape 214 is attached to the conductive connectors 212 and/or the UBMs 210. The BG tape 214 protects the conductive connectors 212 from damage during a subsequent planarization process (see below, FIG. 22). In some embodiments, the BG tape 214 is attached to the conductive connectors 212 by lamination or the like.

Figure 21:
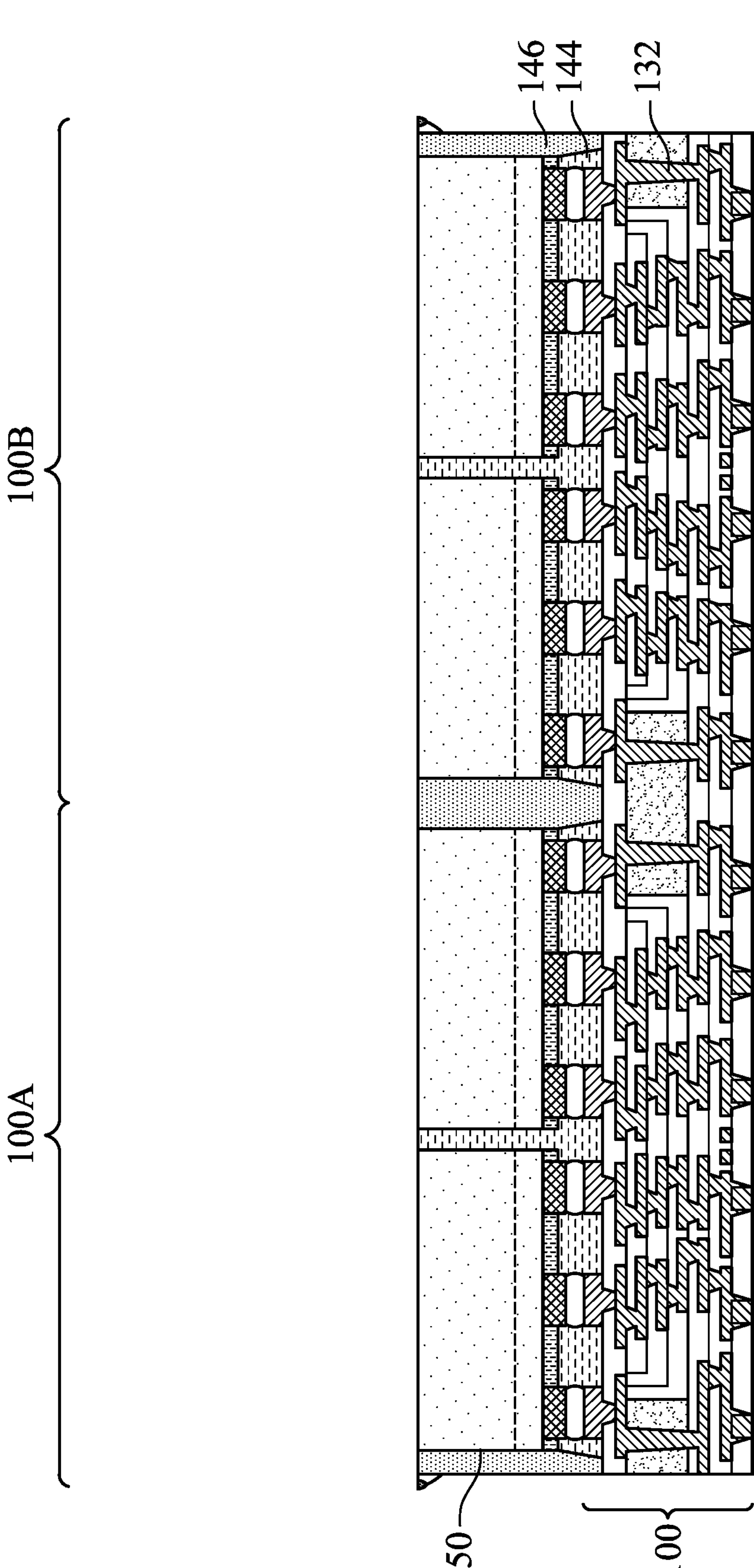

In FIG. 21, a back-grinding process is performed on the exposed top surfaces of the encapsulant 146, the integrated circuit dies 50, and/or the underfill 144. In some embodiments, the back-grinding process includes a grinding, a CMP, or the like. The BG tape 214 protects the conductive connectors 212 from damage during the back-grinding process. The integrated circuit dies 50 and the encapsulant 146 are thinned by the back-grinding process, thereby reducing the thickness of the resulting package components.

Figure 22:
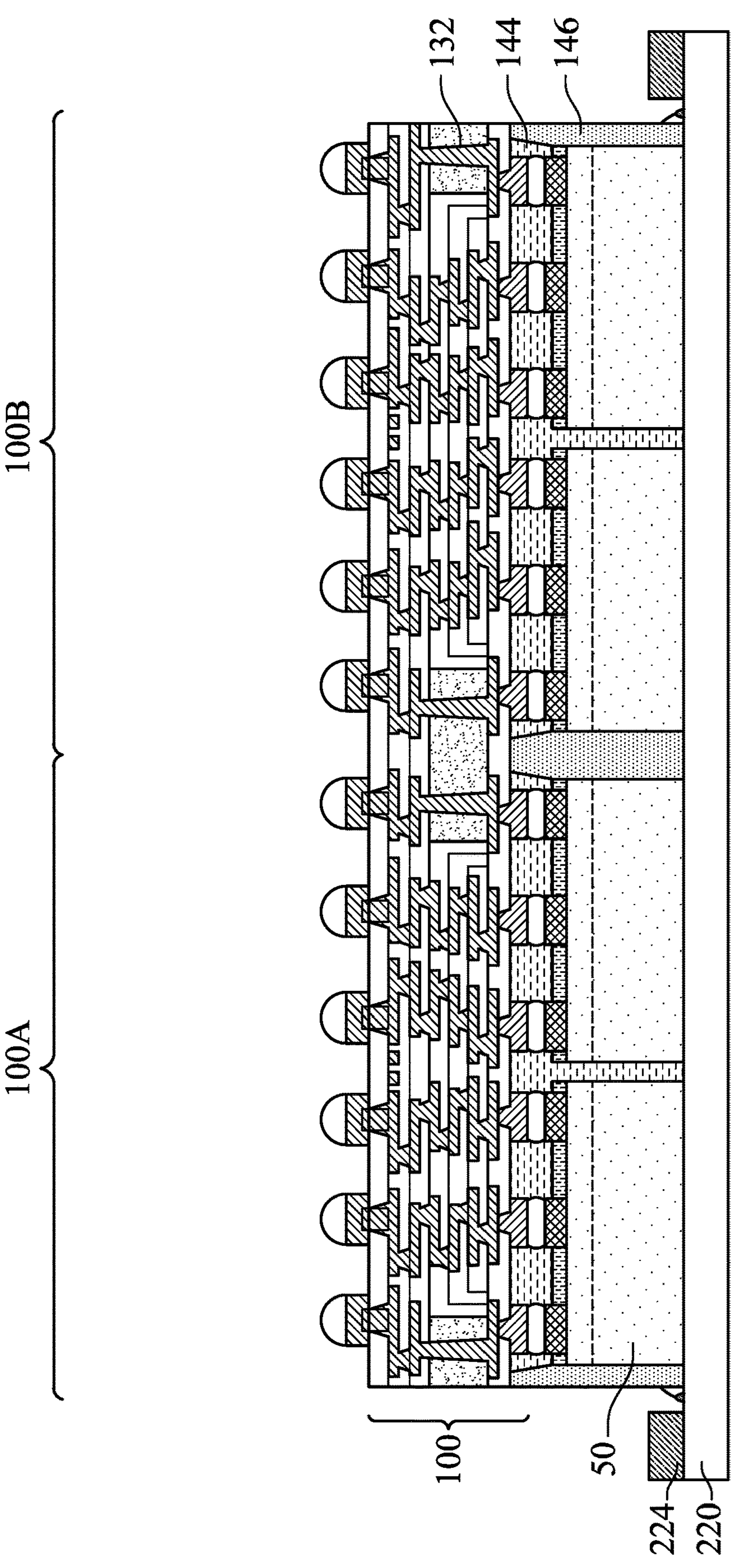

In FIG. 22, the structure is flipped over and placed on a tape 220 for further processing (e.g., singulation). The tape 220 is supported by a frame 224. The BG tape 214 is then removed from the structure with a suitable process (e.g., laser grooving, sawing, UV light, or the like).

Figure 23:
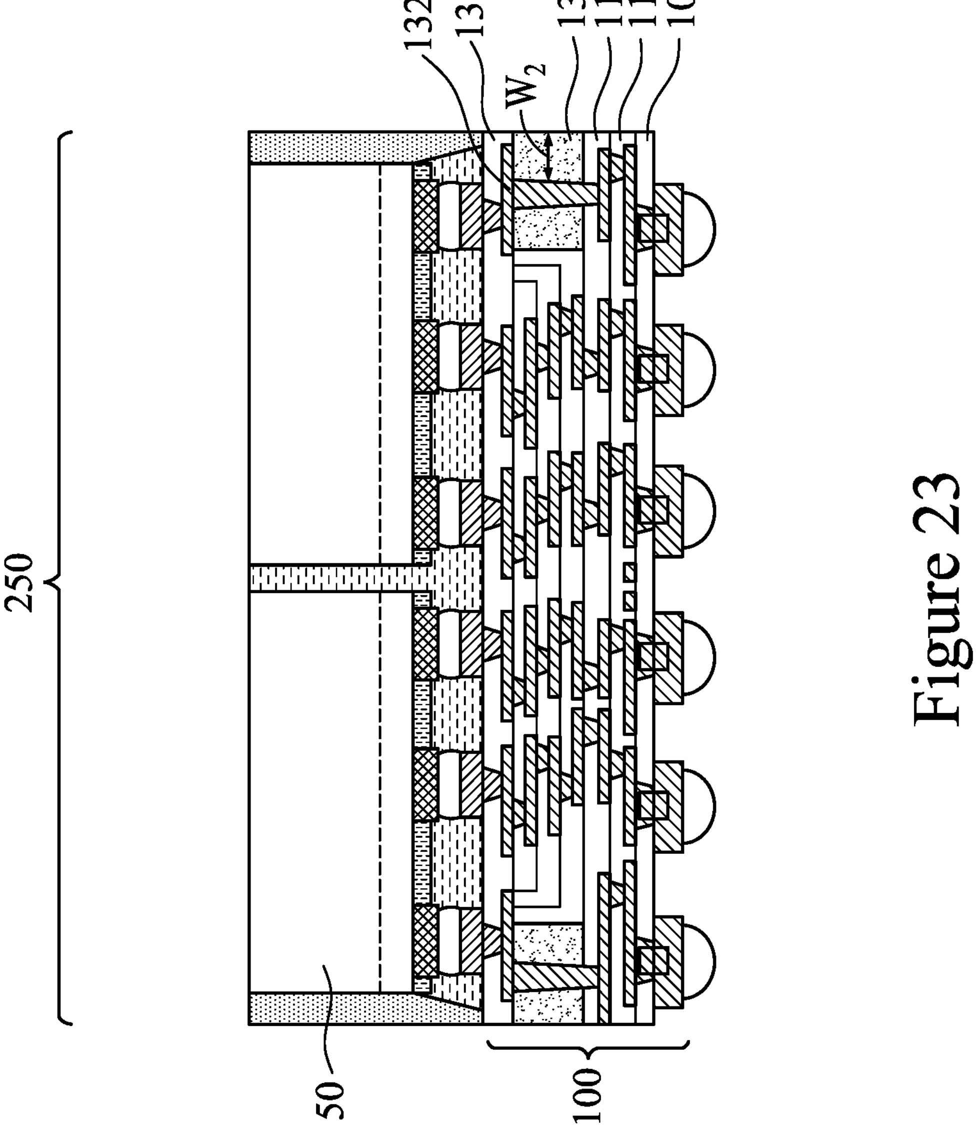

In FIG. 23, a singulation process is performed by sawing along scribe line regions, e.g., between the first package region 100A and the second package region 100B. The sawing singulates the first package region 100A from the second package region 100B. The resulting, singulated package component 250 shown in FIG. 23 is from one of the first package region 100A or the second package region 100B. After the singulation process, sidewalls of the encapsulant 146 and the interposer 100 (including the dielectric layers 106, 114, 118, 134, and 138) are coterminous. As illustrated in FIG. 23, the first package component includes integrated circuit dies 50 mounted on an interposer 100 that includes direct vias 132. In some embodiments, the direct vias 132 are separated from outer sidewalls of the interposer 100 by a second width $W_2$ in a range of 10 μm to 1000 μm.

As subsequently described in greater detail, a first package component 250 will be mounted to a package substrate to form an integrated circuit package. For example, the first package component 250 may be a chip-on-wafer (CoW) component, and the integrated circuit package may be a chip-on-wafer-on-substrate (CoWoS) package.

Figure 24:
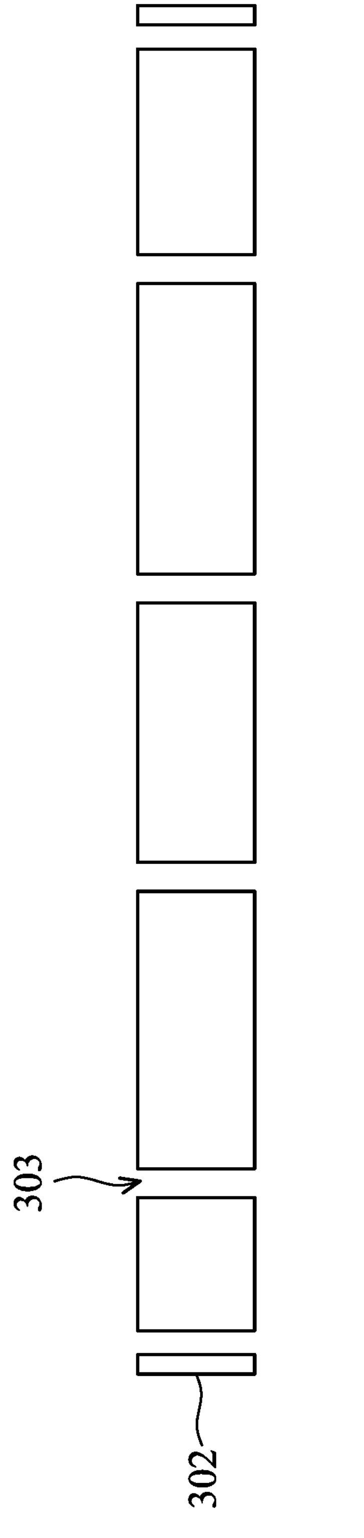
FIGS. 24, 25, 26A, 26B, 27A-27D, and 28 are views of intermediate stages in the manufacturing of a package substrate, in accordance with some embodiments.
Figure 25:
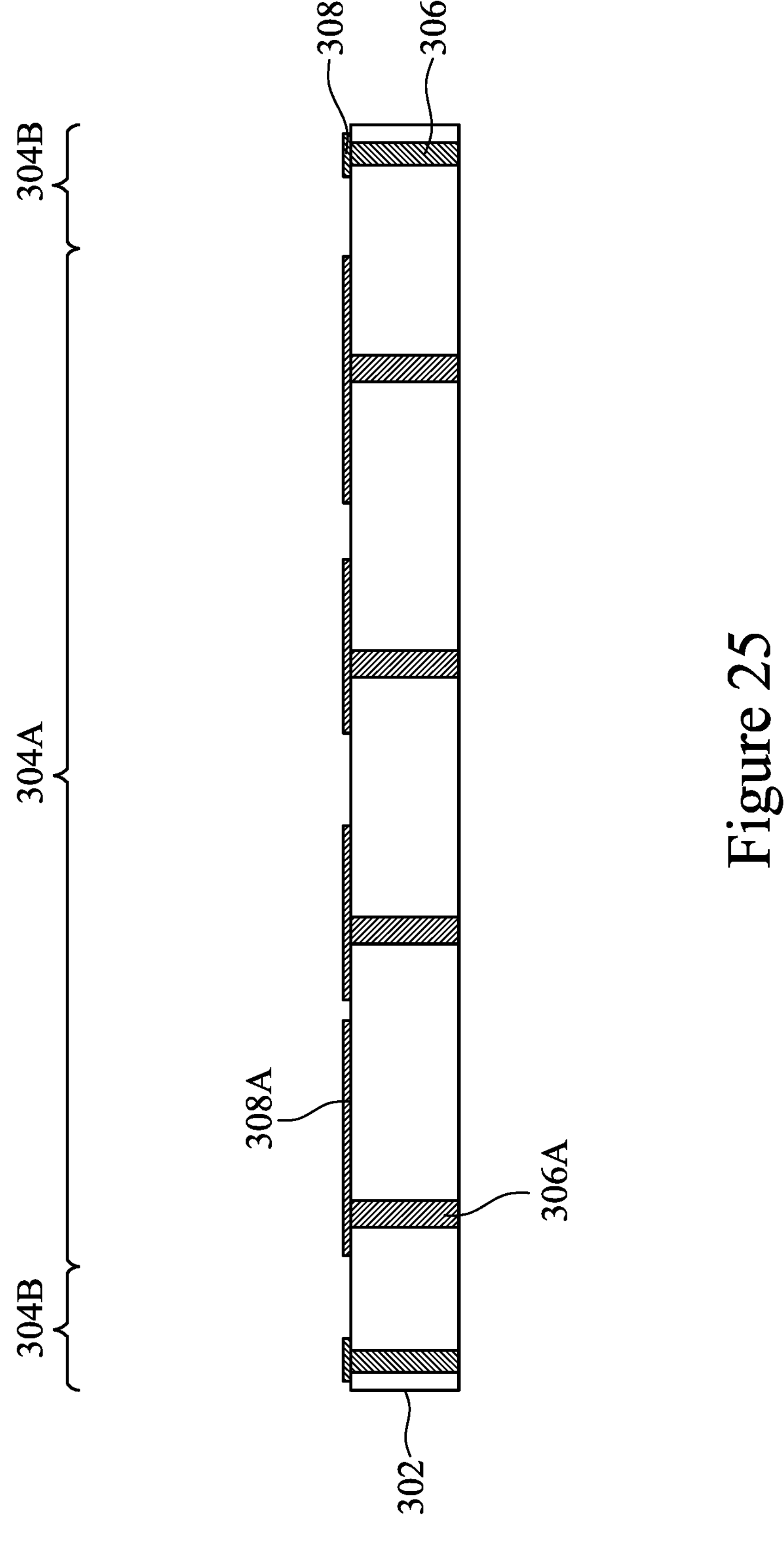
Figures 26A, 26B:
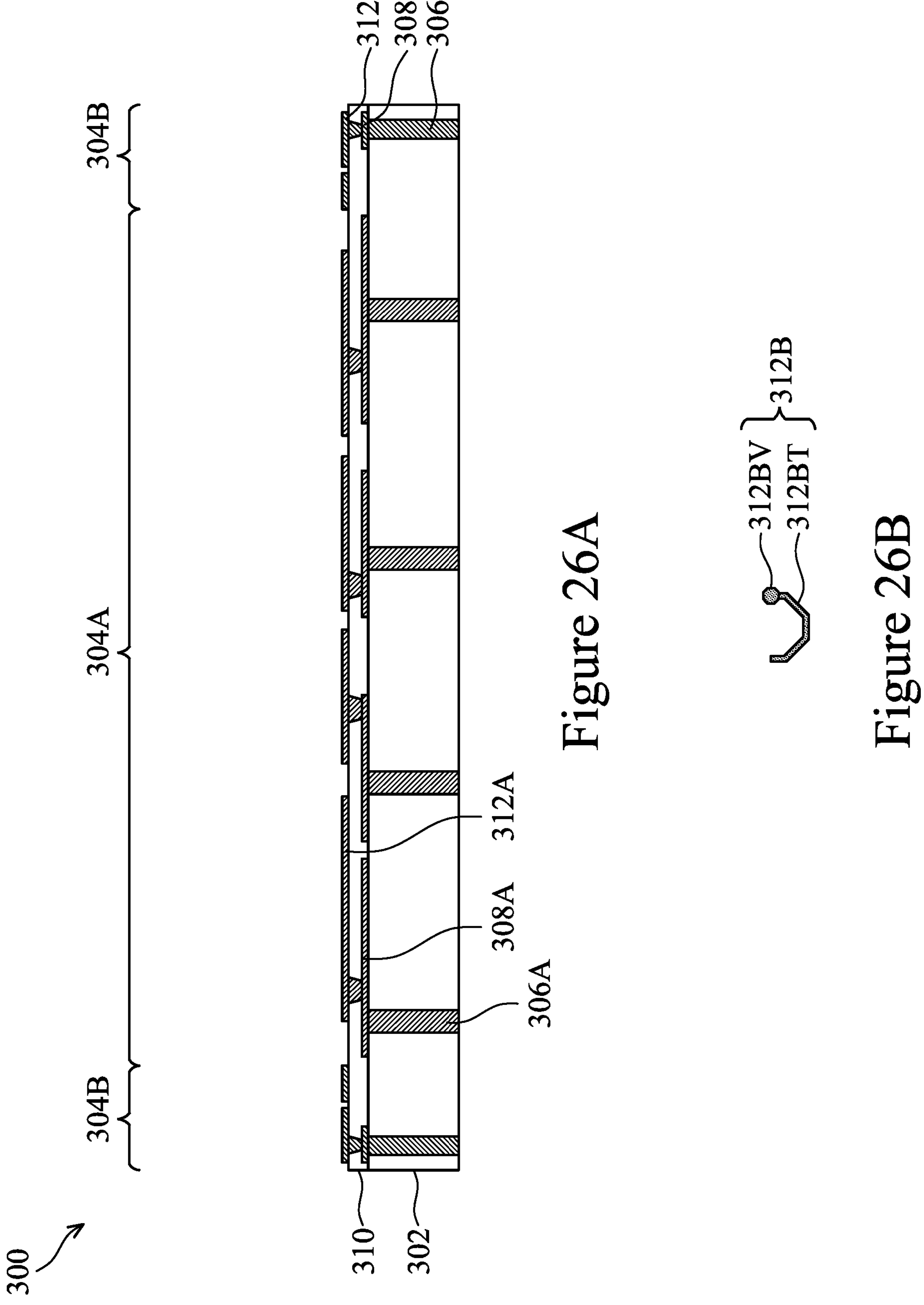
Figures 27A, 27B:
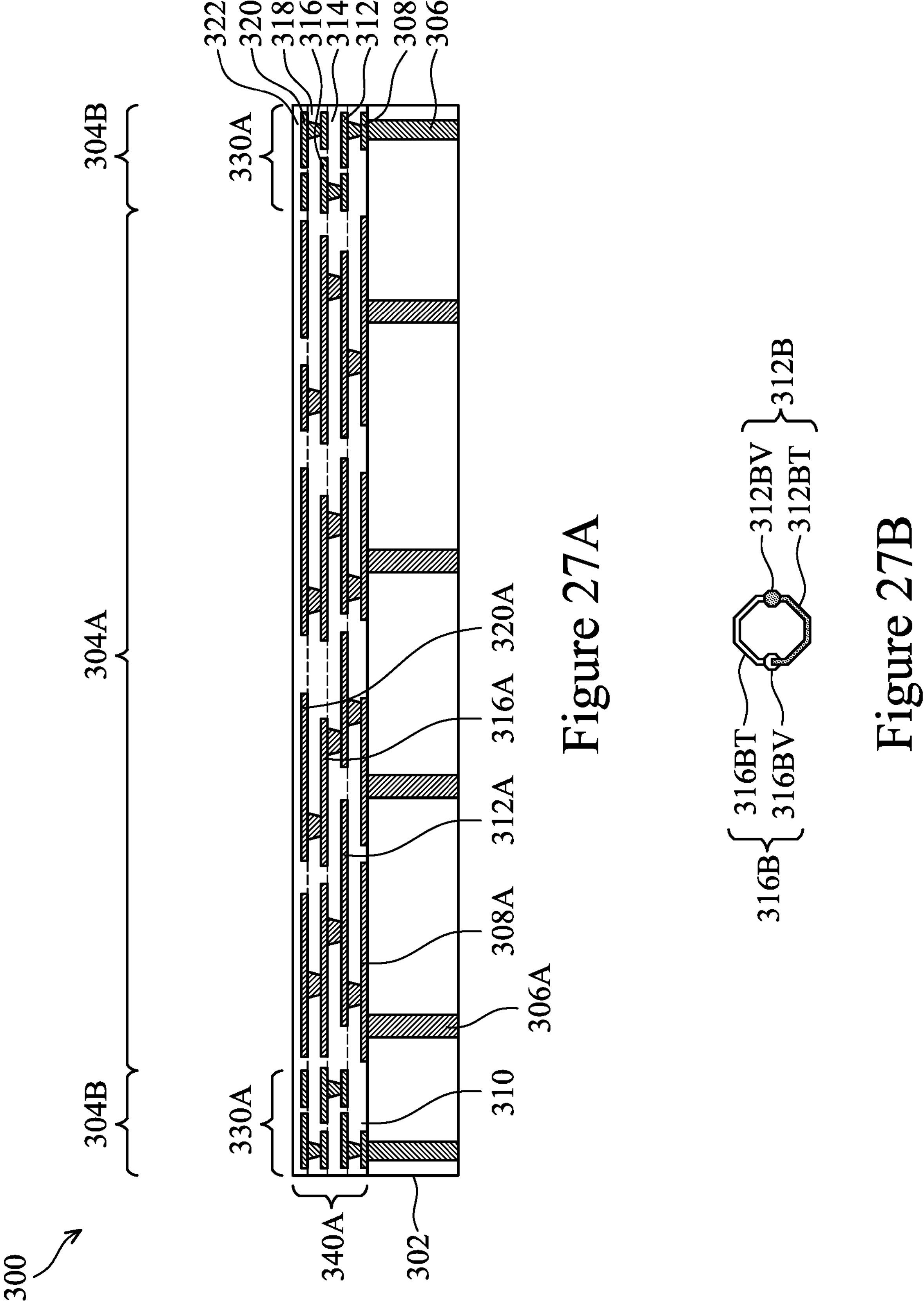
Figure 27C:
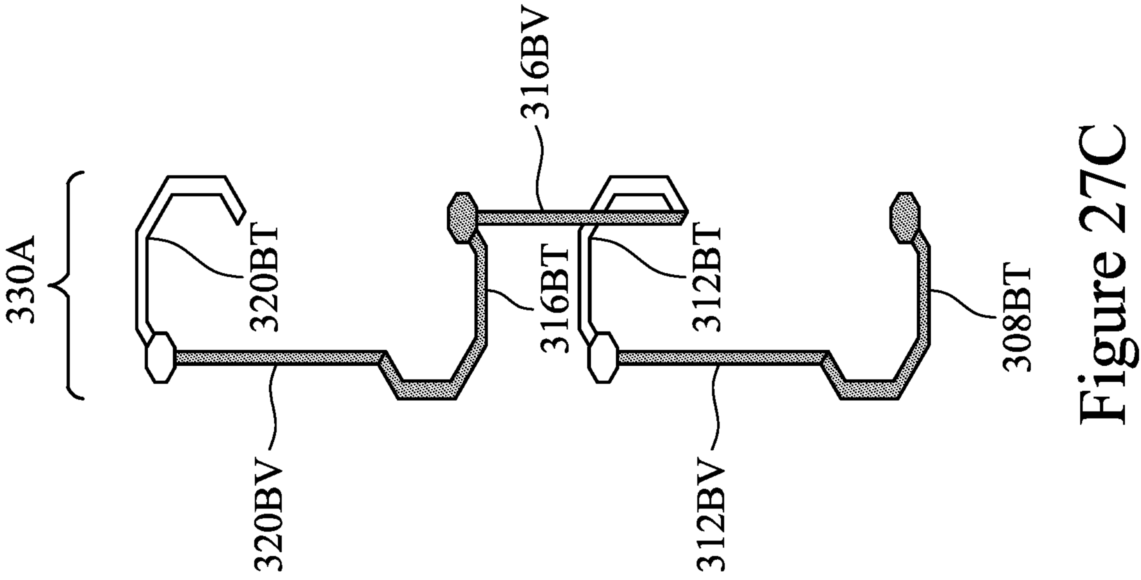
Figure 27D:
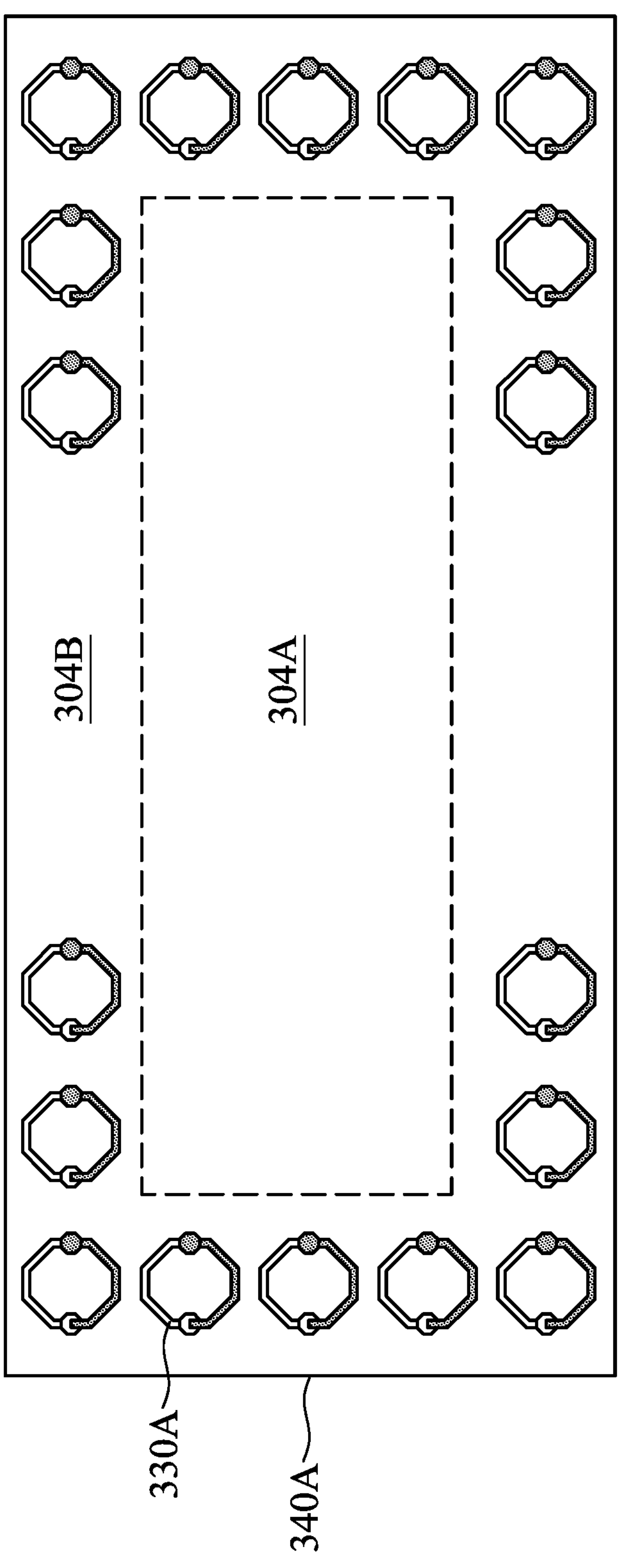
Figure 27D:

FIGS. 24, 25, 26A, 26B, 27A-27D, and 28 are cross-sectional views of intermediate steps of a process for forming a package substrate 300 including one or more spiral routing stacks, in accordance with some embodiments. One or more package components (e.g., a first package component 250; see above, FIG. 23) may be attached to the package substrate 300 to form an integrated circuit package, wherein the package substrate 300 provides additional routing for the package components. The one or more spiral routing stacks are formed in peripheral areas of redistribution structures above and below a substrate core of the interconnect structure. The spiral routing stacks may improve signal and power integrity by enabling an inductor function to reduce or prevent radio interference, such as for high frequency applications. FIGS. 24, 25, 26A, 27A, 28, and 29 are cross-sectional views of the package substrate 300. FIGS. 26B and 27B are top-down views of portions of a spiral routing stack of the package substrate 300. FIG. 27C is a three-dimensional view of a spiral routing stack of the package substrate 300. FIG. 27D is a top-down view of the package substrate 300.

In FIG. 24, a substrate core 302 is obtained or formed. In some embodiments, the substrate core 302 includes a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the substrate core may be a double-sided copper-clad laminate (CCL) substrate or the like.

Openings 303 are formed in the substrate core 302. In some embodiments, the openings 303 are formed by, for example, a laser drilling technique. Other processes, e.g., mechanical drilling, etching, or the like, may also be used. In some embodiments, an optional surface preparation process may be performed after the openings 303 are formed. The surface preparation process may include a process that cleans exposed surfaces of the substrate core 302 with one or more cleaning solutions. The cleaning solutions may include sulfuric acid, chromic acid, a neutralizing alkaline solution, a water rinse, the like, or a combination thereof. In some cases, the surface preparation process removes or reduces residues, oils, native oxide films, etc. In some embodiments, an optional desmear process may be performed to clean regions near the openings 303. The desmear process may be performed in addition to or instead of the surface preparation process. For example, the desmear process may remove residual material of the substrate core 302. The desmear process may be accomplished mechanically (e.g., blasting with a fine abrasive in a wet slurry), chemically (e.g., rinsing with a combination of organic solvents, permanganate, etc.), or by a combination of mechanical and chemical desmearing. Following the surface preparation process or desmear process, a conditioning treatment may be performed using a chemical conditioner that facilitates adsorption of an activator used during subsequent electroless plating.

FIGS. 25-27B illustrate a process for forming a routing structure 340A on a first side of the substrate core 302. In this example, the routing structure 340A includes dielectric layers 310, 314, 318, and 322 and routing patterns 308A, 308B, 312A, 312B, 316A, 316B, 320A, and 320B. More or fewer dielectric layers and routing patterns may be formed by repeating or omitting steps and process discussed below.

In FIG. 25, through vias 306A and 306B are formed in the openings 303 through the substrate core 302. Additionally, routing patterns 308A and 308B are formed on the first side of the substrate core 302. The through vias 306A and the routing pattern 308A are formed in a central region 304A of the package substrate 300, and the through vias 306B and the routing pattern 308B are formed in a peripheral region 304B of the package substrate 300, wherein the peripheral region 304B surrounds the central region 304A. The through vias 306B and the routing pattern 308B in the peripheral region 304B will subsequently be used to form spiral routing stacks (see below, FIGS. 26A-27B).

In some embodiments, the routing patterns 308A and 308B and the through vias 306A and 306B are formed by first forming a patterned mask (e.g., a patterned photoresist layer) over the substrate core 302. Openings in the patterned mask expose portions of the substrate core 302 on which conductive material will subsequently be formed. The openings in the patterned mask also expose the openings 303 through the substrate core 302. The conductive material is then deposited on the exposed regions of the substrate core 302 and within the openings 303 through the substrate core 302 using, for example, a plating process, such as an electroless plating process, an electrolytic plating process, or the like. After depositing the conductive material, the patterned mask layer (e.g., the photoresist) is removed using a suitable process such as a wet chemical process or a dry process (e.g., an ashing process). In this manner, the through vias 306A and 306B are formed in the openings 303 through the substrate core 302 and the routing patterns 308A and 308B are formed on the first side of the substrate core 302.

In some embodiments, the conductive material for the through vias 306A and 306B is deposited along sidewalls of the openings 303, the openings 303 may then be filled with a dielectric material (not illustrated) so that the through vias 306A and 306B comprise a dielectric central member surrounded by conductive material. The dielectric material may provide structural support and protection for the conductive material. In some embodiments, the dielectric material is a molding material; epoxy; an epoxy molding compound; a resin; materials including monomers or oligomers such as acrylated urethanes, rubber-modified acrylated epoxy resins, or multifunctional monomers; the like; or a combination thereof. In some embodiments, the dielectric material includes pigments or dyes (e.g., for color), or other fillers and additives that modify rheology, improve adhesion, or affect other properties of the dielectric material. The dielectric material may be formed using, e.g., a spin-on process or another process. In some embodiments, the conductive material completely fills the openings 303 through the substrate core 302, omitting the dielectric material.

In FIG. 26A, a dielectric layer 310 is formed over the exposed portions of the substrate core 302, the through vias 306A and 306B, and the routing patterns 308A and 308B. In some embodiments, the dielectric layer 310 is a material such as a build-up material, ABF, a prepreg material, a laminate material, another material similar to those described above for the substrate core 302, the like, or combinations thereof. The dielectric layer 310 may be formed by a lamination process, a coating process, or another suitable process.

Additionally, routing patterns 312A and 312B are formed over the routing patterns 308A and 308B, respectively. The routing pattern 312A is formed in the central region 304A, and the routing pattern 312B is formed in the peripheral region 304B of the package substrate 300. Openings (not shown) are formed in the dielectric layer 310 that expose portions of the routing patterns 308A and 308B for subsequent electrical connection. In some embodiments, the openings are formed by, for example, a laser drilling technique. Other processes, e.g., mechanical drilling, etching, or the like, may also be used in other embodiments. In some embodiments, an optional surface preparation process (e.g., a desmear process or the like) may be performed after the openings are formed. A conductive material is formed within the openings in the dielectric layer 310. In some embodiments, a conductive layer (not shown) may be formed over the dielectric layer 310, which may act as a seed layer for forming the conductive material. The conductive layer may be e.g., a metal foil such as a copper foil, or another type of material. A patterned mask may be formed over the dielectric layer 310. The patterned mask may be, for example, a patterned photoresist layer. Openings in the patterned mask may expose portions of the dielectric layer 310 (or, if present, a conductive layer on the dielectric layer 310) on which conductive material will subsequently be formed. The openings in the patterned mask also may expose the openings in the dielectric layer 310. The conductive material may then be formed on the exposed regions of the dielectric layer 310 and within the openings in the dielectric layer 310 using, for example, a plating process, an electroless plating process, or another process. After forming the conductive material, the patterned mask layer (e.g., the photoresist) may be removed using, e.g., a wet chemical process or a dry process (e.g., an ashing process). In this manner, routing patterns 312A and 312B are formed over and electrically and physically coupled to the routing patterns 308A and 308B.

FIG. 26B illustrates a top-down view of a trace portion 312BT and via portion 312BV of the routing pattern 312B. The trace portion 312BT extends along the dielectric layer 310 (see FIG. 26A) and the via portion 312BV extends through the dielectric layer 310. In some embodiments, the trace portion 312BT has a semicircular or semi-polygonal (e.g., semi-octagonal) shape. Trace portions of routing patterns subsequently formed above the routing pattern 312B will couple with the trace portion 312BT to form a spiral routing stack with a spiral shape. The via portion 312BV physically and electrically couples with the underlying routing pattern 308B.

In FIG. 27A, additional dielectric layers 314, 318, and 322 and additional routing patterns 316A, 316B, 320A, and 320B are formed, thereby completing the routing structure 340A. The dielectric layer 314 is formed over the dielectric layer 310 and the routing patterns 312A and 312B. The routing patterns 316A and 316B are formed over and through the dielectric layer 314 to be electrically and physically coupled to the routing patterns 312A and 312B, respectively. The dielectric layer 318 is formed over the dielectric layer 314 and the routing patterns 316A and 316B. The routing patterns 320A and 320B are formed over and through the dielectric layer 318 to be electrically and physically coupled to the routing patterns 316A and 316B, respectively. The dielectric layer 322 is formed over the dielectric layer 318 and the routing patterns 320A and 320B. The dielectric layers 314, 318, and 322 may be formed using similar materials and by similar methods as the dielectric layer 310 as described above with respect to FIG. 26A. The routing patterns 316A, 316B, 320A, and 320B may be formed using similar materials and by similar methods as the routing patterns 312A and 312B as described above with respect to FIG. 26A. In some embodiments, conductive vias and/or UBMs (not illustrated) are formed over and through the dielectric layer 322 and physically and electrically couple with the routing patterns 320A and 320B to provide external connection for the routing structure 340A.

In some embodiments, a patterned protective layer (not shown) is formed over the routing structure 340A of the package substrate 300. The protective layer may be formed and patterned over the routing structure 340A. The protective layer may be e.g., a solder resist material, and may be formed to protect the surfaces of the routing structure 340A. In some embodiments, the protective layer may be a photosensitive material formed by printing, lamination, spin-coating, or the like. The photosensitive material may then be exposed to an optical pattern and developed, forming openings in the photosensitive material. In other embodiments, the protective layer may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). Other processes and materials may also be used.

FIG. 27B illustrates a top-down view of a trace portion 316BT and via portion 316BV of the routing pattern 316B overlaid on a trace portion 316BT and via portion 316BV of the routing pattern 312B, respectively. The trace portion 316BT extends along the dielectric layer 314 (see FIG. 27A) and the via portion 316BV extends through the dielectric layer 314. The via portion 316BV of the routing pattern 316B physically and electrically couples with the trace portion 312BT of the routing pattern 312B, so that the trace portion 316BT of the routing pattern 316B completes a circular or polygonal (e.g., octagonal) shape with the trace portion 312BT of the routing pattern 312B. Although illustrated embodiments of the spiral routing stacks include trace portions 312BT and 316BT that are coupled in series, in some embodiments the trace portions of the spiral routing stacks are coupled in parallel.

The routing patterns 308B, 312B, 316B, and 320B in the peripheral region 304B form parts of respective spiral routing stacks 330A. FIG. 27C is a three-dimensional view of a spiral routing stack 330A. The spiral routing stack 330A is formed by respective trace portions 308BT, 312BT, 316BT, and 320BT of the routing patterns 308B, 312B, 316B, and 320B and respective via portions 312BV, 316BV, and 320BV of the routing patterns 312B, 316B, and 320B. The spiral routing stack 330A (including the trace portions and via portions of the routing pattern 308B, 312B, 316B, and 320B) has a spiral shape, which may enable inductive function. The spiral routing stacks 330A may function as inductive coils and improve signal and power integrity to reduce or prevent radio interference, such as for high frequency applications. In some embodiments, the spiral routing stacks 330A are coupled to surface-mounted devices (e.g., capacitors, inductors, or the like; see below, FIG. 32) to form harmonic circuits in order to enhance signals.

FIG. 27D illustrates a top-down view of the routing structure 340A. Positions of the spiral routing stacks 330A are illustrated as the shape of the trace portions and via portions of the routing pattern 316B overlaid on the trace portions and via portions of the routing pattern 312B as illustrated in FIG. 27B above. However, top surfaces of the spiral routing stacks 330A may be covered by the dielectric layer 322, and the spiral routing stacks 330A are displayed in the top-down view for illustrative purposes. In some embodiments, spiral routing stacks 330A are distributed in the peripheral region 304B, while the central region 304A is free of spiral routing stacks 330A.

Figure 28:
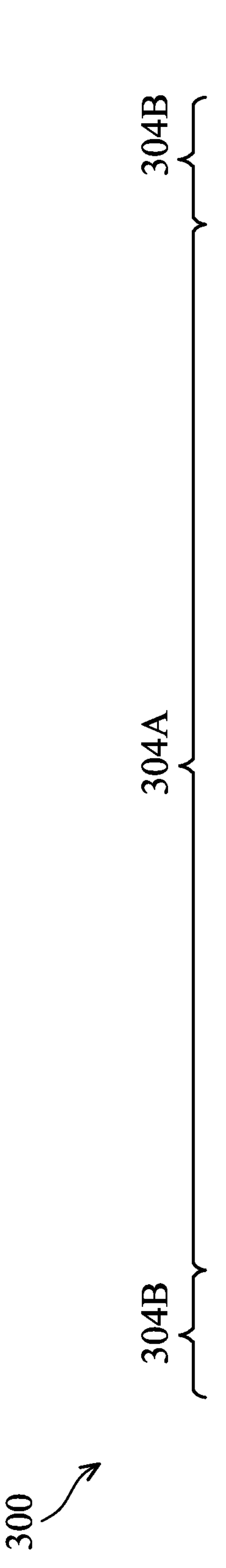
Figure 28:
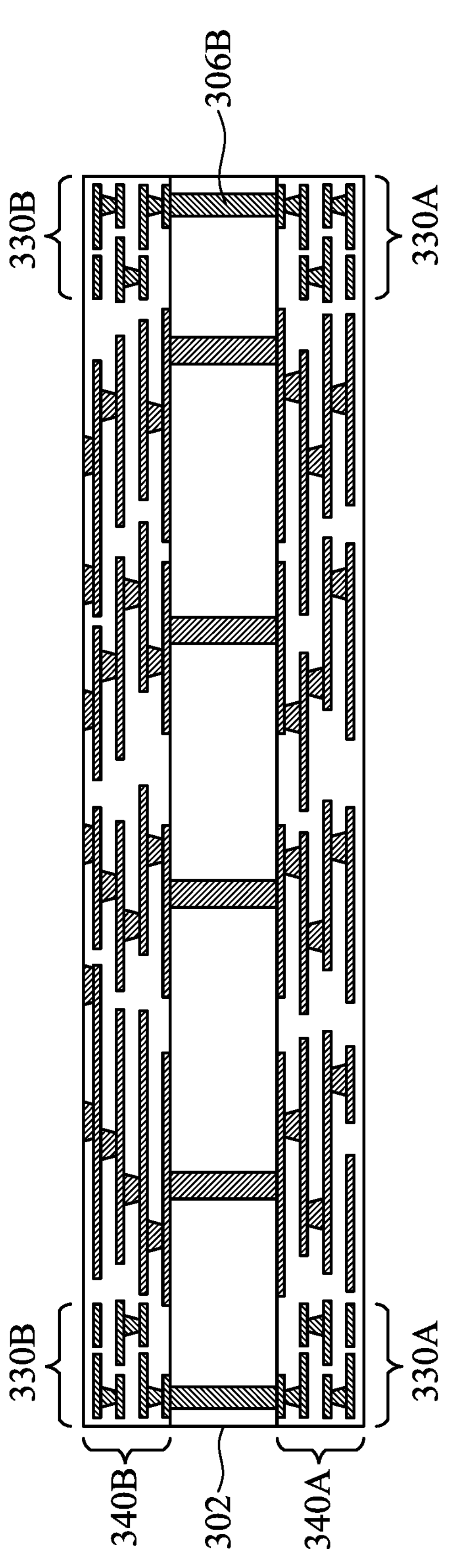

In FIG. 28, a routing structure 340B is formed on an opposite side of the package substrate 300 from the routing structure 340A. The routing structure 340B may be formed using similar methods and of similar materials as the routing structure 340A as described above with respect to FIGS. 25-27A. Each of the routing structures 340A or 340B may have any suitable number of dielectric layers or routing patterns, including more or fewer than shown in FIG. 28. In some embodiments, one or both of routing structures 340A or 340B may be omitted.

The routing structure 340B also includes spiral routing stacks 330B formed over spiral routing stacks 330A of the routing structure 340A on an opposite side of the substrate core 302. In some embodiments, the spiral routing stacks 330B in the routing structure 340B are coupled to the spiral routing stacks 330A in the routing structure 340A by respective through vias 306B extending through the substrate core 302.

Figure 29:
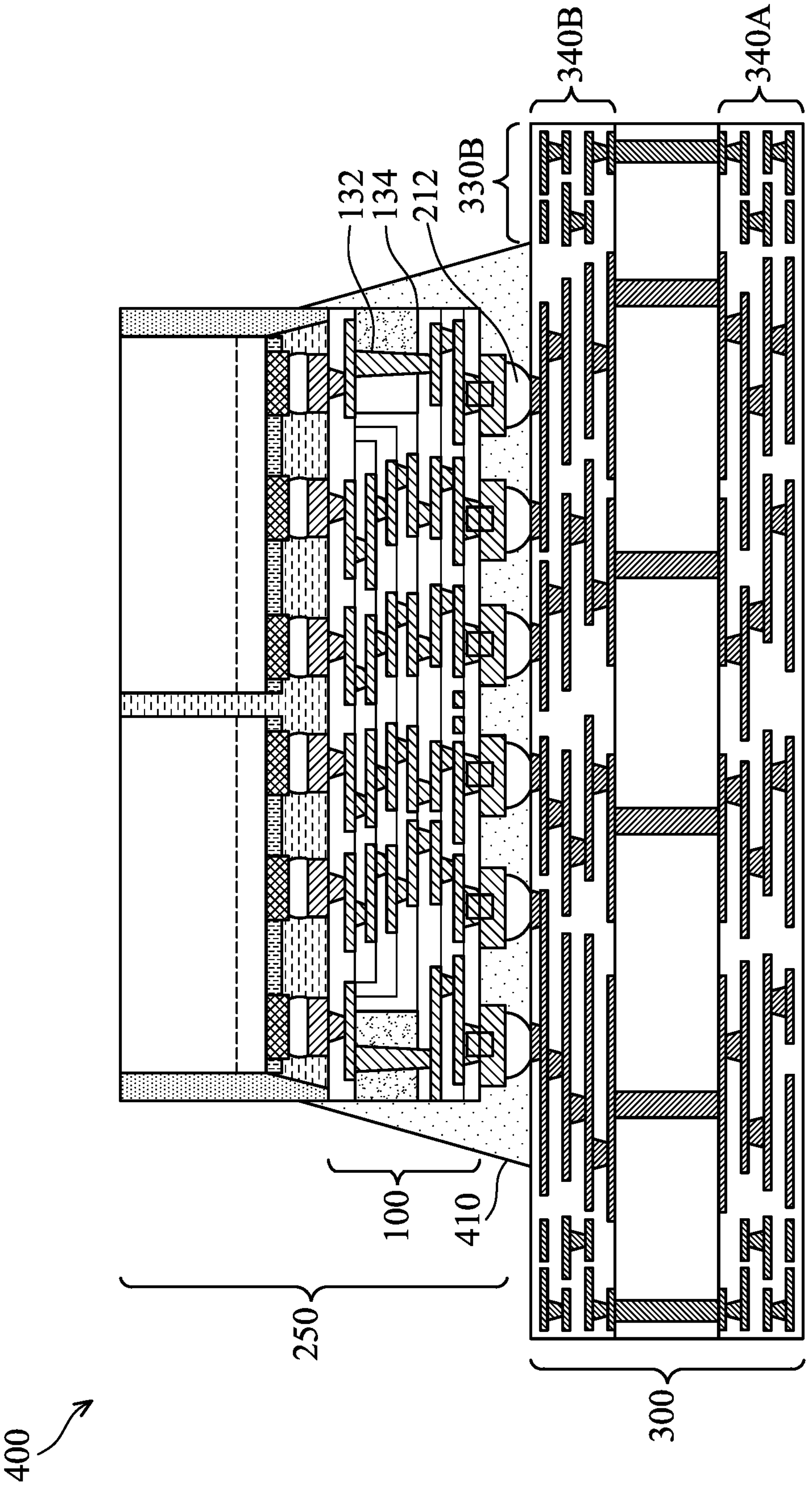
FIGS. 29 and 30 are cross-sectional views of an integrated circuit package, in accordance with some embodiments.

In FIG. 29, a first integrated circuit package 400 is formed by mounting a first package component 250 (see above, FIG. 23) on a package substrate 300 (see above, FIG. 28). In the illustrated embodiment of FIG. 29, the first package component 250 comprises an interposer 100 having direct vias 132 extending through a dielectric layer 134, and the package substrate 300 comprises spiral routing stacks 330A and 330B in a peripheral region of a routing structure 340B. Conductive connectors 212 are coupled to conductive features of the routing structure 340B. In some embodiments, an underfill material 410 is formed between the interposer 100 and the package substrate 300. In some embodiments, the underfill material 410 comprises a liquid epoxy that is dispensed in a gap between integrated circuit dies 50 and the package substrate 300, e.g., using a dispensing needle or other suitable dispensing tool, and then cured to harden. As illustrated in FIG. 29, the underfill material 410 fills the gap between the interposer 100 and the package substrate 300.

Figure 30:
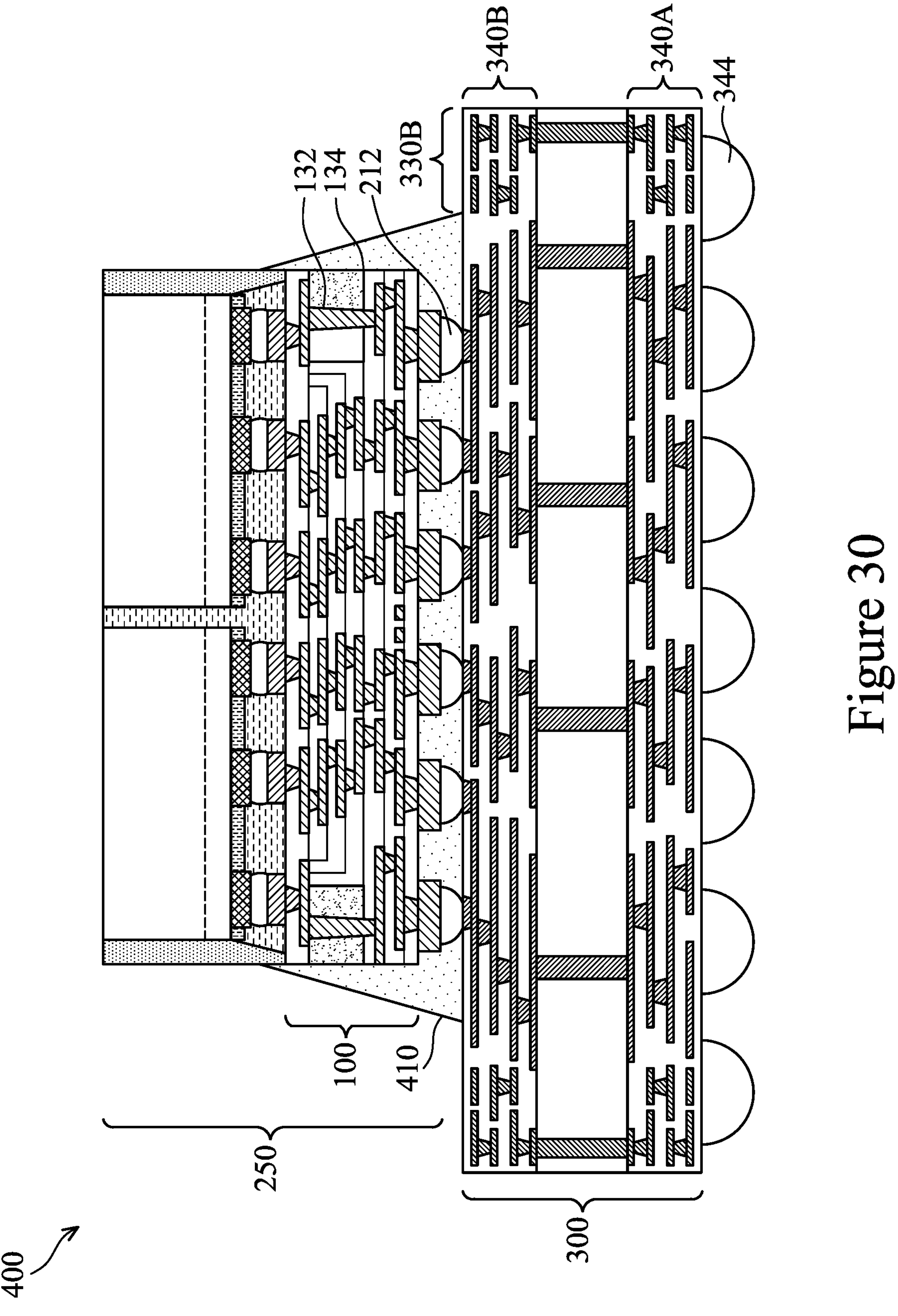

In FIG. 30, external connectors 344 such as solder bumps are formed on one or both of the routing structures 340A or 340B on a bottom surface of the first integrated circuit package 400. The external connectors may, for example, be similar to conductive connectors 212, as described above with respect to FIG. 19.

Figure 31A:
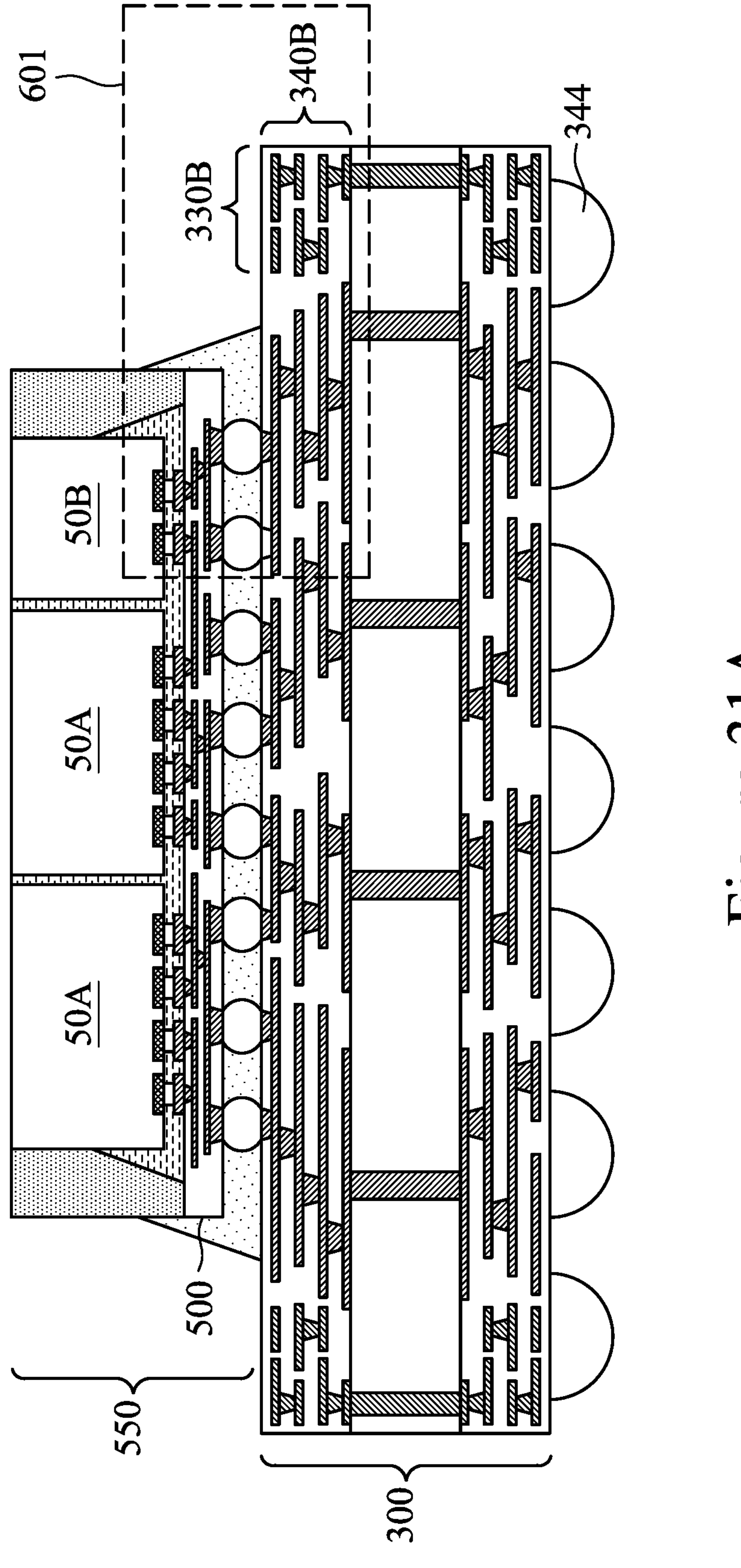
FIGS. 31A-31C are views of another integrated circuit package, in accordance with some embodiments.
Figure 31B:
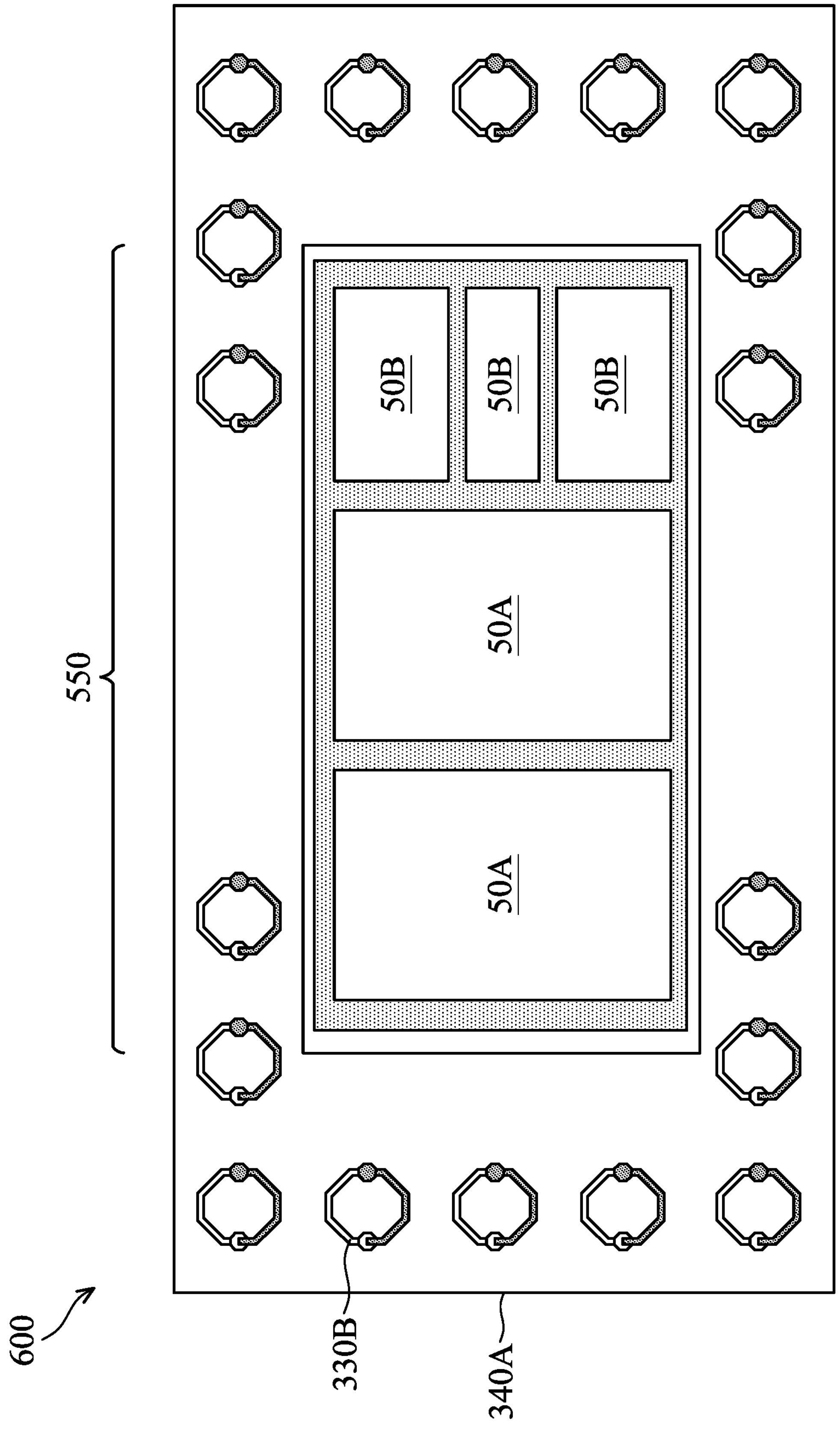
Figure 31C:
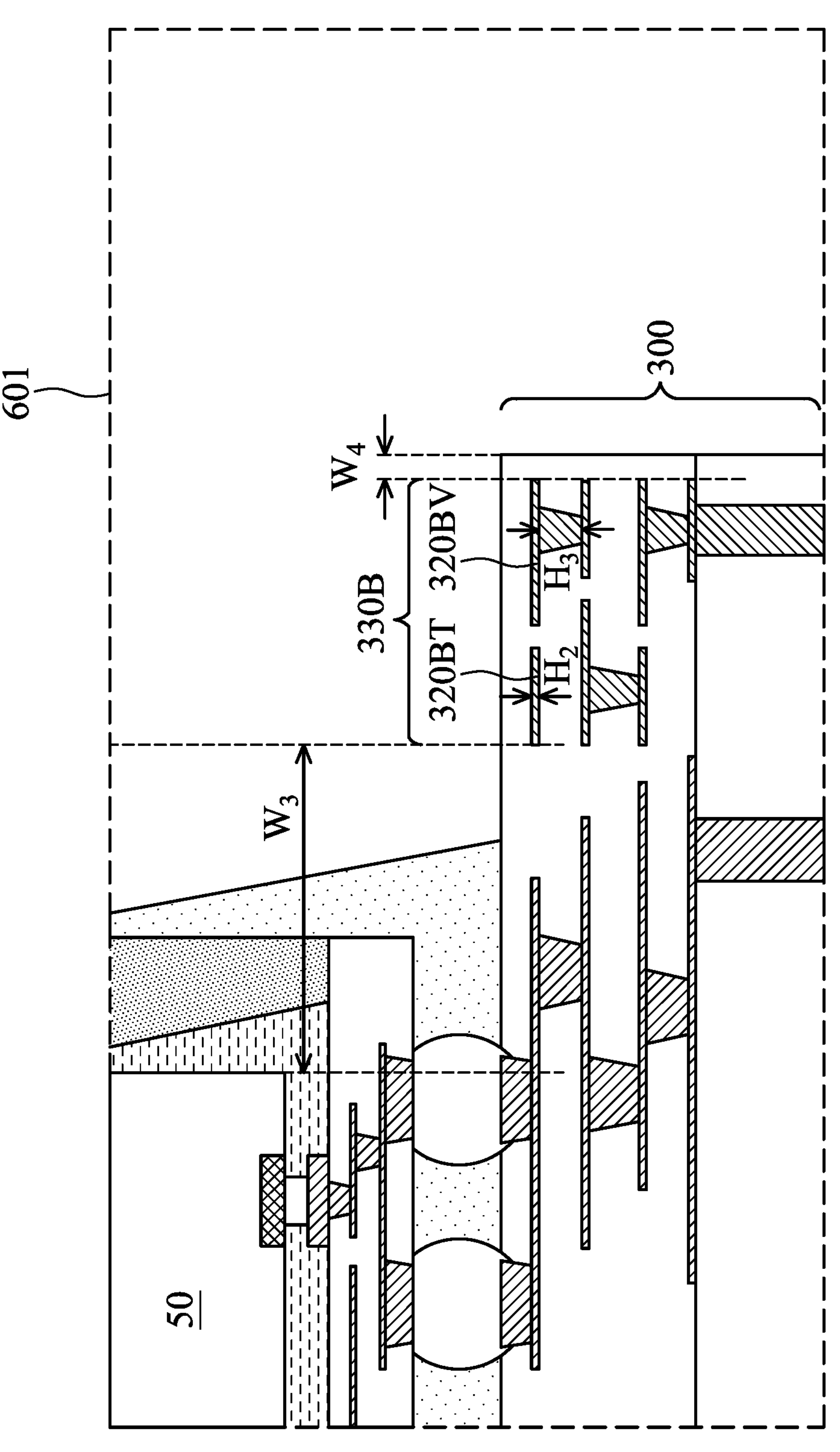

FIGS. 31A-C illustrate a second integrated circuit package 600, in accordance with some embodiments. FIG. 31A illustrates a cross-sectional view of the second integrated circuit package 600, FIG. 31B illustrates a top-down view of the second integrated circuit package 600, and FIG. 31C illustrates a detailed view of region 601 as illustrated in FIG. 31A. The second integrated circuit package 600 is formed by mounting a second package component 550 on a package substrate 300 (see above, FIG. 28). The second package component 550 may be attached to the package substrate 300 by similar methods and using similar materials as described above for the attachment of the first package component 250 to the package substrate 300 (see above, FIG. 29).

In the illustrated embodiment of FIG. 31A, the package substrate 300 comprises spiral routing stacks 330B in a peripheral region of a routing structure 340B, and the second package component 550 comprises an interposer 500 with one or more of first integrated circuit dies 50A and one or more of second integrated circuit dies 50B attached to the interposer 500. In some embodiments, the first integrated circuit dies 50A are logic devices, such as a CPU, GPU, or the like, and the second integrated circuit dies 50B are I/O devices and/or memory devices, such as DRAM dies, HMC modules, HBM modules, or the like.

In some embodiments, the second package component 550 is formed using similar materials and with similar methods as the first package component 250, as described above with respect to FIGS. 2-23, except that the interposer 500 is free of direct vias 132 (see FIG. 23). In some embodiments, the interposer 500 is a silicon interposer (e.g., a wafer) or an organic interposer comprising an interconnect structure over a semiconductor substrate. In some embodiments, the interposer 500 comprises one or more local silicon interconnect (LSI) dies over a redistribution structure, where each LSI die couples two or more of the first integrated circuit dies 50A and/or the second integrated circuit dies 50B.

FIG. 31B illustrates a top-down view of the second integrated circuit package 600. Although two of the first integrated circuit dies 50A and three of the second integrated circuit dies 50B are illustrated in FIG. 31B, it should be appreciated that any number of each type of the integrated circuit dies 50 may be attached to the interposer 500 to form the second package component 550. Spiral routing stacks 330B are distributed around the second package component 550 in a peripheral region of the routing structure 340A. In the illustrated embodiment, the spiral routing stacks 330B are distributed around all four sides of the second package component 550, with gaps in the distribution in the centers of the longitudinal sides of the second package component 550. In some embodiments, the spiral routing stacks 330B are distributed evenly around all four sides of the second package component 550. In still other embodiments, the spiral routing stacks 330B are distributed along just one, two, or three sides of the second package component 550. However, any suitable arrangement of the spiral routing stacks 330B around the second package component 550 may be used.

FIG. 31C illustrates a detailed cross-sectional view of region 601 as illustrated above in FIG. 31A. A spiral routing stack 330B comprises a top trace portion 320BT and a top via portion 320BV. In some embodiments, the top trace portion 320BT has a second height $H_2$ in a range of 1 μm to 30 μm, the top via portion 320BV has a third height $H_3$ in a range of 1 μm to 300 μm, and a ratio of the second height $H_2$ to the third height $H_3$ is in a range of 0.1 to 1. In some embodiments, other trace and via portions of the spiral routing stack 330B have heights in the same ranges as the second height $H_2$ and the third height $H_3$. In some embodiments, the spiral routing stack 330B is separated from a closest integrated circuit die 50 by a third width $W_3$ in a range of 100 μm to 5000 μm, and the spiral routing stack 330B is separated from a closest outer sidewall of the interconnect structure by a fourth width $W_4$ greater than or equal to 500 μm.

Figure 32:
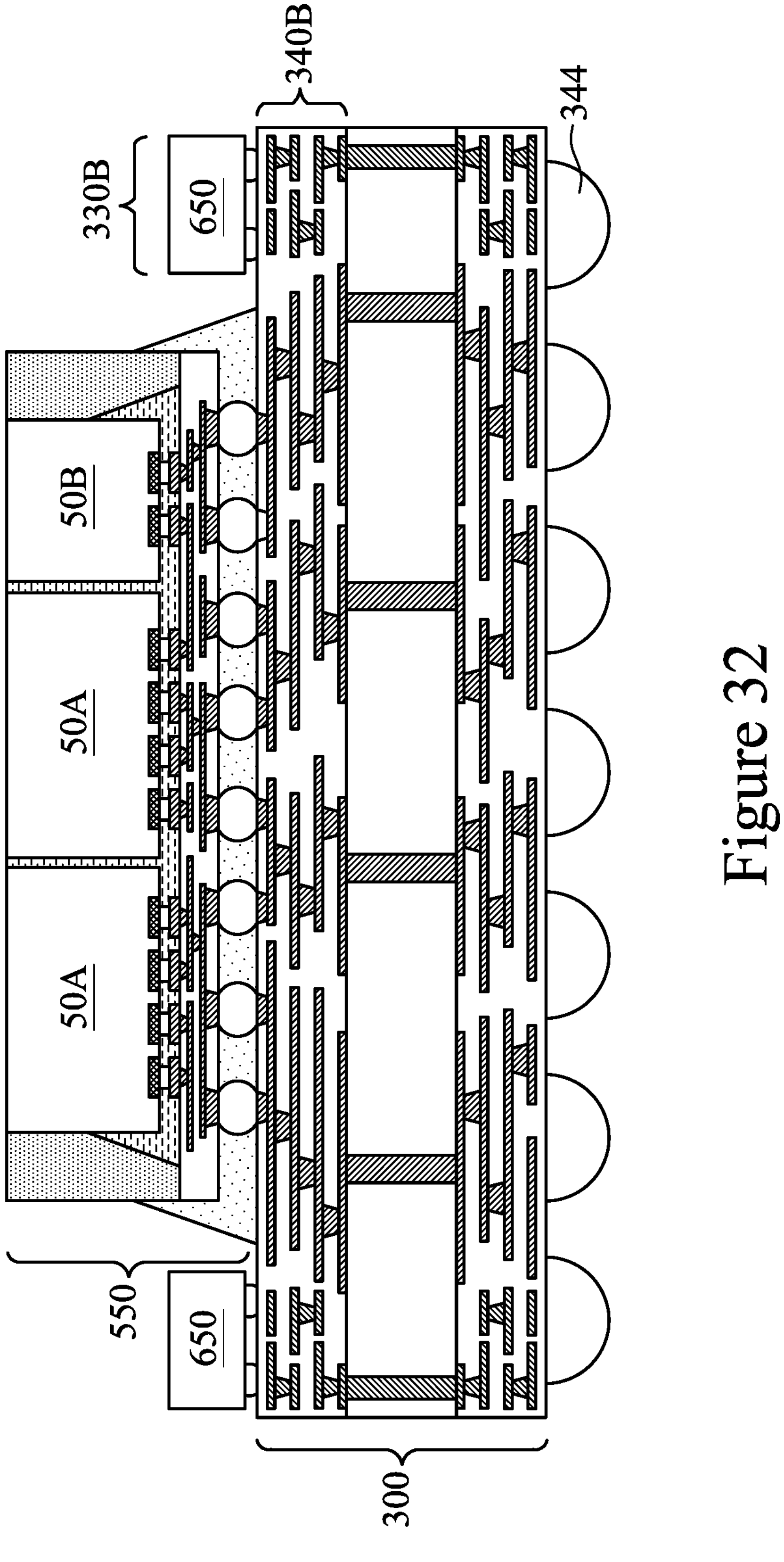
FIG. 32 is a cross-sectional view of another integrated circuit package, in accordance with some embodiments.

FIG. 32 illustrates the second integrated circuit package 600 with surface-mounted devices (SMDs) 650 or integrated passive devices attached to the package substrate 300, in accordance with some embodiments. The SMDs 650 may be capacitor dies, inductor dies, resistor dies, the like, or a combination thereof. In some embodiments, the SMDs 650 are coupled to respective underlying spiral routing stacks 330B. This may form harmonic circuits to, e.g., enhance signals, such as for high frequency applications. It should be appreciated that the SMDs 650 may also be attached to the package substrate 300 of the first integrated circuit package 400 (see FIG. 30).

Figure 33A:
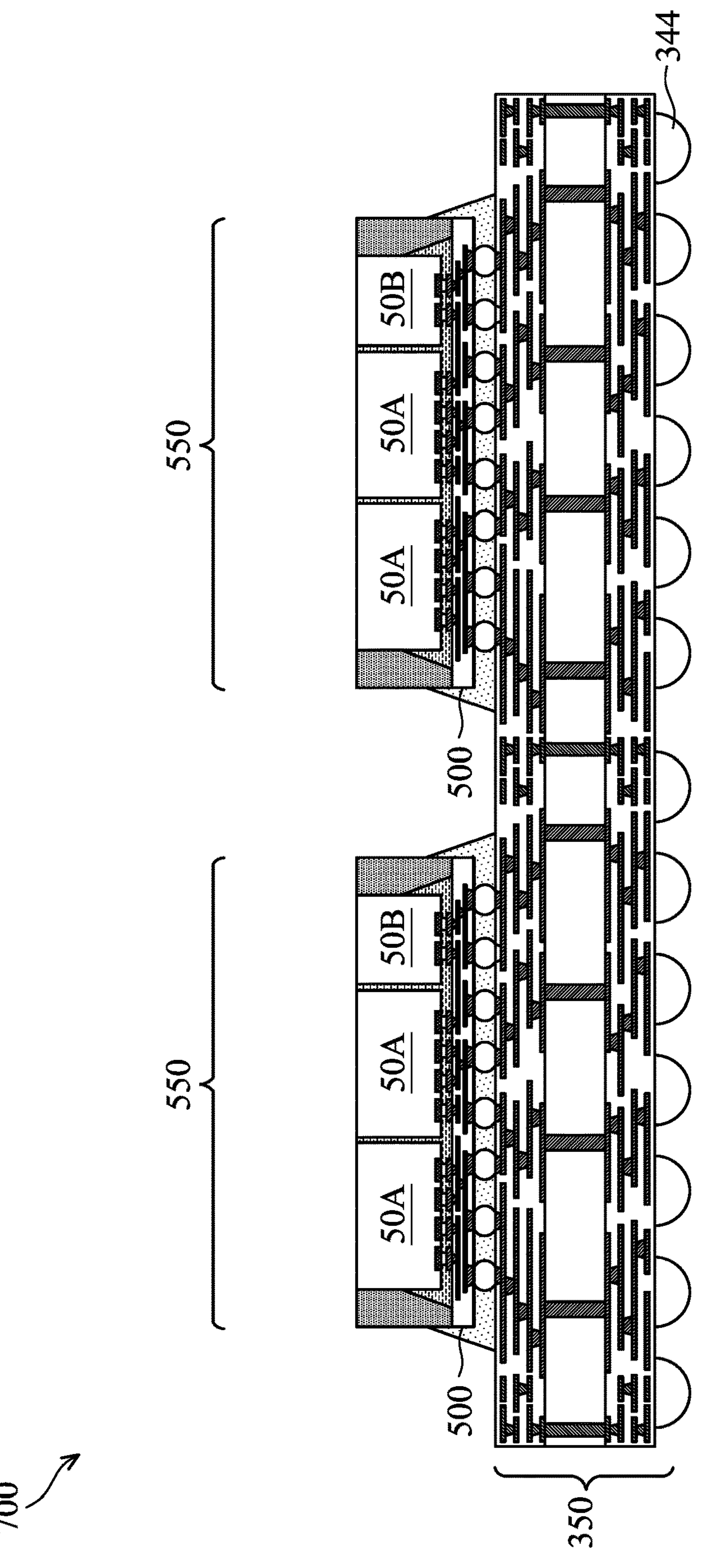
FIGS. 33A and 33B are views of another integrated circuit package, in accordance with some embodiments.
Figure 33B:
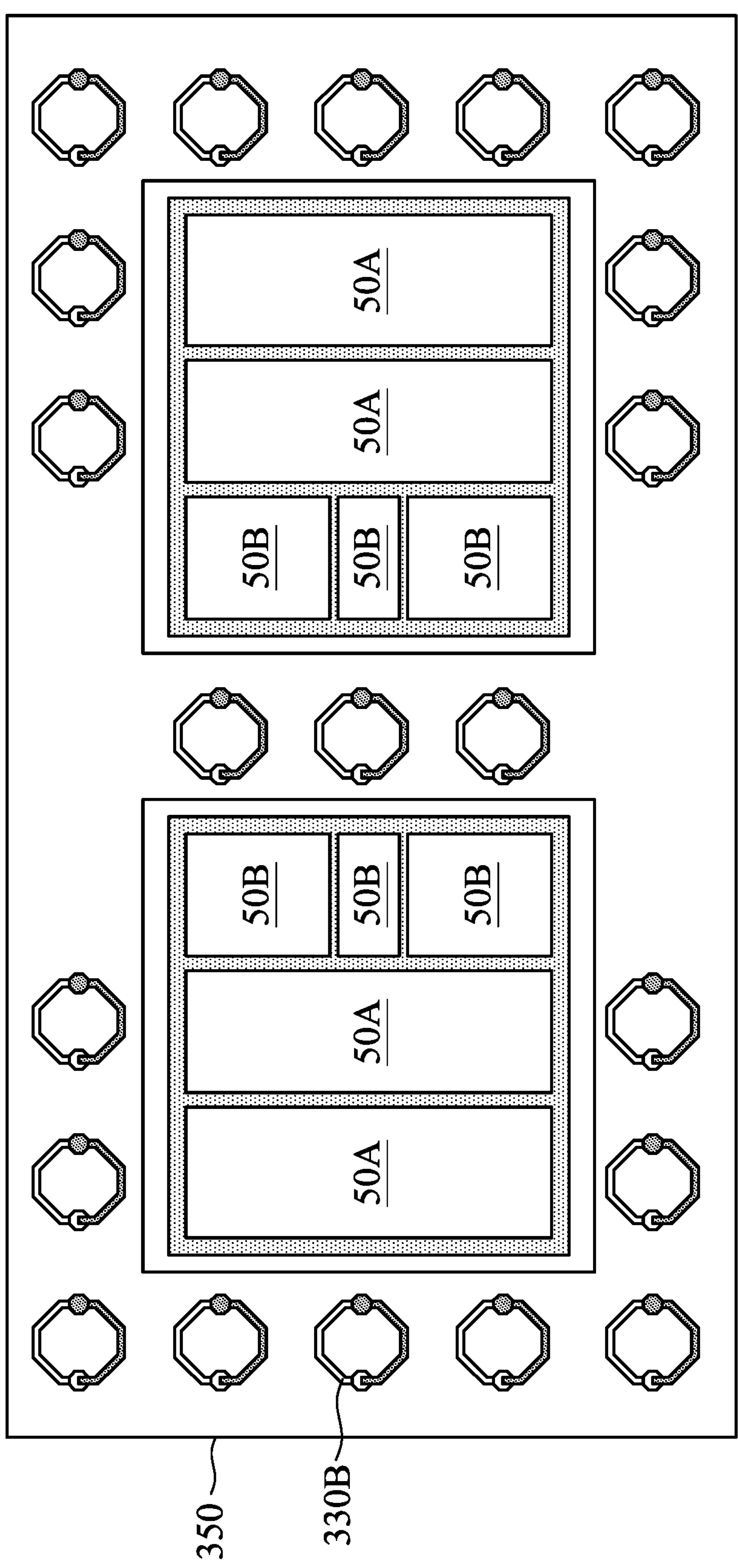

FIGS. 33A and 33B illustrate a third integrated circuit package 700 (also referred to as a multi-chip module), in accordance with some embodiments. FIG. 33A illustrates a cross-sectional view of the third integrated circuit package 700 and FIG. 33B illustrates a top-down view of the third integrated circuit package 700. The illustrated embodiment of FIGS. 33A and 33B includes two second package components 550 mounted on a package substrate 300. Spiral routing stacks 330B are distributed in a peripheral region of the package substrate 300 around the two second package components 550. In this embodiment, the spiral routing stacks 330B are further distributed between the second package components 550, such as along a midline of a top surface of the package substrate 300. As such, one or more spiral routing stack(s) 330B are disposed between respective interposers 500 of the second package components 550.

FIGS. 34 through 40 are views of intermediate stages in the manufacturing of interposers 800, in accordance with some embodiments. The interposers 800 are similar to the interposers 100 (see above, FIGS. 2-13) but include direct vias with different heights in the same interposer 800.

Figure 34:
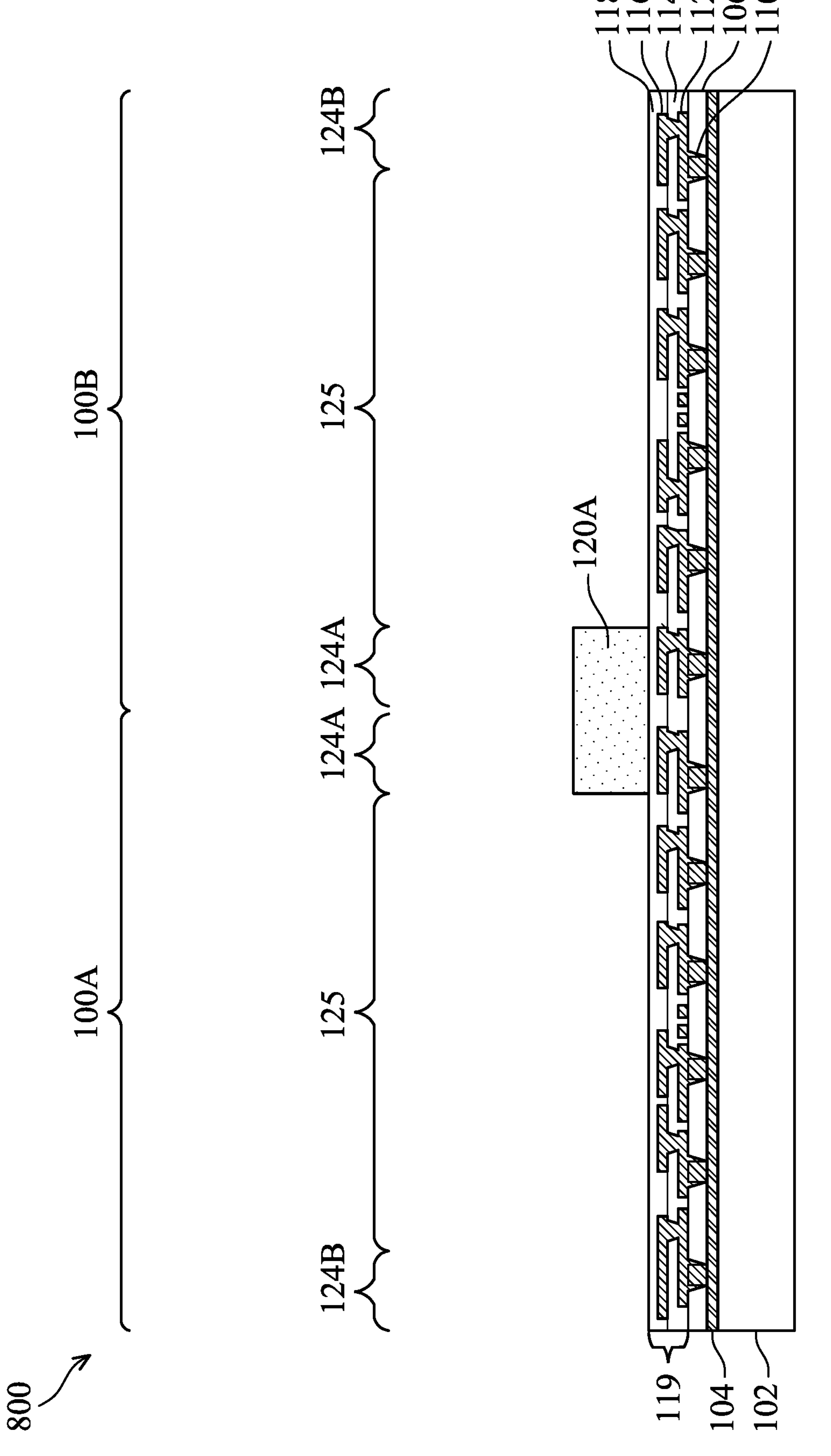
FIGS. 34-40 are cross-sectional views of intermediate stages in the manufacturing of package components, in accordance with some embodiments.

In FIG. 34, a mask 120A is formed over the dielectric layer 118 in respective periphery regions 124A of the first package region 100A and the second package region 100B so that one or more subsequently formed middle redistribution layer(s) of the interposers 100 will not be formed in the periphery regions 124A but will be formed in periphery regions 124B and central regions 125. Each central region 125 is surrounded by periphery regions 124A and 124B. The mask 120A may be formed and patterned using similar materials and by similar methods as the mask 120 as described above with respect to FIGS. 7A and 7B.

Figure 35:
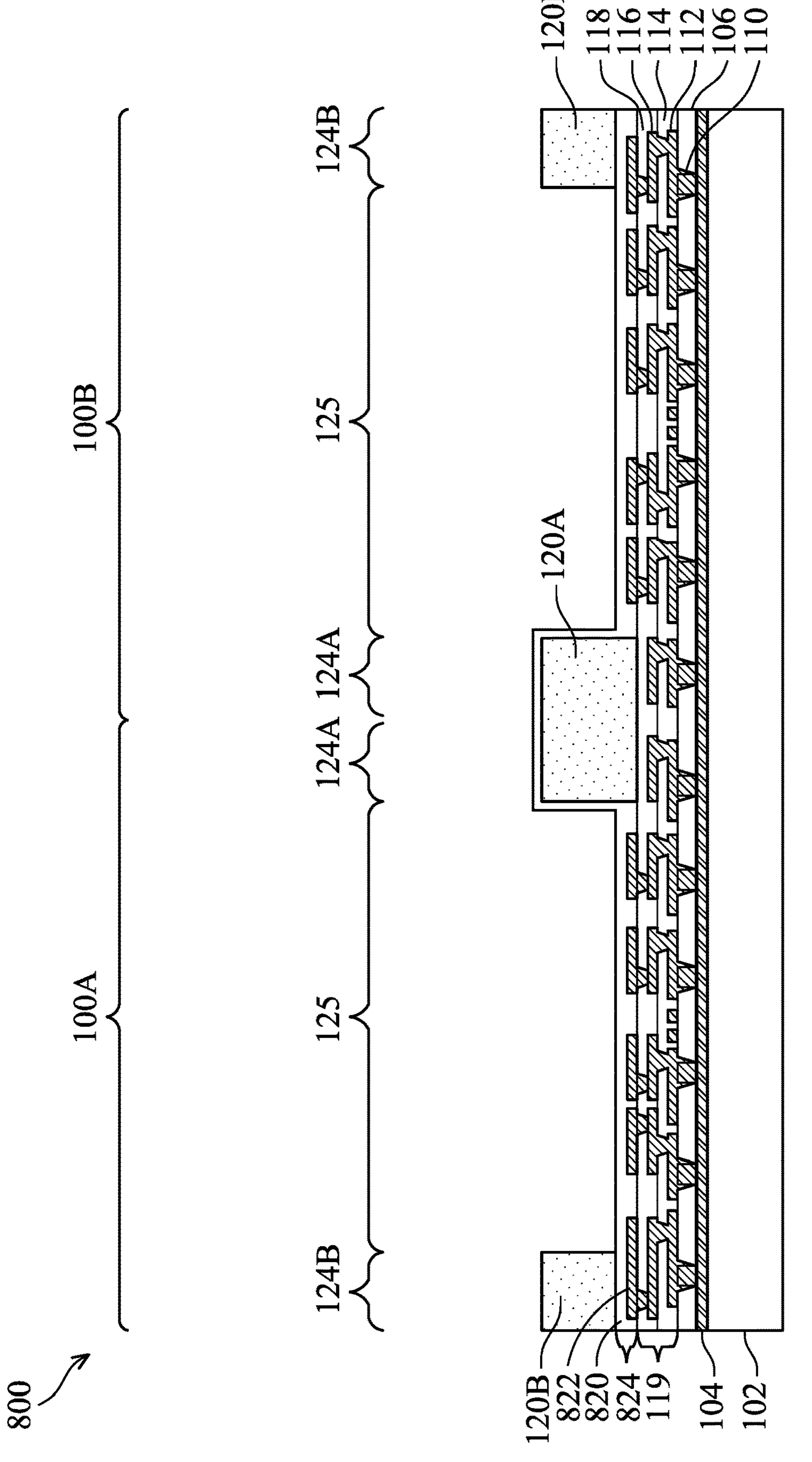

In FIG. 35, a middle redistribution layer 824 including a metallization pattern 822 and a dielectric layer 820 is formed over the dielectric layer 118 in areas not covered by the mask 120A, e.g., in the central region 125 and the periphery regions 124A. The metallization pattern 822 and the dielectric layer 820 may be formed and patterned using similar materials and by similar methods as he metallization pattern 112 and the dielectric layer 114, as described above with respect to FIGS. 5-6. The dielectric layer 820 may be formed over the mask 120A in the periphery regions 124A, and the metallization pattern 822 may be formed in the central regions 125. Although the illustrated example of FIG. 36 shows the formation of one middle redistribution layer 824, any suitable number of middle redistribution layers 824 may be formed.

Subsequently, a mask 120B is formed over the dielectric layer 820 in respective periphery regions 124B of the first package region 100A and the second package region 100B, so that one or more subsequently formed redistribution layer(s) of the interposers 100 will not be formed in the periphery regions 124B or 124A.

Figure 36:
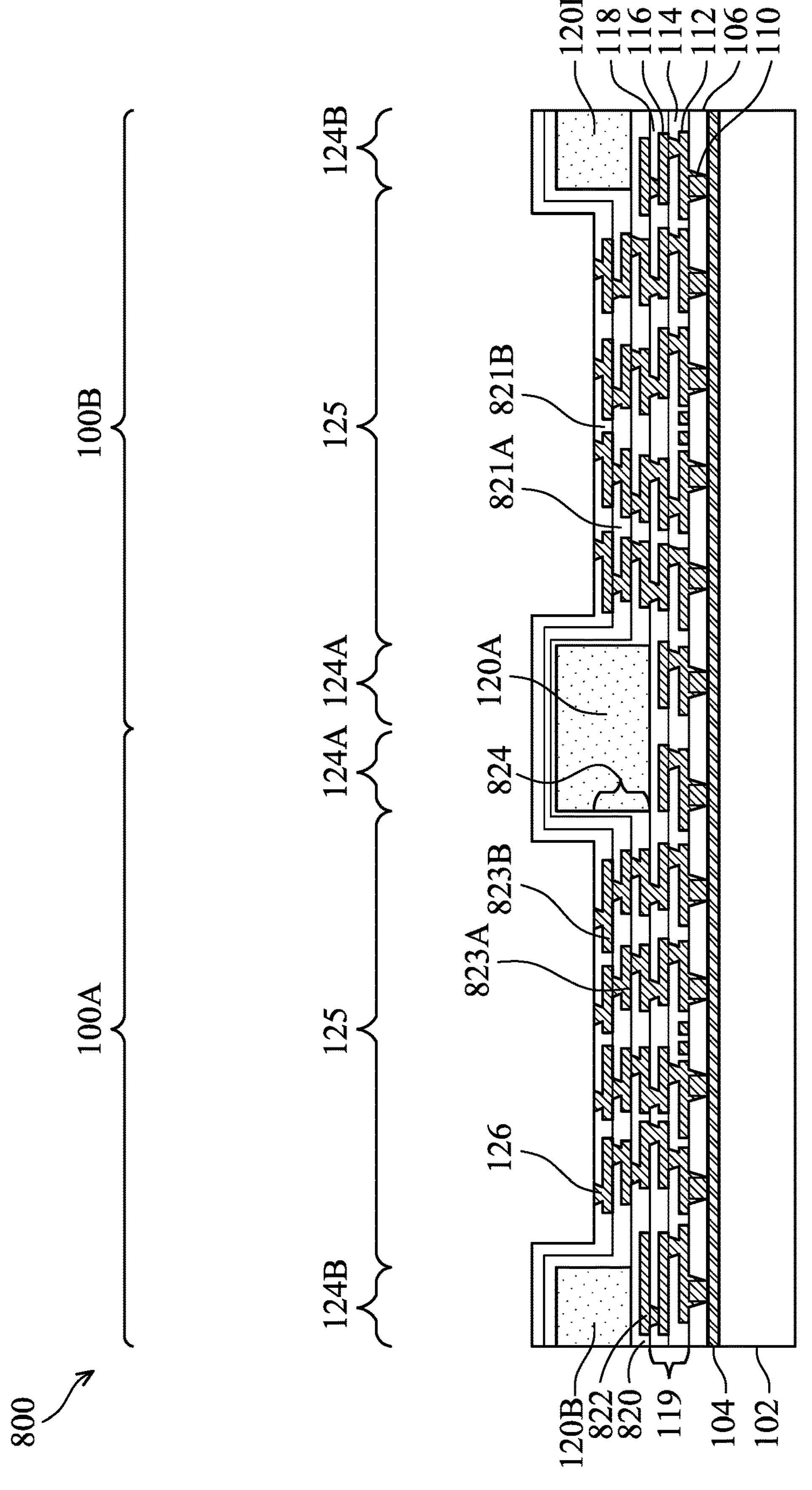

In FIG. 36, additional middle redistribution layers 824 are formed in respective central regions of the first package region 100A and the second package region 100B. Each redistribution layer of the additional middle redistribution layers 824 includes a respective metallization pattern (e.g., metallization patterns 823A and 823B) and a respective dielectric layer (e.g., dielectric layers 821A and 821B), which may each be formed of similar materials and by similar methods as the metallization pattern 112 and the dielectric layer 114, as described above with respect to FIGS. 5-6. The dielectric layers 821A and 821B may be formed over the dielectric layer 820 and the metallization pattern 822 in the central region 125, over the mask 120A in the periphery regions 124A, and over the mask 120B in the periphery regions 124B. The metallization patterns 823A and 823B may be formed in the central regions 125.

In the illustrated example of FIG. 36, the additional middle redistribution layers 824 include two redistribution layers, each comprising respective metallization patterns 823A and 823B and respective dielectric layers 821A and 821B. However, the additional redistribution layers 824 may include any suitable number of redistribution layers, such as two to ten redistribution layers.

Next, conductive vias 126 are formed through a top dielectric layer 821B of the middle redistribution layers 824 to make physical and electrical contact with top conductive features (e.g., conductive lines of a top metallization pattern 823B) of the middle redistribution layers 824. The conductive vias 126 may be formed using similar materials and by similar methods as described above with respect to FIGS. 8A and 8B.

Figure 37:
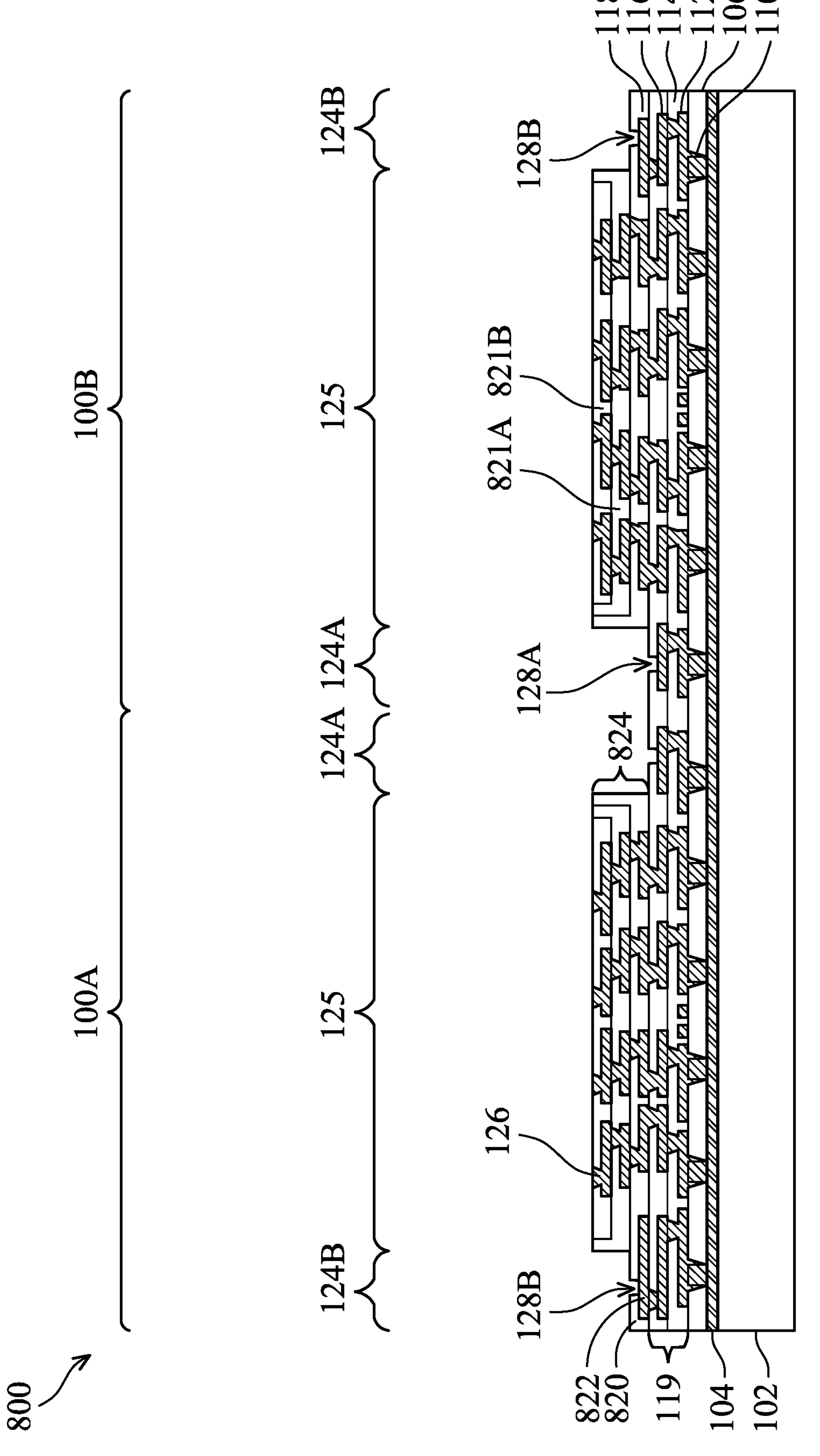

In FIG. 37, top portions of the dielectric layers of the middle redistribution layers 824 (e.g., the dielectric layers 820, 821A, and 821B) over the masks 120A and 120B may be removed with a suitable removal process (e.g., a chemical-mechanical polish (CMP), grinding process, or the like) to expose the masks 120A and 120B. Top portions of the masks 120 may be removed in the planarization. The masks 120A and 120B are then removed to expose top surfaces of the dielectric layer 118 in the periphery regions 124A and top surfaces of the dielectric layer 820 in the periphery regions 124B. The masks 120A and 120B may be removed by a suitable process, such as an acceptable ashing or stripping process when the masks 120A and 120B are photoresists, e.g., using an oxygen plasma or the like.

In FIG. 37, openings 128A are formed through the dielectric layer 118 in the periphery region 124A to expose the metallization pattern 116, and openings 128B are formed through the dielectric layer 820 in the periphery region 124B to expose the metallization pattern 822. The openings 128A and 128B may be formed by a similar method as the openings 108, as described above with respect to FIG. 3. However, any suitable method may be used to form the openings 128A and 128B.

Figure 38:
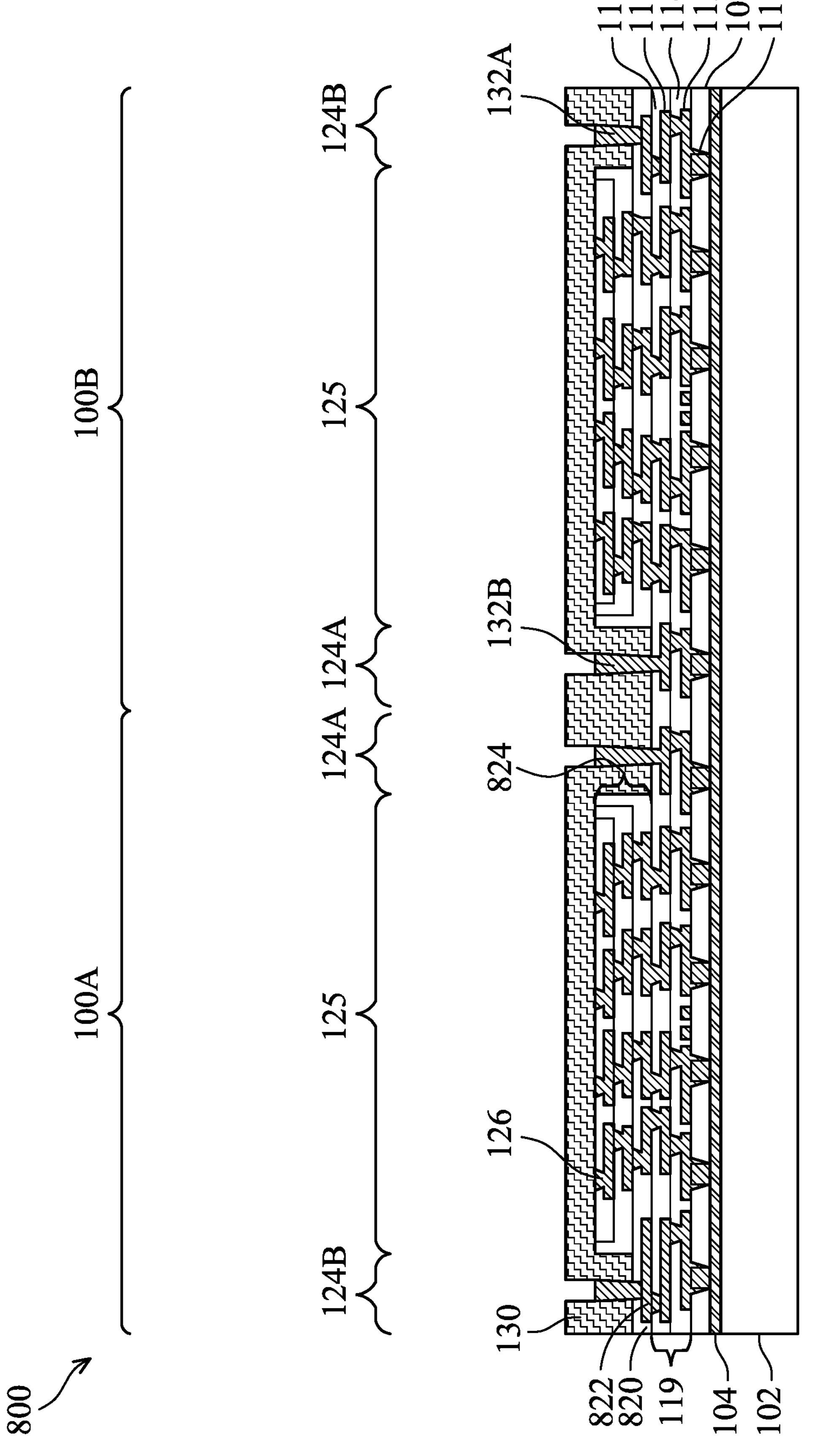

In FIG. 38, direct vias 132A are formed in the openings 128A and direct vias 132B are formed in the openings 128B (see above, FIG. 37). The direct vias 132A and 132B may be formed using similar materials and by similar methods as the direct vias 132 (e.g., by forming and patterning a photoresist 130), as described above with respect to FIG. 10. The photoresist 130 may then be removed by an acceptable ashing or stripping process, such as using an oxygen plasma or the like.

Figure 39:
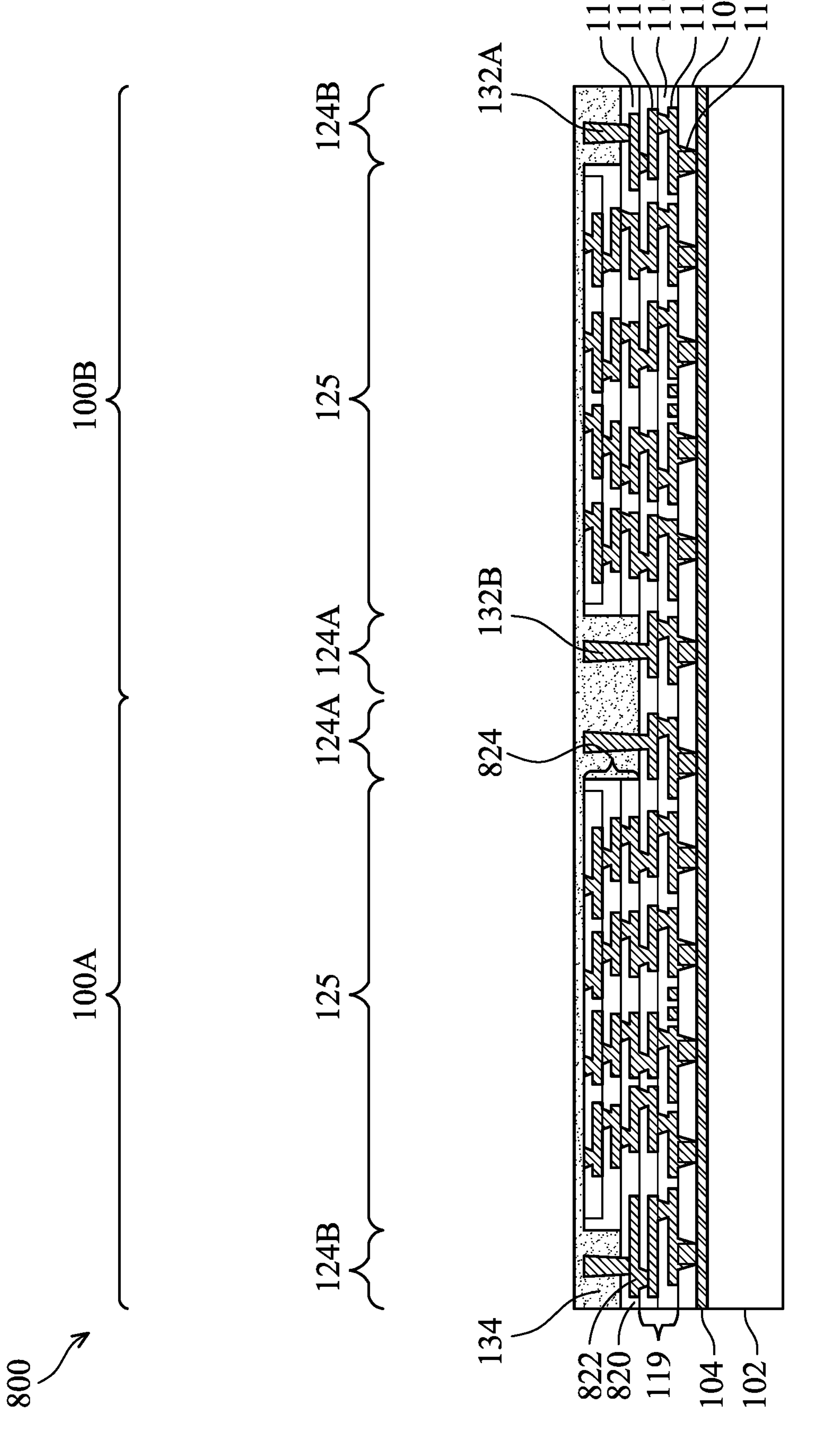

In FIG. 39, a dielectric layer 134 is formed around and over the direct vias 132A and 132B and the middle redistribution layers 824, filling the periphery regions 124A and 124B. The dielectric layer 134 may be formed using similar materials and by similar methods as described above with respect to FIG. 11.

Figure 40:
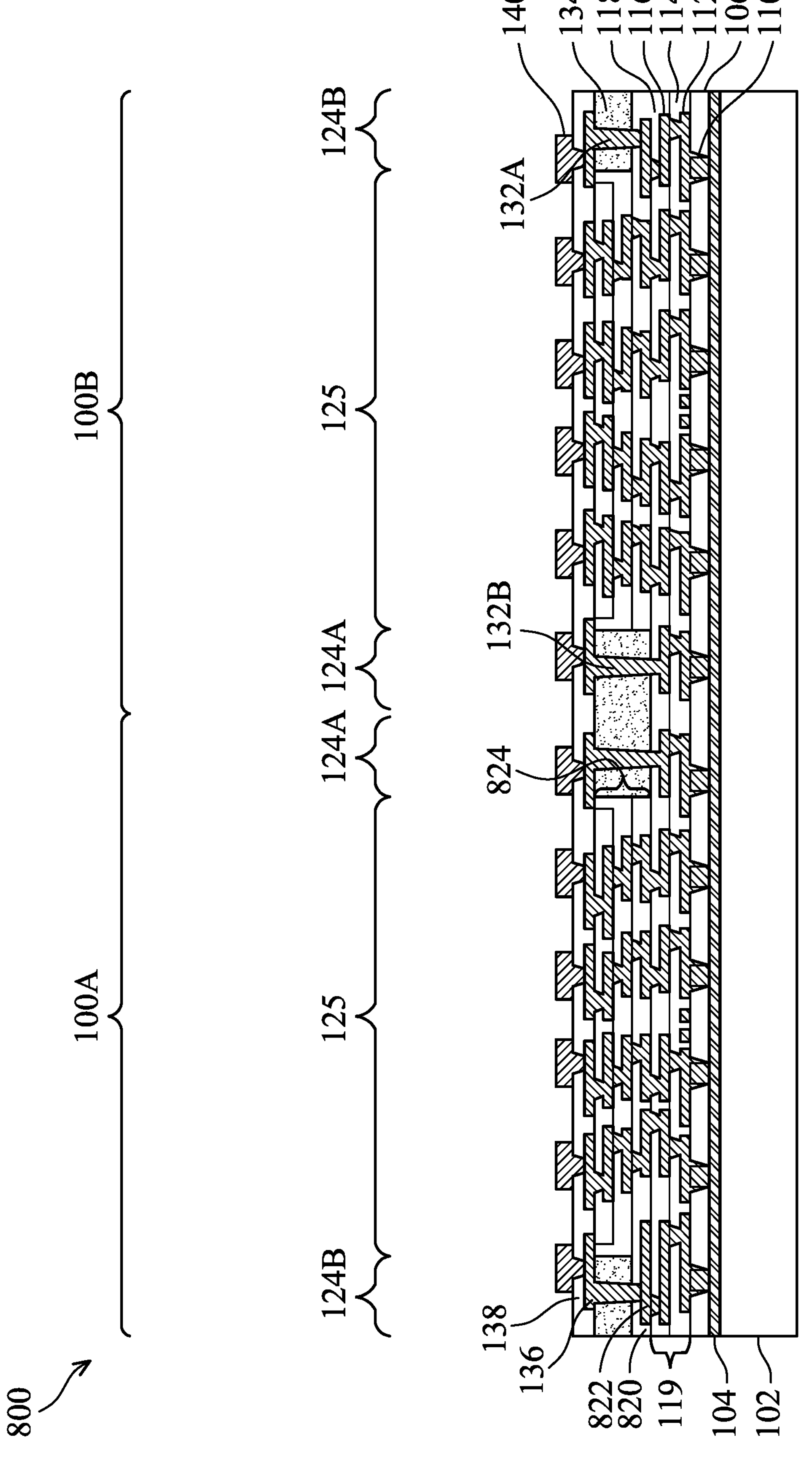

In FIG. 40, a removal process is performed on the dielectric layer 134 to expose the direct vias 132A and 132B and the conductive vias 126, a metallization pattern 136 and a dielectric layer 138 are formed over the direct vias 132A and 132B, additional redistribution layers 824, conductive vias 126, and dielectric layer 134, and under-ball metallizations (UBMs) 140 are formed on the dielectric layer 138. The materials and methods used may be the same as described above with respect to FIGS. 12A-13, and the details are not repeated herein. The resulting interposers 800 comprise direct vias 132A and direct vias 132B having greater heights than the direct vias 132A, due to the direct vias 132A being formed over one or more redistribution layers than the direct vias 132B.

Figure 41:
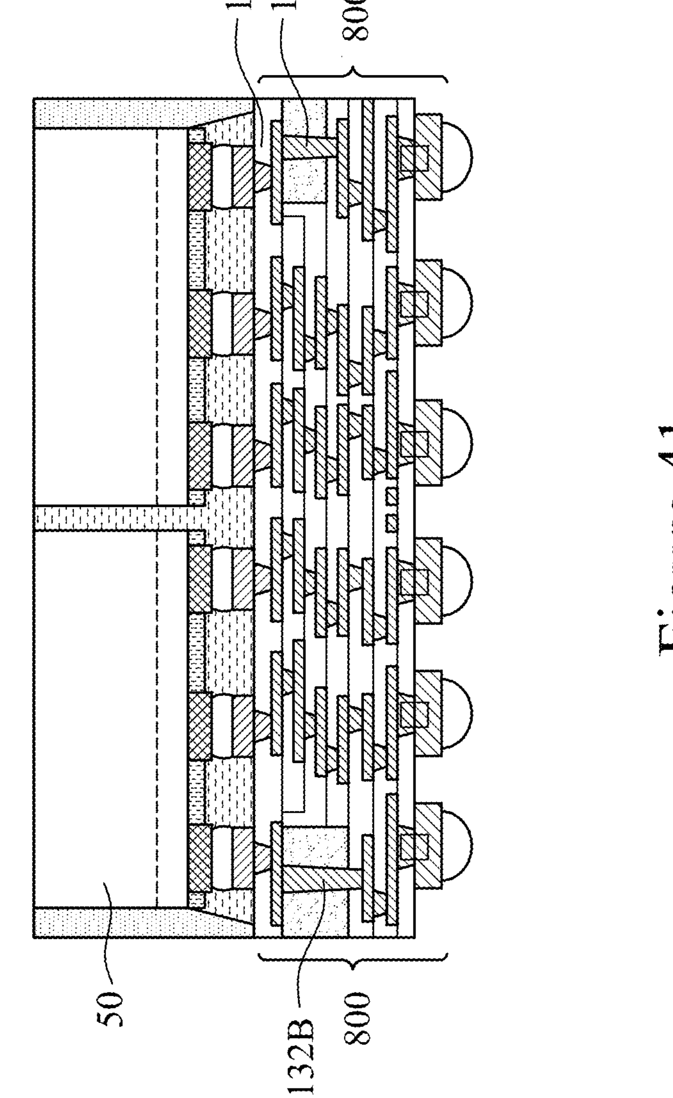
FIG. 41 is a cross-sectional view of another package component, in accordance with some embodiments.

FIG. 41 illustrates a third package component 850 including a singulated interposer 800, in accordance with some embodiments. The third package component 850 may be formed from the structure of FIG. 40 using similar materials and by similar methods as described above with respect to FIGS. 14-23, and the details are not repeated herein. The third package component 850 comprises direct vias 132A and direct vias 132B having greater heights than the direct vias 132A.

Figure 42:
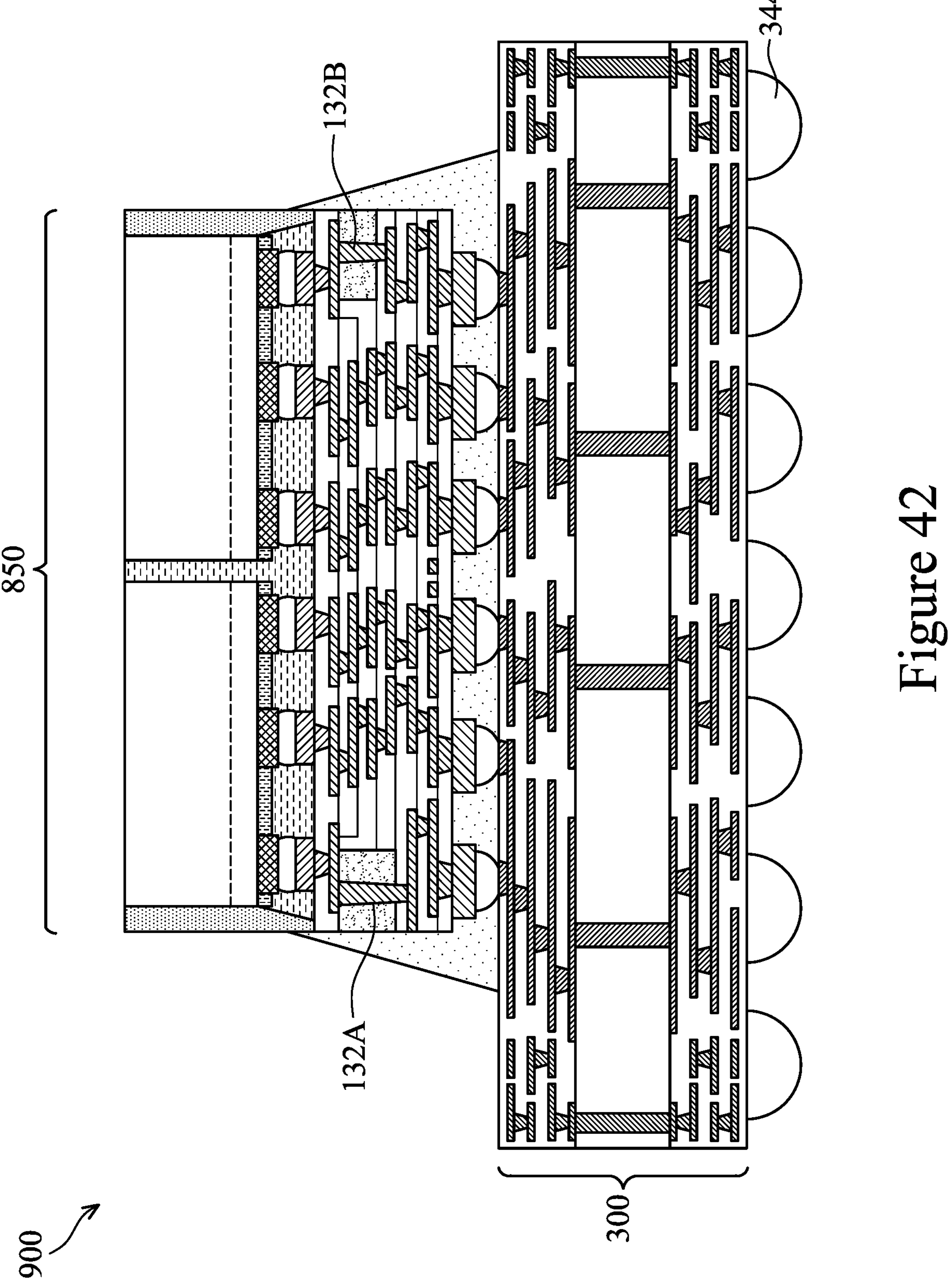
FIG. 42 is a cross-sectional view of another integrated circuit package, in accordance with some embodiments.

FIG. 42 illustrates a fourth integrated circuit package 900, in accordance with some embodiments. The fourth integrated circuit package 900 is formed by mounting a third package component 850 (see above, FIG. 41) on a package substrate 300 (see above, FIG. 29). The third package component 850 may be attached to the package substrate 300 by similar methods and using similar materials as described above for the attachment of the first package component 250 to the package substrate 300 (see above, FIG. 30). The fourth integrated circuit package 900 comprises direct vias 132A and direct vias 132B having greater heights than the direct vias 132A.

Figure 43:
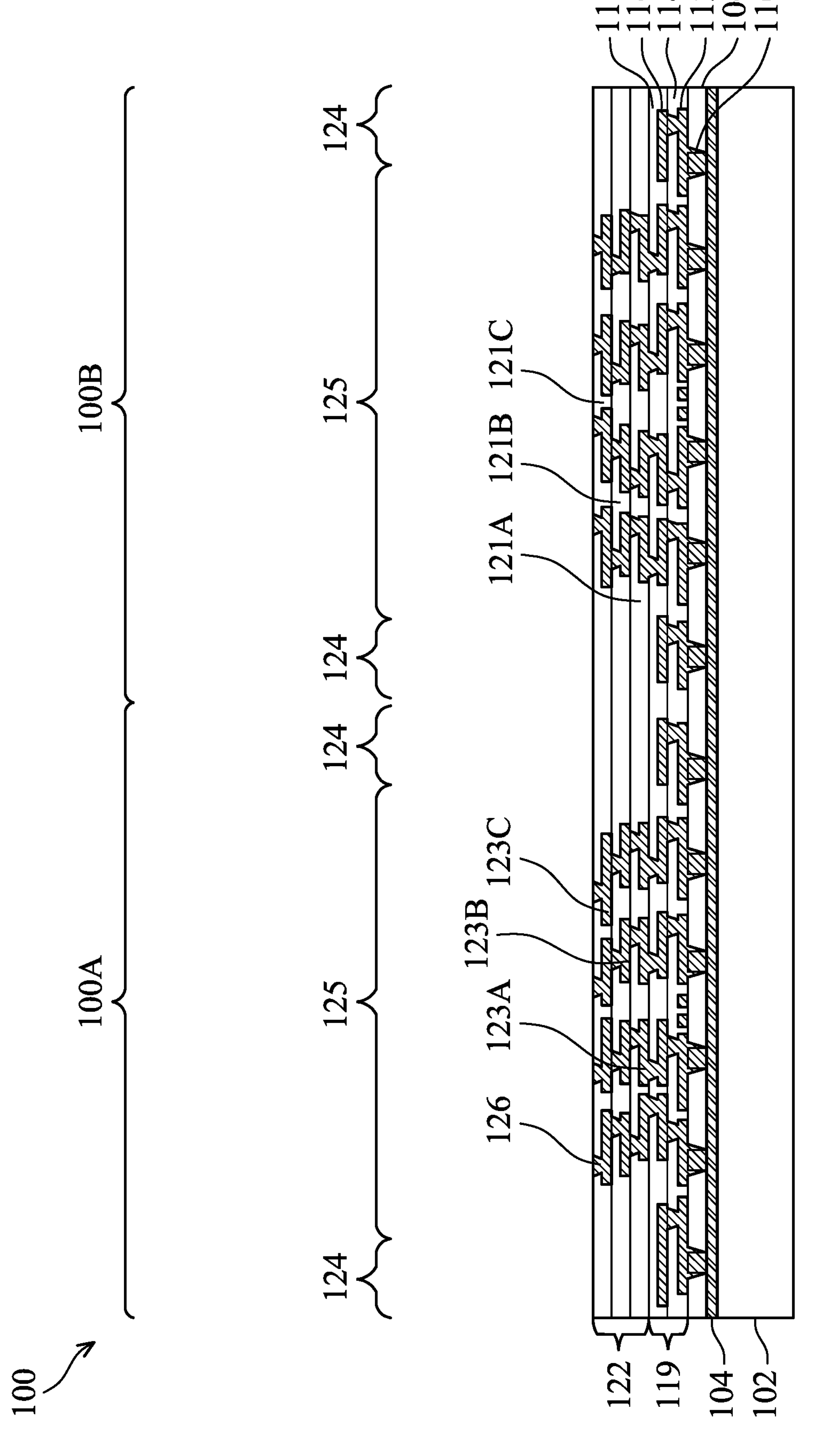
FIGS. 43-45 are cross-sectional views of intermediate stages in the manufacturing of package components, in accordance with some embodiments.
Figure 44:
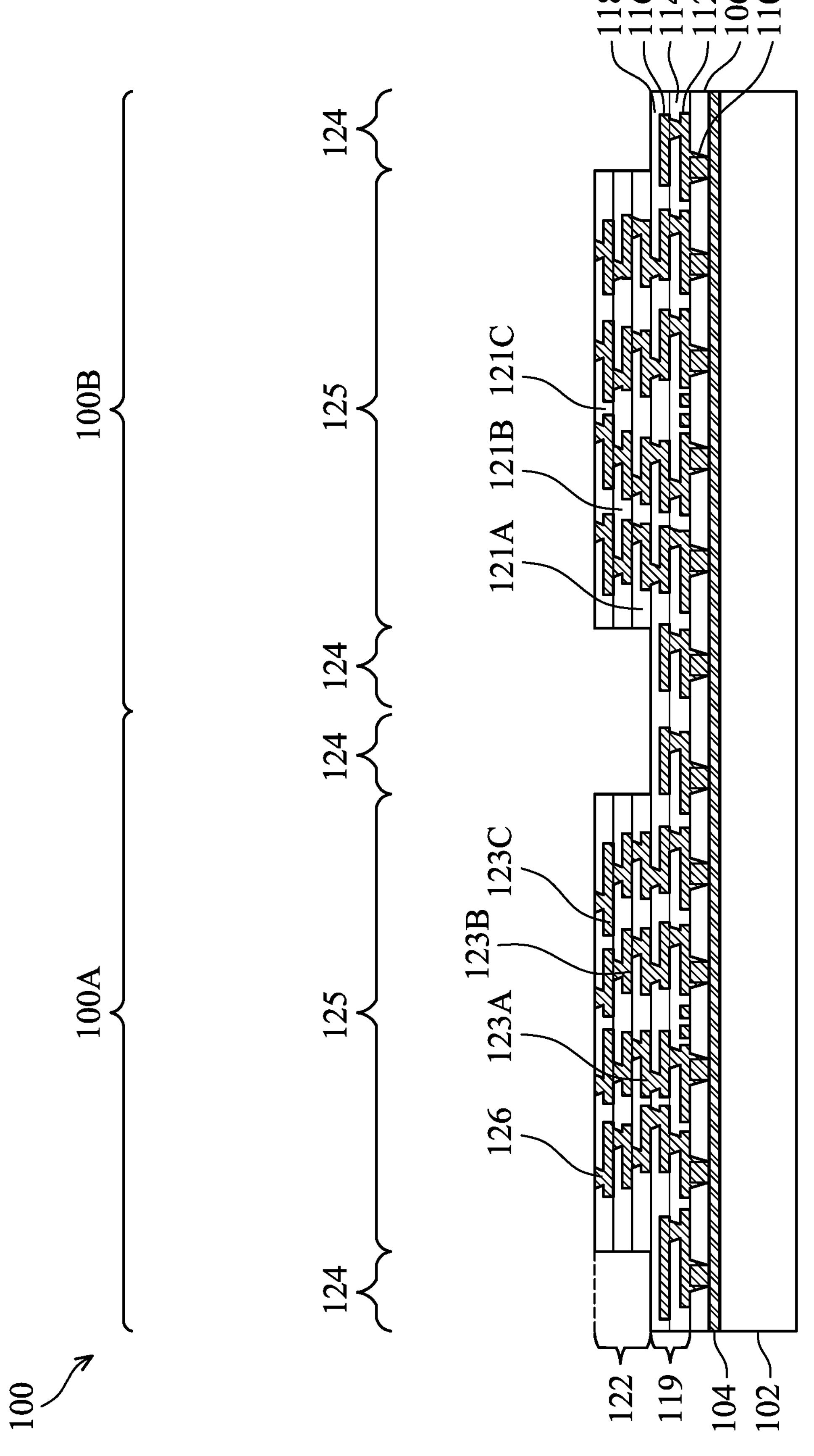
Figure 45:
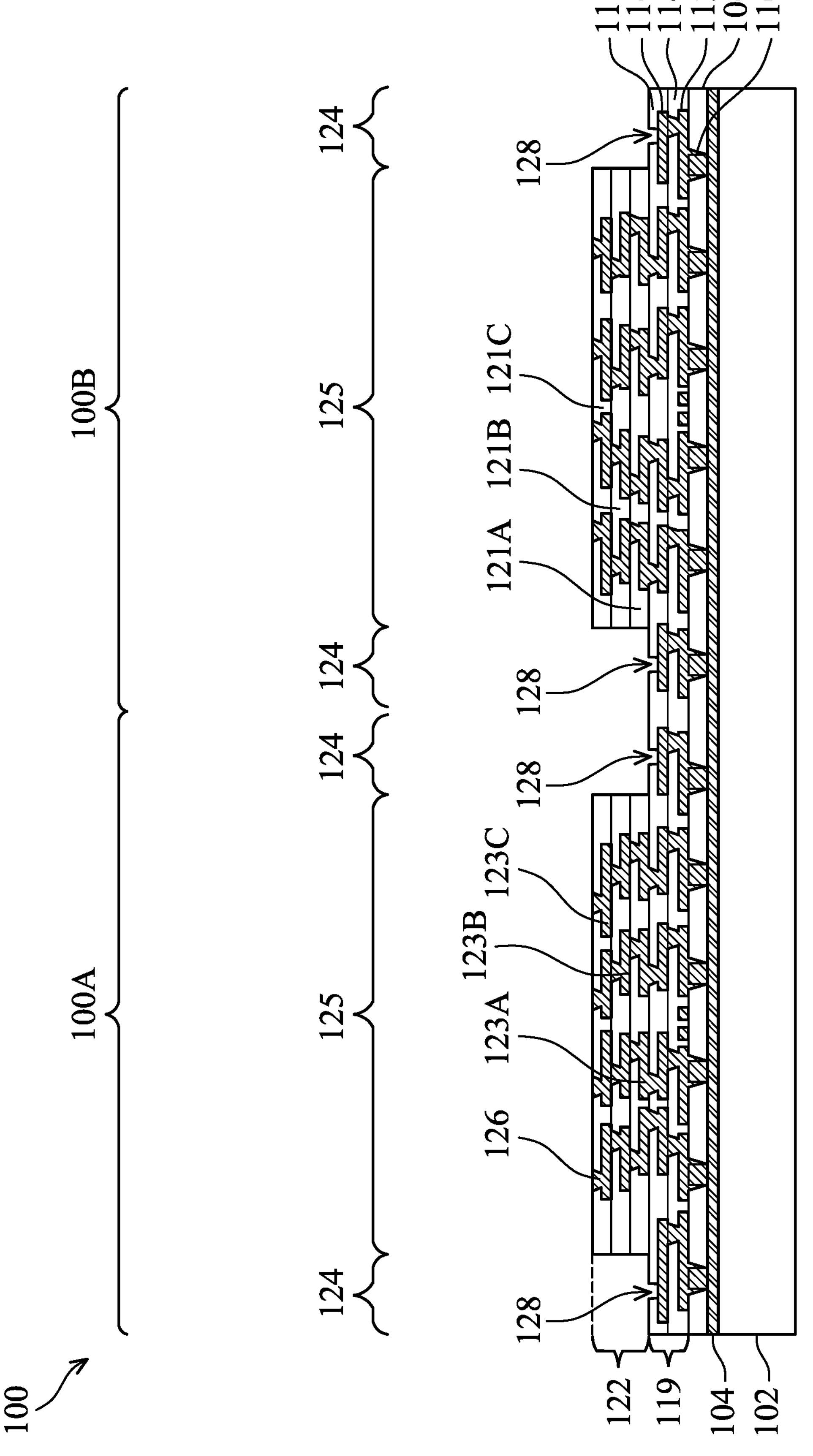

FIGS. 43 through 45 are views of intermediate stages in the manufacturing of interposers 100, in accordance with some embodiments. This process is similar to the process of FIGS. 2 through 23, except the periphery regions 124 are filled with dielectric material before a subsequent removal process is used to expose top surfaces of the dielectric layers 118 in the periphery regions 124.

In FIG. 43, middle redistribution layers 122 are formed over the lower redistribution layer(s) 119 in the first package region 100A and the second package region 100B. The middle redistribution layers 122 may be formed using similar materials and by similar methods as described above with respect to FIGS. 8A-8B, except that masks 120 (see above, FIG. 8A) are not present and the periphery regions 124 are filled with dielectric material from the dielectric layers 121A, 121B, and 121C. Next, conductive vias 126 are formed through the top dielectric layer 121C of the middle redistribution layers 122 to make physical and electrical contact with top conductive features (e.g., conductive lines of the top metallization pattern 123C) of the middle redistribution layers 122. The conductive vias 126 may be formed using similar materials and by similar methods as described above with respect to FIGS. 8A-8B.

In FIG. 44, a portion of the dielectric material in the periphery regions 124 is removed with a suitable process. As an example of removing the portion of the dielectric material in the periphery regions 124, a photoresist (not shown) is formed and patterned to cover the central regions 125 of the first package region 100A and the second package region 100B while exposing the top surface of the dielectric material in the periphery regions 124. The photoresist may be formed by spin coating or the like and may be exposed to light for patterning. Next, using the patterned photoresist as a mask, the dielectric material of the middle redistribution layers 122 in the periphery regions 124 is removed with a suitable etching process, such as a dry etch process, e.g. a reactive ion etch. The etching may be anisotropic. The dielectric material of any desired quantity of dielectric layers may be removed. In some embodiments, the dielectric material of the middle redistribution layers 122 is removed from the periphery regions 124 while the dielectric material of the lower redistribution layer(s) 119 remains in the periphery regions 124. The photoresist is then removed with an acceptable ashing or stripping process, such as using an oxygen plasma or the like.

In FIG. 45, openings 128 are formed through the dielectric layer 118 in the periphery regions 124 to expose the metallization pattern 116. The openings 128 may be formed by a similar method as the openings 108, as described above with respect to FIG. 3. However, any suitable method may be used to form the openings 128. The resulting structure is similar to the structure shown above in FIG. 9, except that the dielectric layers 121A, 121B, and 121C are flat at the boundaries of the central regions 125 in the embodiment of FIG. 45 while edges of the dielectric layers 121A, 121B, and 121C are up-turned at the boundaries of the central regions 125 in the embodiment of FIG. 9.

Figure 46:
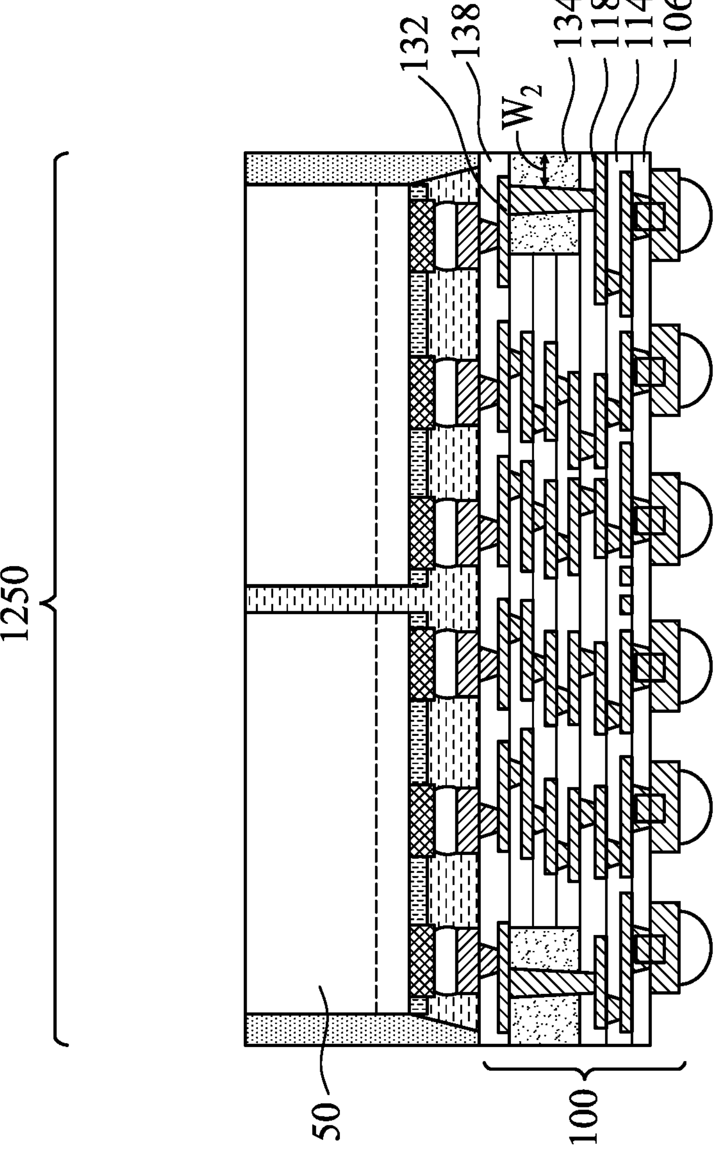
FIG. 46 is a cross-sectional view of another package component, in accordance with some embodiments.
Figure 46:

FIG. 46 illustrates a fourth package component 1250 including a singulated interposer 100, in accordance with some embodiments. The fourth package component 1250 may be formed from the structure of FIG. 45 using similar materials and by similar methods as described above with respect to FIGS. 10-23, and the details are not repeated herein.

Figure 47:
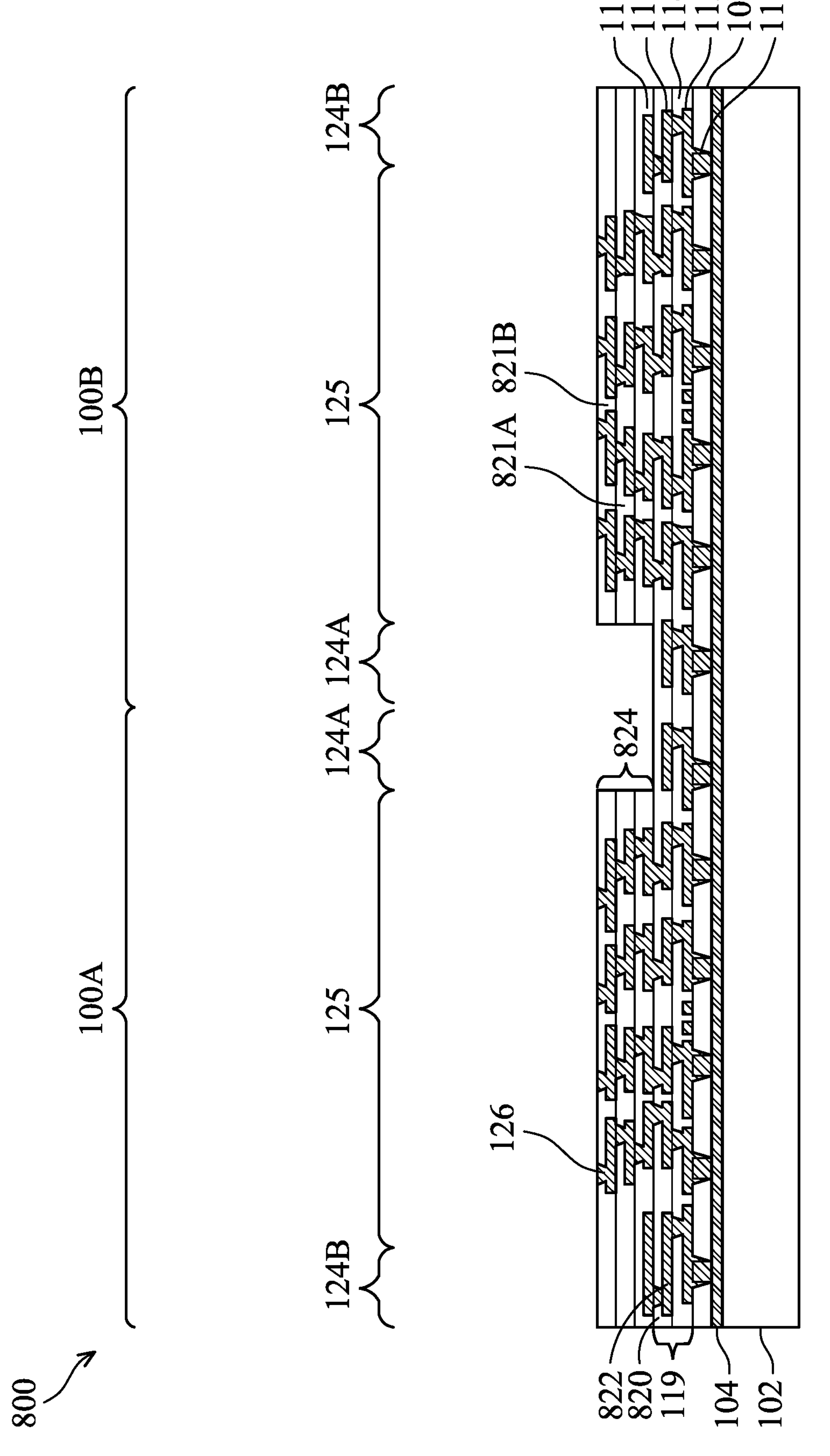
FIGS. 47-49 are cross-sectional views of intermediate stages in the manufacturing of package components, in accordance with some embodiments.
Figure 48:
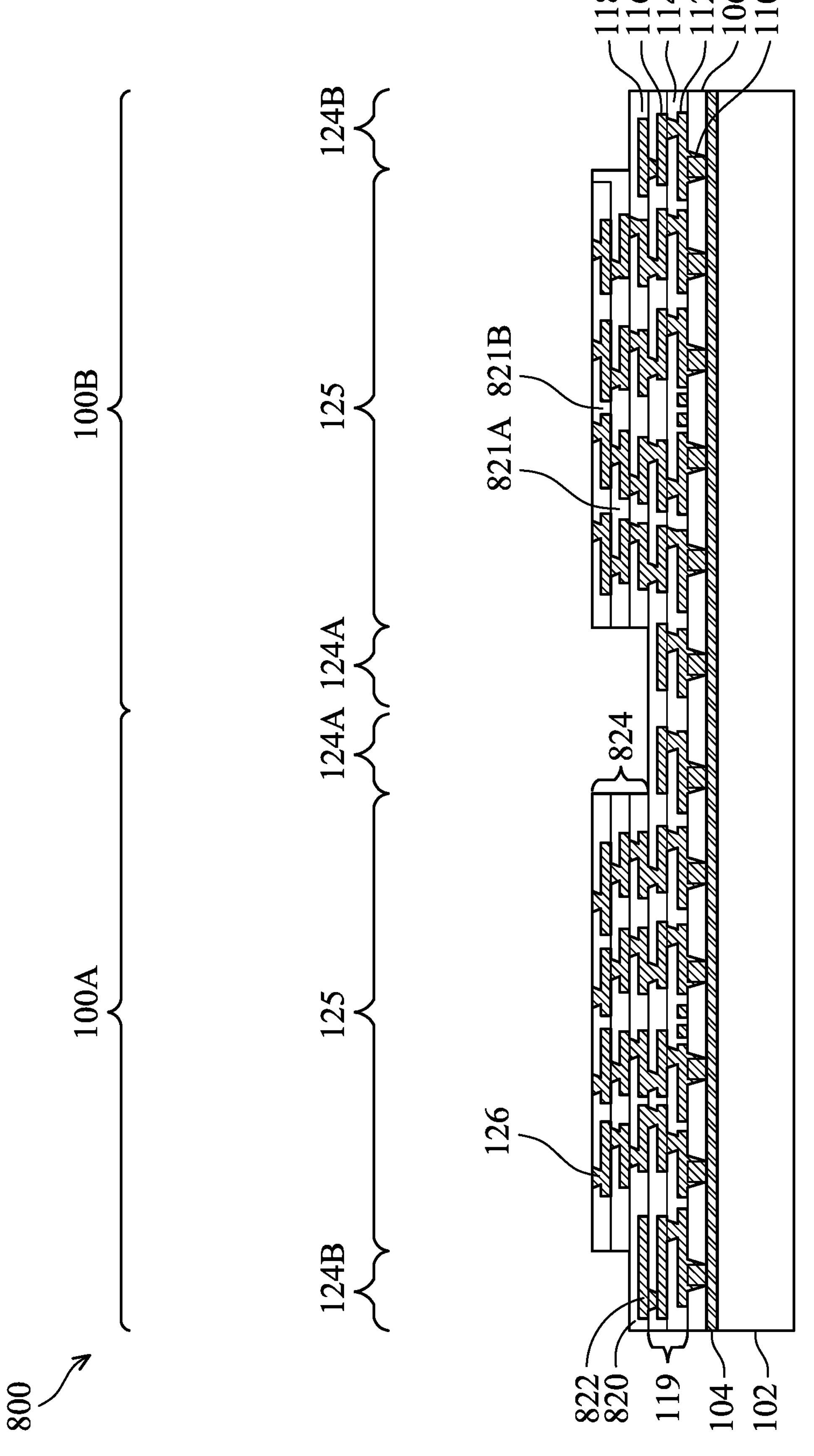
Figure 49:
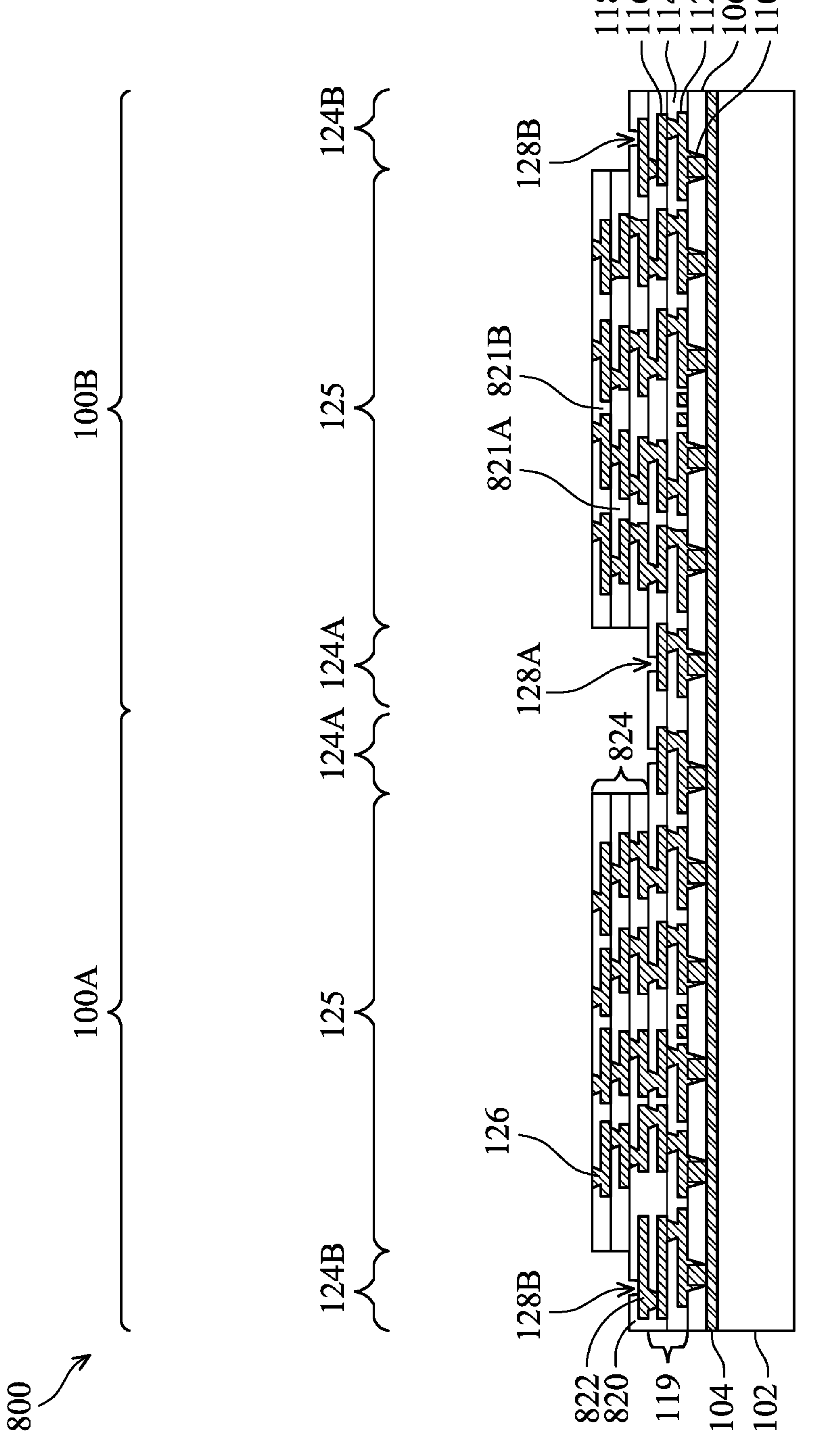

FIGS. 47 through 49 are views of intermediate stages in the manufacturing of interposers 800, in accordance with some embodiments. This process is similar to the process of FIGS. 34 through 40, except the periphery regions 124 are filled with dielectric material before a subsequent removal process is used to expose top surfaces of the dielectric layers 118 in the periphery regions 124.

In FIG. 47, dielectric material of the dielectric layers 820, 821A, and 821B in the periphery regions 124A is removed with a suitable process, exposing a top surface of the dielectric layer 118 in the periphery regions 124A. For example, the dielectric material may be removed by the methods described above with respect to FIG. 44.

In FIG. 48, dielectric material of the dielectric layers 821A and 821B in the periphery regions 124B is removed with a suitable process, exposing a top surface of the dielectric layer 820. The dielectric material may be removed by the methods described above with respect to FIG. 44. Although the step of FIG. 47 in which dielectric material of the dielectric layers 820, 821A, and 821B in the periphery regions 124A is removed is illustrated as preceding the step of FIG. 48 in which dielectric material of the dielectric layers 821A and 821B in the periphery regions 124B is removed, in some embodiments the dielectric material of the dielectric layers 821A and 821B in the periphery regions 124B is removed prior to removing the dielectric material of the dielectric layers 820, 821A, and 821B in the periphery regions 124A.

In FIG. 49, openings 128A are formed through the dielectric layer 118 in the periphery region 124A to expose the metallization pattern 116, and openings 128B are formed through the dielectric layer 820 in the periphery region 124B to expose the metallization pattern 822. The openings 128A and 128B may be formed by a similar method as the openings 108, as described above with respect to FIG. 3. However, any suitable method may be used to form the openings 128A and 128B. The resulting structure is similar to the structure as shown above in FIG. 37, except that the dielectric layers 820, 821A, and 821B are flat at the boundaries of the central regions 125 in the embodiment of FIG. 49 while edges of the dielectric layers 820, 821A, and 821B are up-turned at the boundaries of the central regions 125 in the embodiment of FIG. 37.

Figure 50:
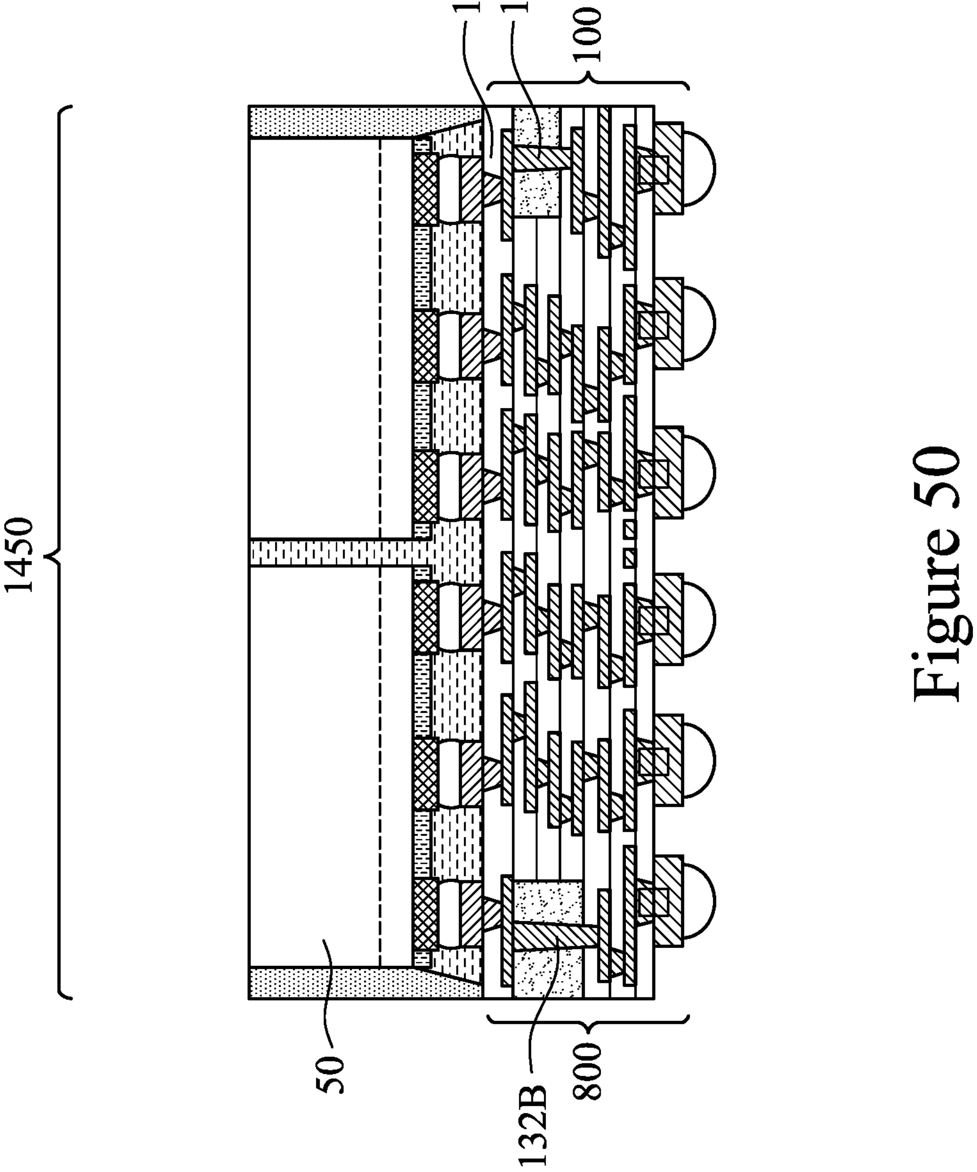
FIG. 50 is a cross-sectional view of another package component, in accordance with some embodiments.

FIG. 50 illustrates a fifth package component 1450 including a singulated interposer 800, in accordance with some embodiments. The fifth package component 1450 may be formed from the structure of FIG. 49 using similar materials and by similar methods as described above with respect to FIGS. 38-41, and the details are not repeated herein. The fifth package component 1450 comprises direct vias 132A and direct vias 132B having greater heights than the direct vias 132A.

Embodiments may provide advantages. Integrated circuit packages include direct vias through multiple redistribution layers of interposers and/or include spiral routing stacks (also referred to as spiral inductors) formed in routing structures of interconnect structures. The direct vias provide more direct electrical couplings between integrated circuit dies mounted on the interposers and interconnect structures on which the interposers are mounted. These direct electrical couplings through peripheries of the interposers can increase electrical performance by mitigating voltage drop and reducing resistance. The spiral routing stacks are formed in peripheral areas of routing structures above and below respective substrate cores of the interconnect structures. The spiral routing stacks enable inductor function to improve signal and power integrity.

In accordance with an embodiment, an integrated circuit package includes: an interposer including: a first redistribution layer; a second redistribution layer over the first redistribution layer in a central region of the interposer; a dielectric layer over the first redistribution layer in a periphery of the interposer, the dielectric layer surrounding the second redistribution layer in a top-down view; a third redistribution layer over the second redistribution layer and the dielectric layer; and a first direct via extending through the dielectric layer, wherein a conductive feature of the third redistribution layer is coupled to a conductive feature of the first redistribution layer through the first direct via; and an integrated circuit die over the third redistribution layer of the interposer, wherein the integrated circuit die is coupled to a conductive features of the first redistribution layer through the first direct via. In an embodiment, the integrated circuit package further includes a second direct via through the dielectric layer, wherein the second direct via has a greater height than the first direct via. In an embodiment, the integrated circuit package further includes a second direct via through the dielectric layer, wherein the first direct via and the second direct via are on opposite sides of the central region of the interposer. In an embodiment, the integrated circuit package further includes a package substrate attached to the interposer, wherein the package substrate includes a first spiral routing stack in a peripheral region of the package substrate.

In accordance with another embodiment, an integrated circuit package includes: a package substrate including: a substrate core, the substrate core having a first side and a second side opposite the first side; a first through via extending through the substrate core; a first routing structure on the first side of the substrate core, the first routing structure including a first spiral routing stack; and a second routing structure on the second side of the substrate core, the second routing structure including a second spiral routing stack, the second spiral routing stack being coupled to the first spiral routing stack through the first through via; and a first package component attached to the first routing structure of the package substrate. In an embodiment, the first package component includes a first interposer coupled to the first routing structure and a first integrated circuit die coupled to the first interposer. In an embodiment, the first interposer is an organic interposer. In an embodiment, the first interposer is a silicon interposer. In an embodiment, the first interposer includes: a first redistribution layer; a second redistribution layer over the first redistribution layer; a dielectric layer over the first redistribution layer, the dielectric layer extending around the second redistribution layer in a top-down view; a third redistribution layer over the second redistribution layer and the dielectric layer; and a direct via extending through the dielectric layer, wherein a conductive feature of the third redistribution layer is electrically coupled to a conductive feature of the first redistribution layer through the direct via. In an embodiment, the integrated circuit package further includes: a second package component attached to the first routing structure of the package substrate, wherein the first routing structure further includes a third spiral routing stack, the third spiral routing stack being disposed between the first package component and the second package component in a top-down view. In an embodiment, the integrated circuit package further includes a surface-mounted device on the first routing structure, the surface-mounted device being coupled to the first spiral routing stack.

In accordance with yet another embodiment, a method of manufacturing an integrated circuit package includes: forming a first interposer including: forming a first redistribution layer over a substrate; forming a second redistribution layer over the first redistribution layer; exposing a periphery of the first redistribution layer by removing a portion of a dielectric material of the second redistribution layer; forming a first direct via in the periphery of the first redistribution layer; filling the periphery with a first dielectric layer, wherein the first dielectric layer surrounds the first direct via in a top-down view; and forming a third redistribution layer over the second redistribution layer, the first direct via, and the first dielectric layer, a conductive feature of the third redistribution layer being physically and electrically coupled to a conductive feature of the first redistribution layer through the first direct via; and attaching a first integrated circuit die to the third redistribution layer of the first interposer. In an embodiment, the method further includes forming a second direct via on the second redistribution layer, wherein the first dielectric layer surrounds the second direct via in a top-down view after filling the periphery with the first dielectric layer. In an embodiment, the first direct via is formed with a plating process. In an embodiment, forming the first direct via includes: patterning a photoresist over the first redistribution layer; plating a conductive material in an opening through the patterned photoresist; and removing the photoresist. In an embodiment, the method further includes attaching the first interposer to a package substrate, the package substrate including a first routing structure over a first side of a substrate core, the first routing structure including a first spiral routing stack. In an embodiment, the method further includes attaching a surface-mounted device to the first routing structure, wherein attaching the surface-mounted device includes coupling the surface-mounted device to the first spiral routing stack. In an embodiment, the package substrate further includes a second routing structure over a second side of the substrate core, the second side being opposite the first side, wherein the second routing structure includes a second spiral routing stack overlying the first spiral routing stack. In an embodiment, the package substrate further includes a through via extending through the substrate core, wherein the through via couples the first spiral routing stack to the second spiral routing stack. In an embodiment, the method further includes: attaching a second integrated circuit die to a second interposer; and attaching the second interposer to the package substrate, wherein the first spiral routing stack is disposed between the first interposer and the second interposer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit package comprising:

an interposer comprising:

a first redistribution layer;

a second redistribution layer over the first redistribution layer in a central region of the interposer;

a dielectric layer over the first redistribution layer in a periphery of the interposer, the dielectric layer surrounding the second redistribution layer in a top-down view;

a third redistribution layer over the second redistribution layer and the dielectric layer; and a first direct via embedded in the dielectric layer, wherein the first direct via is spaced apart from the second redistribution layer by the dielectric layer, wherein the dielectric layer contacts and extends along sidewalls of the first direct via, wherein a conductive feature of the third redistribution layer is coupled to a conductive feature of the first redistribution layer through the first direct via; and an integrated circuit die over the third redistribution layer of the interposer, wherein the integrated circuit die is coupled to the conductive feature of the first redistribution layer through the first direct via.

2. The integrated circuit package of claim 1, further comprising a second direct via through the dielectric layer, wherein the second direct via has a greater height than the first direct via.

3. The integrated circuit package of claim 1, further comprising a second direct via through the dielectric layer, wherein the first direct via and the second direct via are on opposite sides of the central region of the interposer.

4. The integrated circuit package of claim 1, further comprising a package substrate attached to the interposer, wherein the package substrate comprises a substrate core and a first routing structure at a first side of the substrate core, wherein the first routing structure comprises first dielectric layers and first conductive features embedded in the first dielectric layers, wherein the first routing structure comprises a first spiral routing stack in a peripheral region of the package substrate, wherein the first spiral routing stack comprises:

a first conductive trace embedded in a first dielectric layer of the first dielectric layers, wherein the first conductive trace has a first semicircular shape or a first semi-polygonal shape in the top-down view;

a second conductive trace embedded in a second dielectric layer of the first dielectric layers, wherein the second dielectric layer is over the first dielectric layer, wherein the second conductive trace has a second semicircular shape or a second semi-polygonal shape in the top-down view; and a via embedded in the second dielectric layer and connecting the first conductive trace to the second conductive trace, wherein in the top-down view, the first conductive trace and the second conductive trace form a circular shape or a polygonal shape.

5. An integrated circuit package comprising:

a package substrate comprising:

a substrate core, the substrate core having a first side and a second side opposite the first side;

a first through via extending through the substrate core;

a first routing structure on the first side of the substrate core, wherein the first routing structure comprises first dielectric layers and first conductive features embedded in the first dielectric layers, wherein the first routing structure comprising comprises a first spiral routing stack, wherein the first spiral routing stack comprises:

a first conductive trace embedded in a first dielectric layer of the first dielectric layers, wherein the first conductive trace has a first semicircular shape or a first semi-polygonal shape in a top view;

a second conductive trace embedded in a second dielectric layer of the first dielectric layers, wherein the second dielectric layer is over the first dielectric layer, wherein the second conductive trace has a second semicircular shape or a second semi-polygonal shape in the top view; and a via embedded in the second dielectric layer and connecting the first conductive trace to the second conductive trace, wherein in the top view, the first conductive trace and the second conductive trace form a circular shape or a polygonal shape; and a second routing structure on the second side of the substrate core, the second routing structure comprising a second spiral routing stack, the second spiral routing stack being coupled to the first spiral routing stack through the first through via; and a first package component attached to the first routing structure of the package substrate.

6. The integrated circuit package of claim 5, wherein the first package component comprises a first interposer coupled to the first routing structure and a first integrated circuit die coupled to the first interposer.

7. The integrated circuit package of claim 6, wherein the first interposer is an organic interposer.

8. The integrated circuit package of claim 6, wherein the first interposer is a silicon interposer.

9. The integrated circuit package of claim 6, wherein the first interposer comprises:

a first redistribution layer;

a second redistribution layer over the first redistribution layer;

a dielectric layer over the first redistribution layer, the dielectric layer extending around the second redistribution layer in the top view;

a third redistribution layer over the second redistribution layer and the dielectric layer; and a direct via extending through the dielectric layer, wherein the direct via is embedded in the dielectric layer and is separated from the second redistribution layer by the dielectric layer, wherein a conductive feature of the third redistribution layer is electrically coupled to a conductive feature of the first redistribution layer through the direct via.

10. The integrated circuit package of claim 6, further comprising:

a second package component attached to the first routing structure of the package substrate, wherein the first routing structure further comprises a third spiral routing stack, the third spiral routing stack being disposed between the first package component and the second package component in the top view.

11. The integrated circuit package of claim 6, further comprising a surface-mounted device on the first routing structure, the surface-mounted device being coupled to the first spiral routing stack.

12. An integrated circuit package comprising:

an interposer comprising:

a first redistribution structure;

a second redistribution structure over the first redistribution structure;

a first dielectric layer surrounding the second redistribution structure in a top-down view;

a third redistribution structure over the second redistribution structure and the first dielectric layer; and a first conductive via extending through the first dielectric layer, wherein the first conductive via is separated from the second redistribution structure by the first dielectric layer, wherein the first conductive via electrically couples the third redistribution structure and the first redistribution structure; and a package substrate underneath the interposer, the package substrate comprising:

a substrate core;

a first routing structure on a first side of the substrate core, wherein the first routing structure is electrically coupled to the interposer; and a second routing structure on a second side of the substrate core.

13. The integrated circuit package of claim 12, wherein the first dielectric layer is a single layer of a homogeneous composition.

14. The integrated circuit package of claim 12, wherein the first conductive via is in contact with the first redistribution structure and the third redistribution structure.

15. The integrated circuit package of claim 12, wherein a top surface of the first conductive via is coplanar with a top surface of the first dielectric layer.

16. The integrated circuit package of claim 12, further comprising an integrated circuit die over the interposer, wherein the integrated circuit die is electrically coupled to the third redistribution structure, and wherein the integrated circuit die overlaps the first conductive via.

17. The integrated circuit package of claim 12, wherein the package substrate further comprises a second conductive via extending through the substrate core, wherein the second conductive via electrically couples the first routing structure and the second routing structure.

18. The integrated circuit package of claim 17, wherein the first routing structure comprises a first spiral routing stack, wherein the first spiral routing stack comprises a first conductive trace having a first semicircular shape or a first semi-polygonal shape, wherein the first spiral routing stack has a first inductance, and wherein the first spiral routing stack is electrically coupled to the second conductive via.

19. The integrated circuit package of claim 18, wherein the second routing structure comprises a second spiral routing stack, wherein the second spiral routing stack comprises a second conductive trace having a second semicircular shape or a second semi-polygonal shape, wherein the second spiral routing stack has a second inductance, and wherein the second spiral routing stack is electrically coupled in series to the first spiral routing stack through the second conductive via.

20. The integrated circuit package of claim 18, wherein the first spiral routing stack comprises:

the first conductive trace embedded in a first dielectric layer of the first routing structure, wherein the first conductive trace has the first semicircular shape or the first semi-polygonal shape in the top-down view;

a second conductive trace embedded in a second dielectric layer of the first routing structure, wherein the second dielectric layer of the first routing structure is over the first dielectric layer of the first routing structure, wherein the second conductive trace has a second semicircular shape or a second semi-polygonal shape in the top-down view; and a third conductive via embedded in the second dielectric layer of the first routing structure and connecting the first conductive trace to the second conductive trace, wherein in the top-down view, the first conductive trace and the second conductive trace form a circular shape or a polygonal shape.

* * * * *